United States Patent
Kozuma et al.

(10) Patent No.: US 10,504,919 B2
(45) Date of Patent: Dec. 10, 2019

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Munehiro Kozuma, Kanagawa (JP); Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 343 days.

(21) Appl. No.: 15/333,401

(22) Filed: Oct. 25, 2016

(65) Prior Publication Data
US 2017/0125440 A1    May 4, 2017

(30) Foreign Application Priority Data
Oct. 30, 2015   (JP) ................................. 2015-214977

(51) Int. Cl.
*H01L 27/12*       (2006.01)
*H01L 27/118*      (2006.01)
(Continued)

(52) U.S. Cl.
CPC ........ *H01L 27/11807* (2013.01); *H01L 22/14* (2013.01); *H01L 27/124* (2013.01);
(Continued)

(58) Field of Classification Search
CPC .............. H01L 29/7869; H01L 27/124; H01L 27/11807; H01L 27/1225; H01L 27/1255
See application file for complete search history.

(56) References Cited

U.S. PATENT DOCUMENTS

| | | |
|---|---|---|
| 8,542,034 B2 | 9/2013 | Kato |
| 8,547,753 B2 | 10/2013 | Takemura et al. |
| 8,581,625 B2 | 11/2013 | Yoneda et al. |
| 8,760,931 B2 | 6/2014 | Takemura et al. |
| 8,779,799 B2 | 7/2014 | Takewaki |
| 8,896,345 B2 | 11/2014 | Fukutome |

(Continued)

OTHER PUBLICATIONS

Waidyasooriya.H et al., "Implementation of a Partially Reconfigurable Multi-Context FPGA Based on Asynchronous Architecture", IEICE Trans. Electron. (IEICE Transactions on Electronics), Apr. 1, 2009, vol. E92-C, No. 4, pp. 539-549.

*Primary Examiner* — Sue A Purvis
*Assistant Examiner* — Scott Stowe
(74) *Attorney, Agent, or Firm* — Fish & Richardson P.C.

(57) ABSTRACT

To achieve high processing capability, a semiconductor device includes first and second circuits, first to third wirings, and first to fourth transistors. The first circuit is electrically connected to the first wiring and a gate of the first transistor. One of a source and a drain of the first transistor is electrically connected to the second wiring. The other of the source and the drain of the first transistor is electrically connected to a gate of the second transistor. The second circuit is electrically connected to the first wiring and a gate of the third transistor. One of a source and a drain of the third transistor is electrically connected to the third wiring. The other of the source and the drain of the third transistor is electrically connected to a gate of the fourth transistor. One of a source and a drain of the fourth transistor is electrically connected to one of a source and a drain of the second transistor. The other of the source and the drain of the fourth transistor is electrically connected to the other of the source and the drain of the second transistor.

8 Claims, 42 Drawing Sheets

(51) Int. Cl.
- *H01L 29/786* (2006.01)
- *H01L 29/24* (2006.01)
- *H01L 21/66* (2006.01)
- *H01L 49/02* (2006.01)
- *H01L 23/544* (2006.01)
- *H01L 23/00* (2006.01)
- *H01L 23/31* (2006.01)

(52) U.S. Cl.
CPC ...... *H01L 27/1225* (2013.01); *H01L 27/1255* (2013.01); *H01L 28/00* (2013.01); *H01L 29/24* (2013.01); *H01L 29/7869* (2013.01); *H01L 29/78606* (2013.01); H01L 23/3107 (2013.01); H01L 23/544 (2013.01); H01L 24/29 (2013.01); H01L 24/32 (2013.01); H01L 24/45 (2013.01); H01L 24/48 (2013.01); H01L 24/73 (2013.01); H01L 24/92 (2013.01); H01L 2027/1189 (2013.01); H01L 2027/11838 (2013.01); H01L 2027/11875 (2013.01); H01L 2027/11879 (2013.01); H01L 2223/54486 (2013.01); H01L 2224/2919 (2013.01); H01L 2224/32245 (2013.01); H01L 2224/45139 (2013.01); H01L 2224/45144 (2013.01); H01L 2224/4847 (2013.01); H01L 2224/48247 (2013.01); H01L 2224/48463 (2013.01); H01L 2224/73265 (2013.01); H01L 2224/92247 (2013.01); H01L 2924/00014 (2013.01); H01L 2924/3511 (2013.01)

(56) References Cited

U.S. PATENT DOCUMENTS

| | | | |
|---|---|---|---|
| 8,975,918 | B2 | 3/2015 | Takemura |
| 9,117,501 | B2 | 8/2015 | Takemura |
| 9,230,683 | B2 | 1/2016 | Takemura |
| 9,344,090 | B2 | 5/2016 | Nishijima et al. |
| 9,379,113 | B2 | 6/2016 | Kurokawa |
| 9,379,706 | B2 | 6/2016 | Kurokawa |
| 9,397,664 | B2 | 7/2016 | Takewaki |
| 2012/0293200 | A1 | 11/2012 | Takemura |
| 2012/0293201 | A1 | 11/2012 | Fujita et al. |
| 2013/0285697 | A1 | 10/2013 | Kurokawa |
| 2013/0293263 | A1 | 11/2013 | Kurokawa |
| 2013/0314124 | A1 | 11/2013 | Ikeda et al. |
| 2014/0015566 | A1 | 1/2014 | Yoneda et al. |
| 2014/0159771 | A1 | 6/2014 | Ikeda et al. |
| 2014/0252346 | A1 | 9/2014 | Takemura et al. |
| 2014/0368235 | A1 | 12/2014 | Aoki et al. |
| 2015/0008958 | A1 | 1/2015 | Kurokawa |
| 2016/0132386 | A1 | 5/2016 | Takemura |
| 2016/0268265 | A1 | 9/2016 | Kurokawa |
| 2016/0322975 | A1 | 11/2016 | Ikeda et al. |

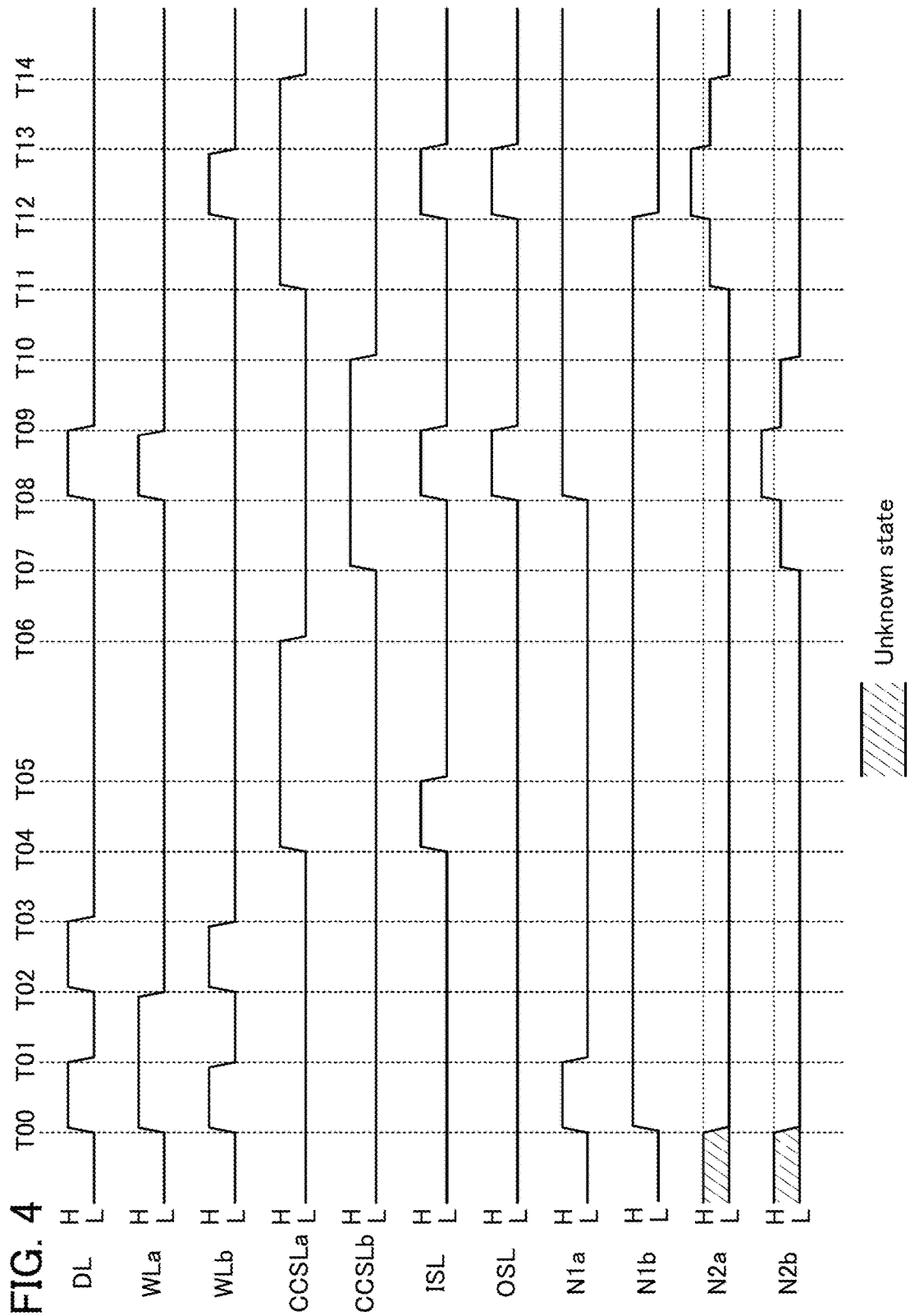

DL:VDD  CCSLa:VSS  CCSLb:VSS  ISL:VSS  OSL:VSS
N1a:VDD  N1b:VDD  N2a:VSS  N2b:VSS

DL:VSS  CCSLa:VSS  CCSLb:VSS  ISL:VSS  OSL:VSS
N1a:VSS  N1b:VDD  N2a:VSS  N2b:VSS

DL:VDD  CCSLa:VSS  CCSLb:VSS  ISL:VSS  OSL:VSS
N1a:VSS  N1b:VDD  N2a:VSS  N2b:VSS

DL:VSS  CCSLa:VSS  CCSLb:VSS  ISL:VSS  OSL:VSS
N1a:VSS  N1b:VDD  N2a:VSS  N2b:VSS

DL:VSS  CCSLa:VDD  CCSLb:VSS  ISL:VDD  OSL:VSS
N1a:VSS  N1b:VDD  N2a:VSS  N2b:VSS

DL:VSS  CCSLa:VDD  CCSLb:VSS  ISL:VSS  OSL:VSS
N1a:VSS  N1b:VDD  N2a:VSS  N2b:VSS

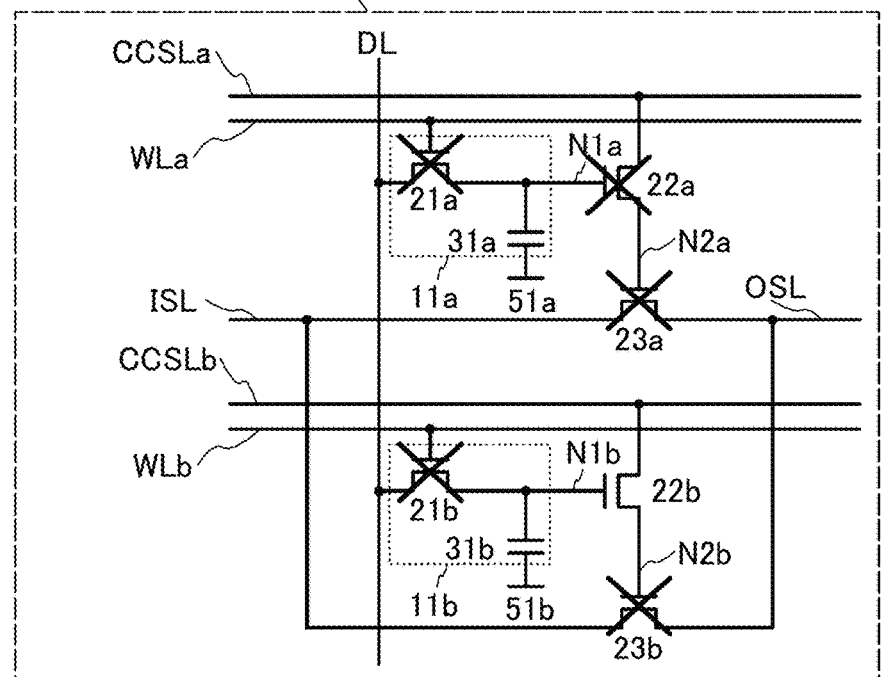
DL:VSS  CCSLa:VSS  CCSLb:VSS  ISL:VSS  OSL:VSS
N1a:VSS  N1b:VDD  N2a:VSS  N2b:VSS
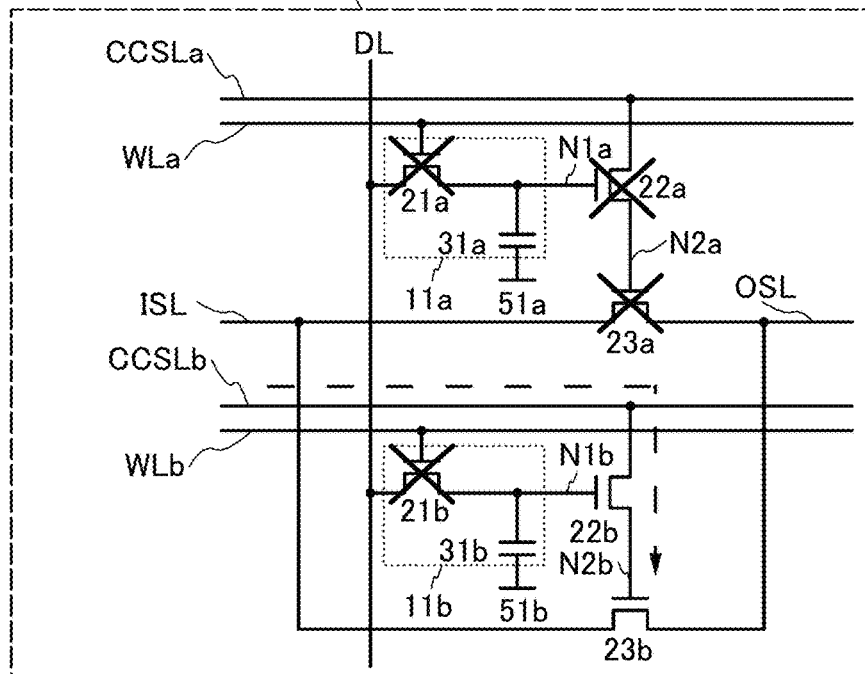
DL:VSS  CCSLa:VSS  CCSLb:VDD  ISL:VSS  OSL:VSS
N1a:VSS  N1b:VDD  N2a:VSS  N2b:VDD-$Vth_b$ DL:VDD  CCSLa:VSS  CCSLb:VDD  ISL:VDD  OSL:VDD
N1a:VDD  N1b:VDD  N2a:VSS  N2b:>VDD DL:VSS  CCSLa:VSS  CCSLb:VDD  ISL:VSS  OSL:VSS
N1a:VDD  N1b:VDD  N2a:VSS  N2b:VDD-$Vth_b$ DL:VSS  CCSLa:VSS  CCSLb:VSS  ISL:VSS  OSL:VSS
N1a:VDD  N1b:VDD  N2a:VSS  N2b:VSS DL:VSS  CCSLa:VDD  CCSLb:VSS  ISL:VSS  OSL:VSS
N1a:VDD  N1b:VDD  N2a:VDD-$Vth_a$  N2b:VSS

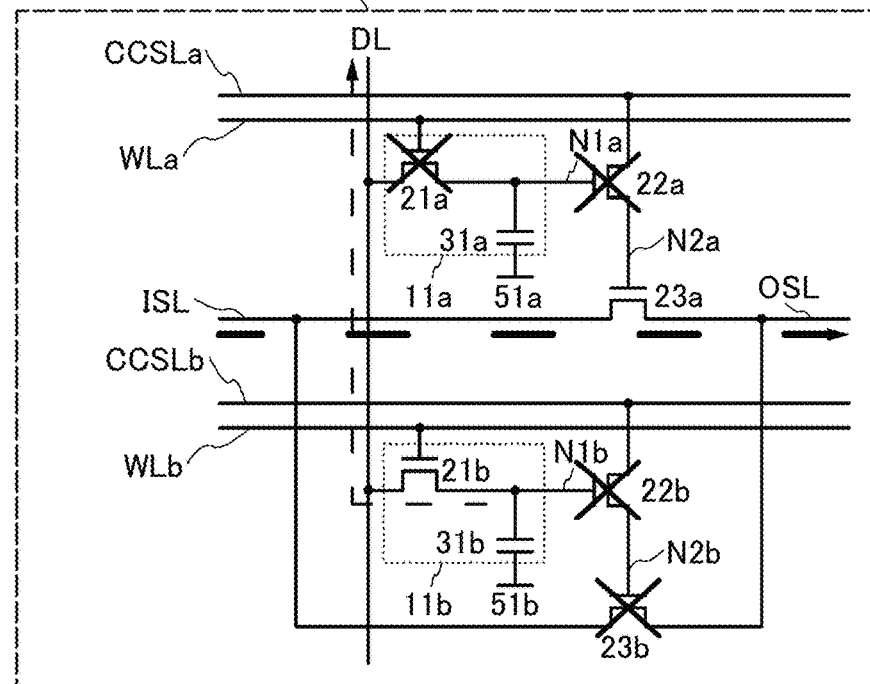
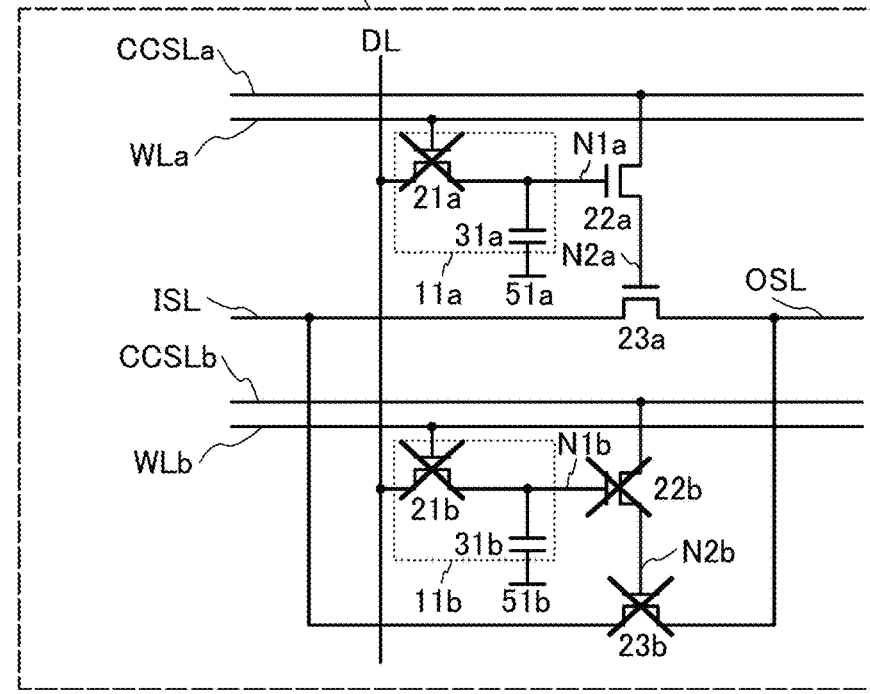

T14

DL:VSS   CCSLa:VSS   CCSLb:VSS   ISL:VSS   OSL:VSS
N1a:VDD   N1b:VSS   N2a:VSS   N2b:VSS

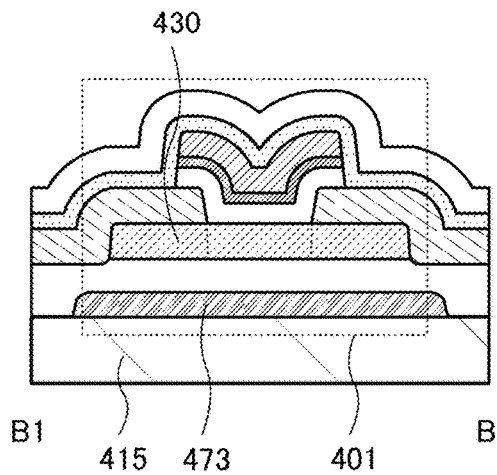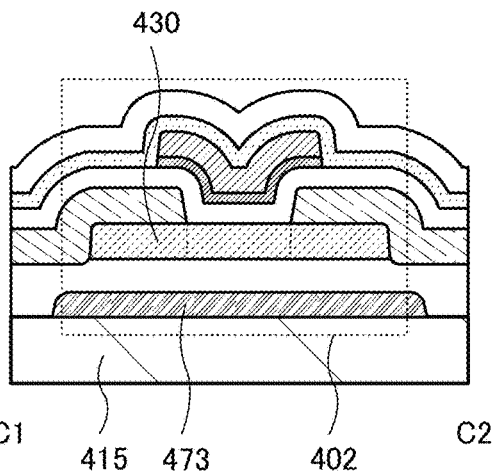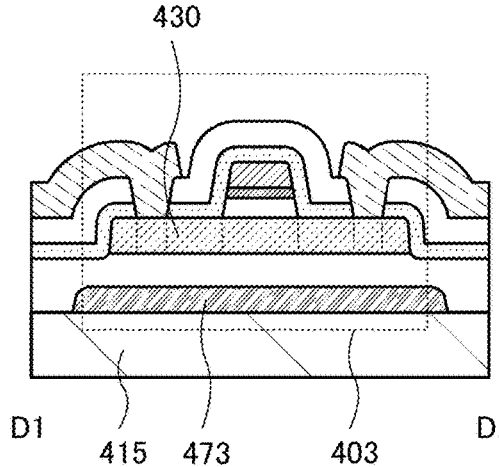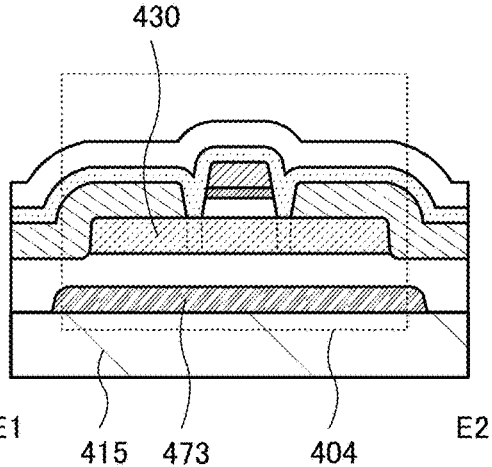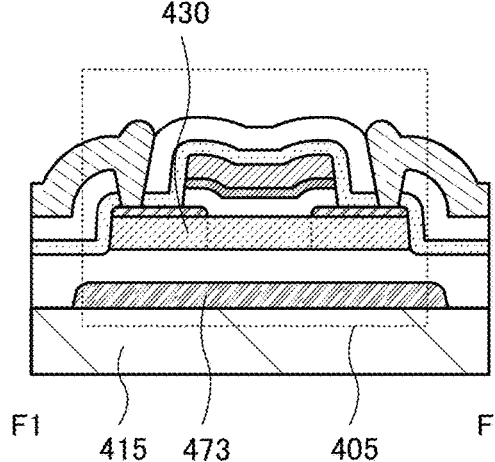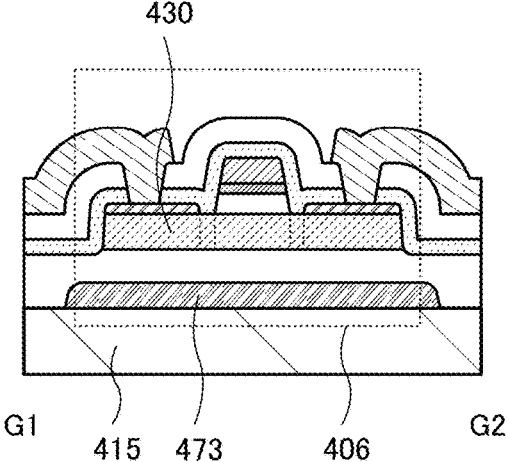

H1 407 415 430b 430a 473 H2
430c
430

I1 408 415 430b 430a 473 I2
430c
430

J1 409 415 430b 430a 473 J2
430c
430

K1 410 415 430b 430a 473 K2
430c
430

L1 411 415 430b 430a 473 L2
430c
430

M1 412 415 430b 430a 473 M2
430c
430

SEMICONDUCTOR DEVICE, ELECTRONIC COMPONENT, AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specific examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

2. Description of the Related Art

A programmable logic device (PLD) includes a plurality of programmable logic elements (PLEs) and a plurality of programmable switch elements (PSEs). In the PLD, data on a function of each PLE and data on a connection between PLEs by the PSEs are stored in a configuration memory as configuration data.

A multi-context reconfigurable device in which configuration data can be instantaneously updated is suggested (e.g., Non-Patent Document 1). Moreover, Patent Documents 1 to 5 each propose a field-programmable gate array (FPGA) that includes a transistor containing an oxide semiconductor in a channel formation region (hereinafter referred to as OS transistor) and functions as a multi-context reconfigurable circuit.

Patent Documents 1 to 5 each disclose that the use of a memory including an OS transistor as a configuration memory for storing configuration data enables configuration memories to be arranged at a high density, resulting in high degree of integration of the configuration memories.

REFERENCE

Patent Document

Patent Document 1: United States Patent Application Publication No. 2013/0293263
Patent Document 2: United States Patent Application Publication No. 2013/0314124
Patent Document 3: United States Patent Application Publication No. 2014/0159771
Patent Document 4: United States Patent Application Publication No. 2014/0368235
Patent Document 5: United States Patent Application Publication No. 2015/0008958

Non-Patent Document

Non-Patent Document 1: H. M. Waidyasooriya et al., "Implementation of a Partially Reconfigurable Multi-Context FPGA Based on Asynchronous Architecture," IEICE TRANSACTIONS on Electronics, Vol. E92-C, pp. 539-549, 2009.

SUMMARY OF THE INVENTION

An object of one embodiment of the present invention is to provide a semiconductor device with high processing capability. Another object is to provide a semiconductor device with high operational stability. Another object is to provide a small semiconductor device. Another object is to provide a highly integrated semiconductor device. Another object is to provide a semiconductor device including a transistor with low off-state current. Another object is to provide a semiconductor device that can be used at a wide temperature range. Another object is to provide a highly reliable semiconductor device.

Another object of one embodiment of the present invention is to provide a novel semiconductor device, a novel electronic device, and the like.

Note that the objects of one embodiment of the present invention are not limited to the above objects. The objects described above do not preclude the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects.

One embodiment of the present invention is a semiconductor device including first and second circuits, first to third wirings, and first to fourth transistors. The first circuit is electrically connected to the first wiring. The first circuit is electrically connected to a gate of the first transistor. One of a source and a drain of the first transistor is electrically connected to the second wiring. The other of the source and the drain of the first transistor is electrically connected to a gate of the second transistor. The second circuit is electrically connected to the first wiring. The second circuit is electrically connected to a gate of the third transistor. One of a source and a drain of the third transistor is electrically connected to the third wiring. The other of the source and the drain of the third transistor is electrically connected to a gate of the fourth transistor. One of a source and a drain of the fourth transistor is electrically connected to one of a source and a drain of the second transistor. The other of the source and the drain of the fourth transistor is electrically connected to the other of the source and the drain of the second transistor.

The first wiring may have a function of supplying first configuration data to the first circuit and supplying second configuration data to the second circuit. The second wiring may have a function of supplying a first context data signal to the gate of the second transistor. The third wiring may have a function of supplying a second context data signal to the gate of the fourth transistor. The first circuit may have a function of retaining the first configuration data. The second circuit may have a function of retaining the second configuration data.

Each of the first and third transistors may include an active layer containing an oxide semiconductor.

The first circuit may include a fifth transistor and a first capacitor. The second circuit may include a sixth transistor and a second capacitor. Each of the fifth and sixth transistors may include an active layer containing an oxide semiconductor. One of a source and a drain of the fifth transistor may be electrically connected to the first wiring. The other of the source and the drain of the fifth transistor may be electrically connected to the gate of the first transistor. The gate of the first transistor may be electrically connected to one terminal of the first capacitor. One of a source and a drain of the sixth transistor may be electrically connected to the first wiring. The other of the source and the drain of the sixth transistor may be electrically connected to the gate of the third transistor. The gate of the third transistor may be electrically connected to one terminal of the second capacitor.

The semiconductor device may further include a seventh transistor and an eighth transistor. One of a source and a drain of the seventh transistor may be electrically connected to the gate of the second transistor. One of a source and a drain of the eighth transistor may be electrically connected to the gate of the fourth transistor.

Each of the seventh and eighth transistors may include an active layer containing an oxide semiconductor.

The oxide semiconductor may contain In, Zn, and M (M is at least one of Al, Ti, Ga, Sn, Y, Zr, La, Ce, Nd, and Hf).

Another embodiment of the present invention is an electronic component including the semiconductor device of one embodiment of the present invention and a lead electrically connected to the semiconductor device.

Another embodiment of the present invention is an electronic device including the semiconductor device of one embodiment of the present invention; the electronic component of one embodiment of the present invention; and at least one of a display device, a touch panel, a microphone, a speaker, an operation key, and a housing.

One embodiment can provide a semiconductor device with high processing capability, a semiconductor device with high operational stability, a small semiconductor device, a highly integrated semiconductor device, a semiconductor device including a transistor with low off-state current, a semiconductor device that can be used at a wide temperature range, or a highly reliable semiconductor device.

One embodiment of the present invention can provide a novel semiconductor device, a novel electronic device, and the like.

Note that the effects of one embodiment of the present invention are not limited to the above effects. The effects described above do not preclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Therefore, one embodiment of the present invention does not have the effects described above in some cases.

BRIEF DESCRIPTION OF THE DRAWINGS

In the accompanying drawings:
FIG. 4 is a timing chart showing an operation example of a semiconductor device;
FIGS. 8A and 8B are circuit diagrams illustrating an operation example of a semiconductor device;
FIGS. 11A and 11B are circuit diagrams illustrating an operation example of a semiconductor device;
FIGS. 29A to 29F each illustrate a cross section of a transistor in the channel length direction.

DETAILED DESCRIPTION OF THE INVENTION

Figure 1:
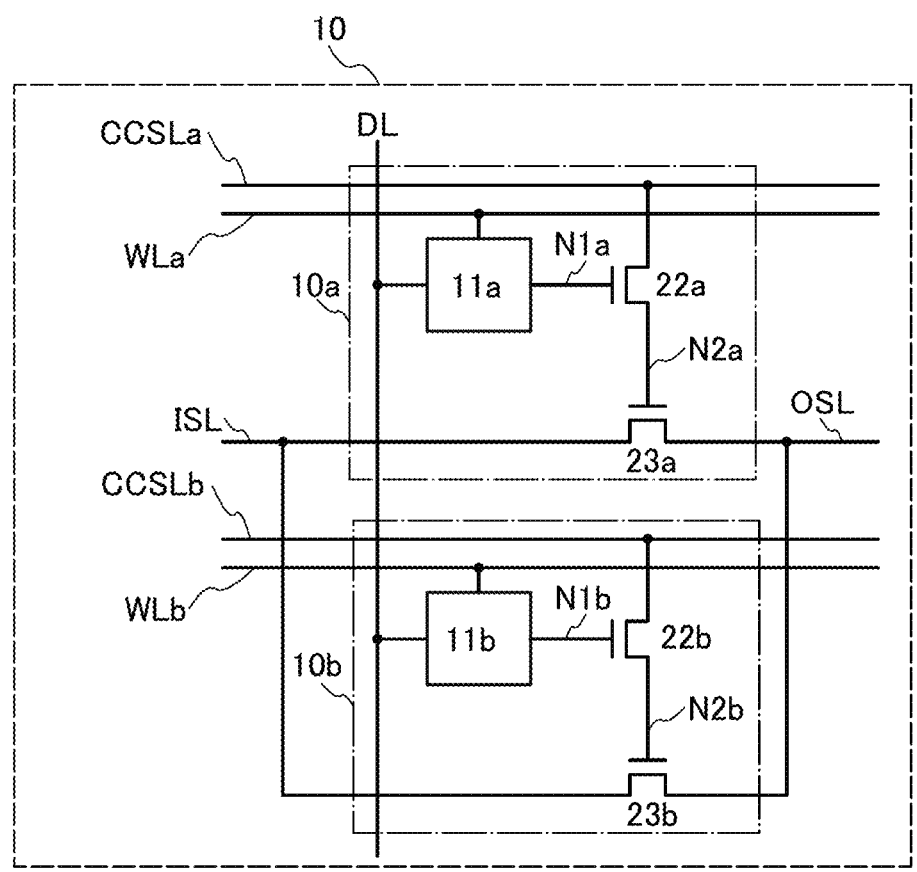
FIG. 1 is a circuit diagram illustrating a structure example of a semiconductor device.

Embodiments will be described in detail with reference to the drawings. Note that the present invention is not limited to the following description, and it will be readily appreciated by those skilled in the art that modes and details can be modified in various ways without departing from the spirit and scope of the present invention. Therefore, the present invention should not be interpreted as being limited to the description of the embodiments below. Note that in structures of the present invention described below, the same portions or portions having similar functions are denoted by the same reference numerals in different drawings, and description thereof is not repeated in some cases. In some cases, the same components are denoted by different hatching patterns in different drawings, or the hatching patterns are omitted.

Note that ordinal numbers such as first and second are used for convenience and do not denote the order of steps or the stacking order of layers. Therefore, for example, the term "first" can be replaced with the term "second," "third," or the like as appropriate. In addition, ordinal numbers used in this specification and the like do not correspond to ordinal numbers that specify one embodiment of the present invention in some cases.

In the drawings, the size, the layer thickness, or the region is exaggerated for clarity in some cases. Therefore, the scale is not necessarily limited to that illustrated in the drawings. Note that the drawings are schematic views showing ideal examples, and embodiments of the present invention are not limited to shapes, values, or the like shown in the drawings. For example, variation in signal, voltage, or current due to noise or difference in timing can be included.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source.

Here, since the source and the drain are interchangeable depending on a structure, operating conditions, or the like of the transistor, it is difficult to define which is a source or a drain. Thus, the terms "source" and "drain" can be interchanged with each other depending on the situation or circumstances.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is regarded as being included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without an element that allows electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that a switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generator circuit; a memory circuit; and/or a control circuit) can be connected between X and Y. For instance, even if another circuit is provided between X and Y, X and Y are functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., X and Y are connected with another element or circuit provided therebetween), X and Y are functionally connected (i.e., X and Y are functionally connected with another element or circuit provided therebetween), and X and Y are directly connected (i.e., X and Y are connected without another element or circuit provided therebetween). That is, in this specification and the like, the term "electrically connected" is substantially the same as the term "connected."

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path," and "a source (or a first terminal or the like) of a transistor is electrically connected to X through Z1 at least with a first connection path, the first connection path does not include a second connection path, the second connection path includes a connection path through the transistor, a drain (or a second terminal or the like) of the transistor is electrically connected to Y through Z2 at least with a third connection path, and the third connection path does not include the second connection path." Still another example of the expression is "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that the above expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring functions as an electrode, one conductive film functions as the wiring and the electrode. Thus, "electrical connection" in this specification includes, in its category, such a case where one conductive film has functions of a plurality of components.

Note that the terms "film" and "layer" can be interchanged with each other depending on the situation or circumstances. For example, in some cases, the term "conductive film" can be used instead of the term "conductive layer," or the term "insulating film" can be used instead of the term "insulating layer."

Note that in general, a potential (voltage) is a relative value and its level depends on the difference from a reference potential. Therefore, a ground potential, GND, or the like is not necessarily 0 V. For example, a ground potential or GND may be defined using the lowest potential or a substantially intermediate potential in a circuit as a reference. In those cases, a positive potential and a negative potential are set using the potential as a reference.

Note that in this specification, terms for describing arrangement, such as "over" and "under," are used for convenience to describe the positional relation between components with reference to drawings. Furthermore, the positional relation between components is changed as appropriate in accordance with a direction in which each component is described. Thus, the positional relation is not limited by a term used in the specification and can be described with another term as appropriate depending on the circumstances.

Embodiment 1

In this embodiment, a semiconductor device of one embodiment of the present invention will be described.

One embodiment of the present invention relates to a PSE capable of executing dynamic reconfiguration. In a PSE included in the semiconductor device of one embodiment of the present invention, an input signal line and an output signal line are connected through one transistor. Thus, the operation speed of the PSE included in the semiconductor device of one embodiment of the present invention can be increased compared to the case where an input signal line and an output signal line are connected through two or more transistors. Moreover, in the PSE included in the semiconductor device of one embodiment of the present invention, a potential of configuration data retained in a configuration memory does not depend on potentials of the input signal line and the output signal line. That is, even if the potentials of the input signal line and the output signal line are changed during dynamic reconfiguration, a variation in the potential of configuration data due to an interaction such as capacitive coupling does not occur. As a result, the operation stability of the PSE included in the semiconductor device of one embodiment of the present invention can be enhanced.

<Structure Example of PSE>

FIG. 1 is a circuit diagram illustrating a structure example of a circuit 10 included in the semiconductor device of one embodiment of the present invention. The circuit 10 has a function of a PSE. The circuit 10 includes a circuit 10a and a circuit 10b. The circuit 10 also includes a wiring DL, a wiring WLa, a wiring WLb, a wiring CCSLa, a wiring CCSLb, a wiring ISL, and a wiring OSL.

The circuit 10a includes a circuit 11a, a transistor 22a, and a transistor 23a. The circuit 10b includes a circuit 11b, a transistor 22b, and a transistor 23b.

Although an example where all the transistors 22a, 22b, 23a, and 23b are n-channel transistors is shown here, one embodiment of the present invention is not limited to this, and some or all of these transistors may be p-channel transistors.

In this specification, an n-channel transistor is referred to as an n-ch transistor and a p-channel transistor is referred to as a p-ch transistor in some cases.

The circuit 11a is electrically connected to the wiring DL, the wiring WLa, and a gate of the transistor 22a. The circuit 11b is electrically connected to the wiring DL, the wiring WLb, and a gate of the transistor 22b. One of a source and a drain of the transistor 22a is electrically connected to the wiring CCSLa. One of a source and a drain of the transistor 22b is electrically connected to the wiring CCSLb. The other of the source and the drain of the transistor 22a is electrically connected to a gate of the transistor 23a. The other of the source and the drain of the transistor 22b is electrically connected to a gate of the transistor 23b. One of a source and a drain of the transistor 23a and one of a source and a drain of the transistor 23b are electrically connected to the wiring ISL. The other of the source and the drain of the transistor 23a and the other of the source and the drain of the transistor 23b are electrically connected to the wiring OSL.

In the structure illustrated in FIG. 1, a node where the circuit 11a and the gate of the transistor 22a are connected is referred to as a node N1a. A node where the circuit 11b and the gate of the transistor 22b are connected is referred to as a node N1b. A node where the other of the source and the drain of the transistor 22a and the gate of the transistor 23a are connected is referred to as a node N2a. A node where the other of the source and the drain of the transistor 22b and the gate of the transistor 23b are connected is referred to as a node N2b.

The circuit 11a and the circuit 11b have a function of a configuration memory that retains configuration data. Note that the potential of the node N1a is changed in accordance with a potential of configuration data retained in the circuit 11a, and the potential of the node N1b is changed in accordance with a potential of configuration data retained in the circuit 11b.

The transistor 22a has a function of controlling writing of a context data signal to the node N2a in accordance with the potential of configuration data retained in the circuit 11a. The transistor 22b has a function of controlling writing of a context data signal to the node N2b in accordance with the potential of configuration data retained in the circuit 11b. The transistor 23a has a function of a pass transistor that controls electrical continuity between the wiring ISL and the wiring OSL in accordance with the potential of the node N2a. The transistor 23b has a function of a pass transistor that controls electrical continuity between the wiring ISL and the wiring OSL in accordance with the potential of the node N2b.

The wiring DL has a function of a data line that supplies configuration data to the circuit 11a and the circuit 11b. The wiring WLa has a function of a writing control signal line that controls writing of configuration data to the circuit 11a. The wiring WLb has a function of a writing control signal line that controls writing of configuration data to the circuit 11b. The wiring CCSLa has a function of a context control signal line that supplies a context data signal to the node N2a. The wiring CCSLb has a function of a context control signal line that supplies a context data signal to the node N2b. The wiring ISL has a function of an input signal line. The wiring OSL has a function of an output signal line that outputs a signal corresponding to configuration data retained in the circuit 11a or configuration data retained in the circuit 11b.

Although details will be described later, the wiring ISL and the wiring OSL are connected to a PLE and an input/output circuit, for example.

Here, the reduction in off-state current of the transistor 22a results in a longer retention time for a signal written to the node N2a. Moreover, the reduction in off-state current of the transistor 22b results in a longer retention time for a signal written to the node N2b. Here, an off-state current refers to a current that flows between a source and a drain when a transistor is off. In the case of an n-ch transistor, for example, when its threshold voltage is approximately 0 V to 2 V, a current flowing between a source and a drain when a gate voltage is negative with respect to source and drain voltages can be referred to as an off-state current. An ultralow off-state current means, for example, that an off-state current per micrometer of channel width is lower than or equal to 100 zA (zeptoamperes). Since the off-state current is preferably as low as possible, the normalized off-state current is preferably lower than or equal to 10 zA/μm or lower than or equal to 1 zA/μm, further preferably lower than or equal to 10 yA/μm (yA: yoctoamperes). Note that 1 zA is $1 \times 10^{-21}$ A and 1 yA is $1 \times 10^{-24}$ A.

To obtain such an ultralow off-state current, a channel formation region of a transistor is formed using a semiconductor with a wide bandgap. An example of such a semiconductor is an oxide semiconductor. An oxide semiconductor has a bandgap of 3.0 eV or more; thus, a transistor whose active layer or active region contains an oxide semiconductor (OS transistor) has a low leakage current caused by thermal excitation and has an ultralow off-state current. A channel formation region of an OS transistor is preferably formed using an oxide semiconductor containing at least one of indium (In) and zinc (Zn). A typical example of such an oxide semiconductor is an In-M-Zn oxide (the element M is Al, Ga, Y, or Sn, for example). By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly purified oxide semiconductor. By using a highly purified oxide semiconductor, the off-state current normalized by channel width of an OS transistor can be as low as several yoctoamperes per micrometer to several zeptoamperes per micrometer.

In addition, the OS transistor has lower temperature dependence of off-state current characteristics than a transistor whose active layer or active region contains silicon (hereinafter such a transistor is referred to as a Si transistor). Thus, the normalized off-state current of the OS transistor can be less than or equal to 100 zA even at high temperatures (e.g., 100° C. or higher). Accordingly, with the use of OS transistors as the transistors 22a and 22b, signals written to the nodes N2a and N2b can be retained for a long time even in a high temperature environment. As a result, a semiconductor device that is highly reliable even in a high temperature environment can be obtained.

Note that the transistor 23a and the transistor 23b can be Si transistors. In this case, the amount of current flowing through the transistors 23a and 23b, which function as pass transistors, can be increased because a Si transistor features higher field-effect mobility than an OS transistor. Thus, the processing performance of the circuit 10 can be increased.

Alternatively, the transistor 23a and the transistor 23b may be OS transistors. That is, all the transistors included in the circuit 10 may be OS transistors.

In the circuit 10, the wiring ISL and the wiring OSL are connected through one transistor (the transistor 23a or the transistor 23b). Thus, the operation speed of the circuit 10 can be increased compared to the case where the wiring ISL and the wiring OSL are connected through two or more transistors.

In the circuit 10, it is possible to concurrently perform writing of configuration data to one of the circuits 11a and 11b and output from the wiring OSL of a signal corresponding to configuration data retained in the other of the circuits 11a and 11b. That is, the circuit 10 can execute dynamic reconfiguration. As a result, circuit operation can be continued during reconfiguration, leading to higher processing performance of the circuit 10.

Furthermore, in the circuit 10, the potentials of configuration data retained in the circuit 11a and the circuit 11b do not depend on the potentials of the wiring ISL and the wiring OSL. That is, even if the potentials of the wiring ISL and the wiring OSL are changed during dynamic reconfiguration, the potentials of the node N1a and the node N1b are not varied by an interaction such as capacitive coupling. As a result, the operation stability of the circuit 10 can be enhanced.

Figure 2:
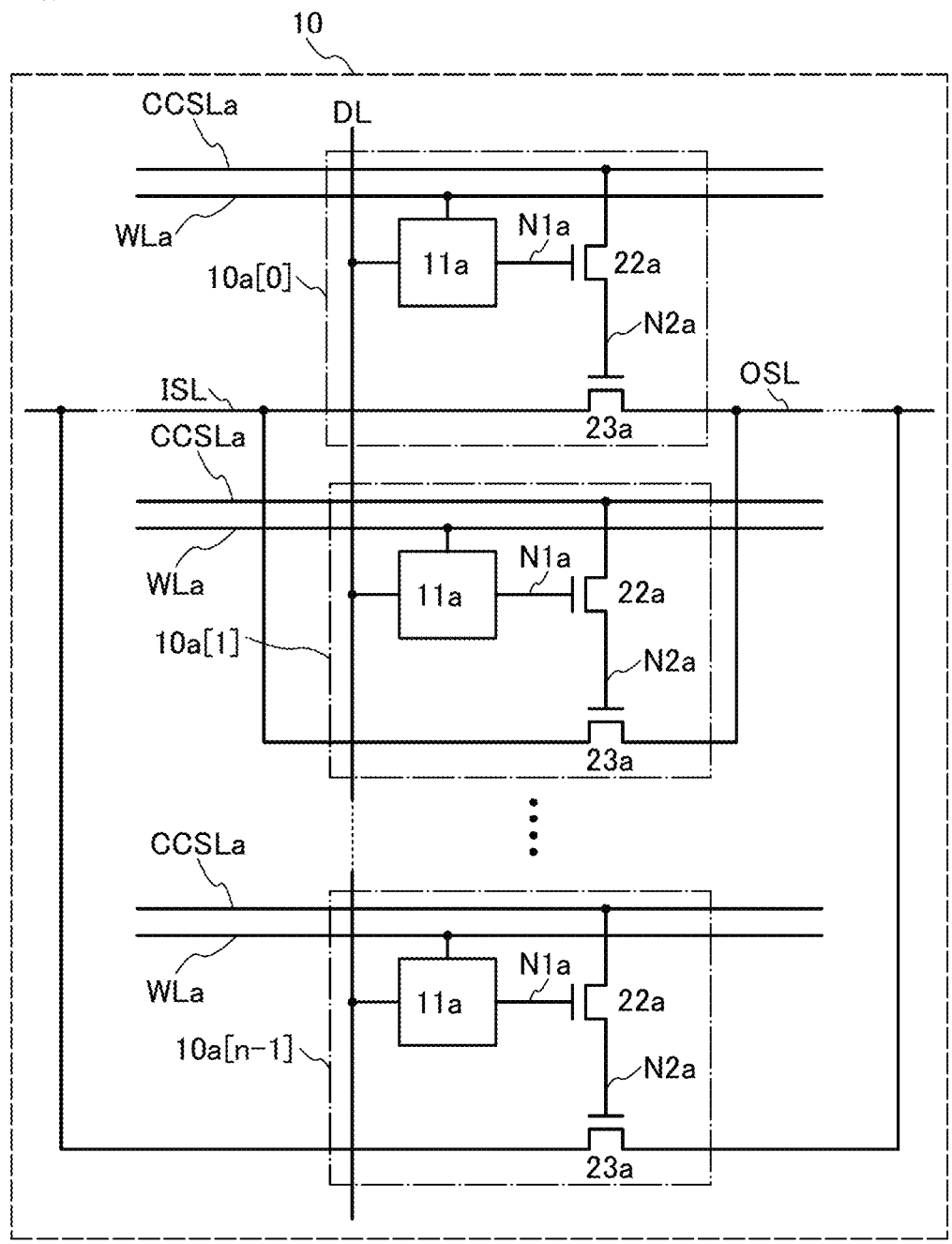
FIG. 2 is a circuit diagram illustrating a structure example of a semiconductor device.

The circuit 10b has a structure similar to that of the circuit 10a. In the example of FIG. 1, the circuit 10 includes the circuit 10a and one circuit with a structure similar to that of the circuit 10a. That is, in addition to the circuit 10a, the circuit 10 needs to include at least one circuit whose structure is similar to that of the circuit 10a. For example, as illustrated in FIG. 2, the circuit 10 may include n circuits 10a denoted as circuits 10a [0] to 10a [n−1], where n is an integer of 2 or more.

Figure 3:
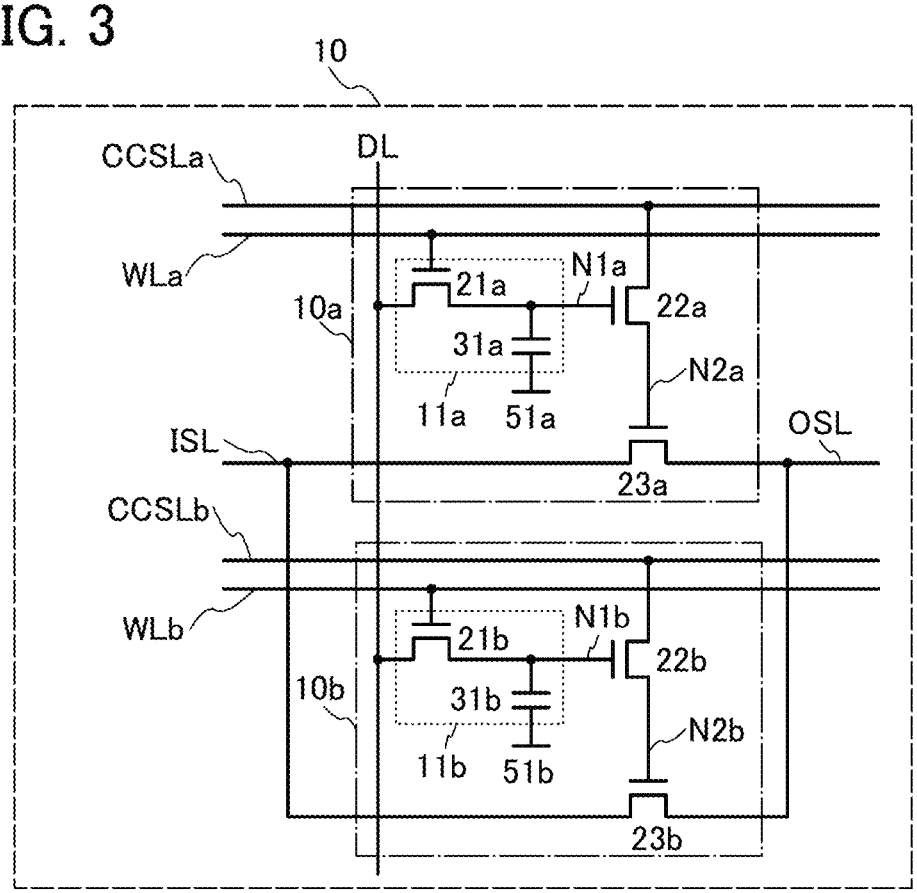
FIG. 3 is a circuit diagram illustrating a structure example of a semiconductor device.

The circuit 11a and the circuit 11b in FIG. 1 can have a structure illustrated in FIG. 3, for example. The circuit 11a in FIG. 3 includes a transistor 21a, a capacitor 31a, and a wiring 51a. The circuit 11b includes a transistor 21b, a capacitor 31b, and a wiring 51b.

Although an example where the transistors 21a and 21b are n-ch transistors is shown here, one embodiment of the present invention is not limited to this, and one or both of these transistors may be p-ch transistors.

One of a source and a drain of the transistor 21a is electrically connected to the wiring DL. The other of the source and the drain of the transistor 21a is electrically connected to the gate of the transistor 22a and one terminal of the capacitor 31a. The other terminal of the capacitor 31a is electrically connected to the wiring 51a.

One of a source and a drain of the transistor 21b is electrically connected to the wiring DL. The other of the source and the drain of the transistor 21b is electrically connected to the gate of the transistor 22b and one terminal of the capacitor 31b. The other terminal of the capacitor 31b is electrically connected to the wiring 51b.

Note that the potentials of the wiring 51a and the wiring 51b can be an L-level potential, for example.

In this specification, an H-level potential and the L-level potential refer to a high potential and a low potential, respectively. The L-level potential can be a ground potential, for example.

To the node N1a, the other of the source and the drain of the transistor 21a, the gate of the transistor 22a, and the one terminal of the capacitor 31a are connected. To the node N1b, the other of the source and the drain of the transistor 21b, the gate of the transistor 22b, and the one terminal of the capacitor 31b are connected.

The transistor 21a has a function of controlling electrical continuity between the wiring DL and the node N1a. The transistor 21b has a function of controlling electrical continuity between the wiring DL and the node N1b. The capacitor 31a and the capacitor 31b have a function of retaining configuration data.

Here, the transistor 21a and the transistor 21b may be OS transistors, in which case the off-state current of the transistors 21a and 21b can be reduced, resulting in a longer retention time for configuration data.

<Operation Example of Circuit 10>

Next, as an example of the operation of the circuit 10, the operation of the circuit 10 with the structure illustrated in FIG. 3 will be described in detail with reference to a timing chart in FIG. 4 and circuit diagrams in FIGS. 5A to 11B and FIG. 12. The timing chart in FIG. 4 shows the potentials of the wiring DL, the wiring WLa, the wiring WLb, the wiring CCSLa, the wiring CCSLb, the wiring ISL, the wiring OSL, the node N1a, the node N1b, the node N2a and the node N2b. In FIGS. 5A to 11B, the H-level potential is shown as VDD and the L-level potential as VSS.

At time T00, the potentials of the node N2a and the node N2b are initialized to the L-level potential, whereby the transistor 23a and the transistor 23b can be prevented from being turned on involuntarily.

Figure 5A:
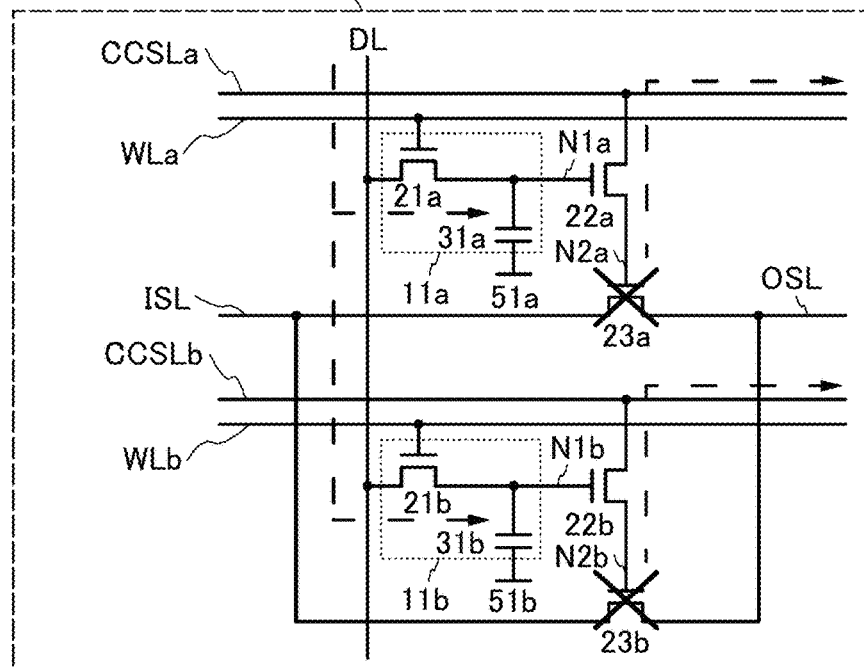
FIGS. 5A and 5B are circuit diagrams illustrating an operation example of a semiconductor device.

At the time T00, the transistor 21a and the transistor 21b are turned on by setting the potentials of the wiring WLa and the wiring WLb to H level (FIG. 5A). By setting the potential of the wiring DL to H level in this situation, the potentials of the node N1a and the node N1b become H level. Thus, the transistor 22a and the transistor 22b are turned on. Here, the potentials of the wiring CCSLa and the wiring CCSLb are L level, so that the potentials of the node N2a and the node N2b also become L level.

Note that at the time T00, the potentials of the wiring ISL and the wiring OSL are L level.

From time T01 to time T02, a signal with the L-level potential is written to the circuit 11a as configuration data. From the time T02 to time T03, a signal with the H-level potential is written to the circuit 11b as configuration data.

Figure 5B:
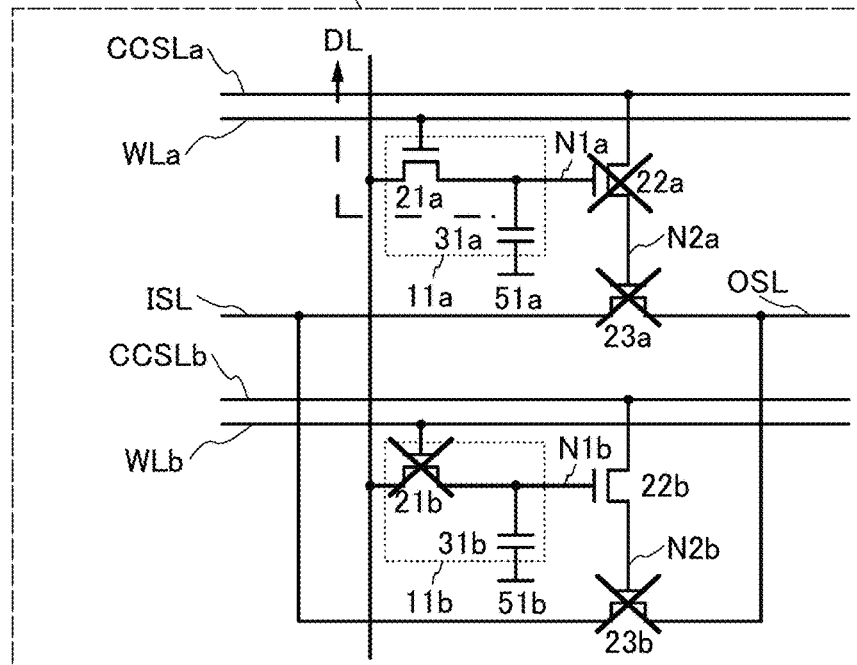

At the time T01, the transistor 21b is turned off by setting the potential of the wiring WLb to L level. Then, the potential of the wiring DL is set to L level. The potential of the wiring WLa is kept H level so that the transistor 21a remains on. In the above manner, the potential of the node N1a becomes L level. Thus, the transistor 23a is turned off, and the node N2a becomes floating while maintaining the L-level potential (FIG. 5B).

Note that the node N1b becomes floating while maintaining the H-level potential.

Figure 6A:
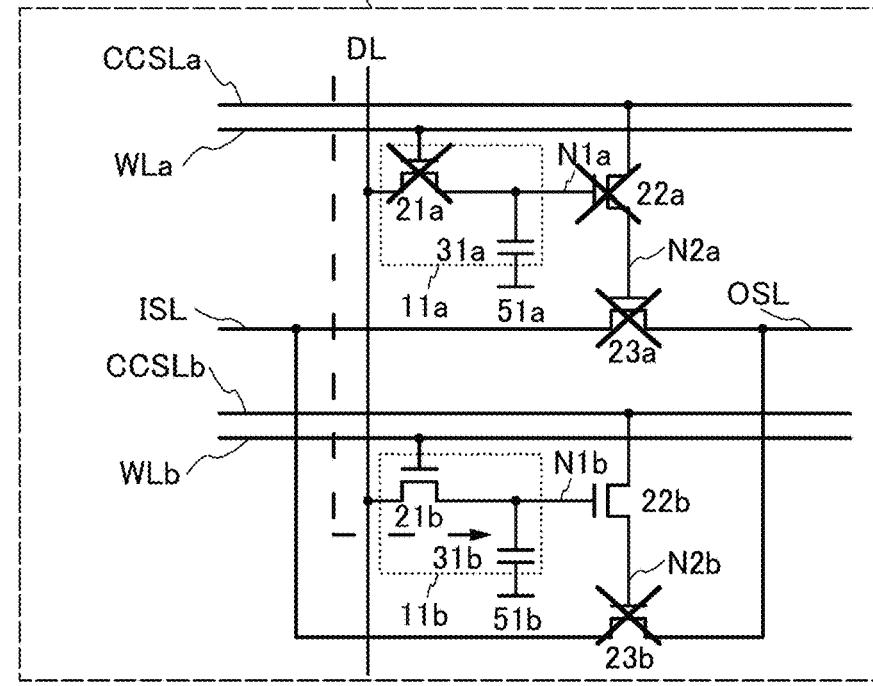
FIGS. 6A and 6B are circuit diagrams illustrating an operation example of a semiconductor device.

At the time T02, the transistor 21a is turned off by setting the potential of the wiring WLa to L level. Thus, the node N1a becomes floating while maintaining the L-level potential. Then, the transistor 21b is turned on by setting the potential of the wiring WLb to H level. By setting the potential of the wiring DL to H level in this situation, the potential of the node N1b becomes H level. Although the transistor 22b is on, the node N2b maintains the L-level potential because the potential of the wiring CCSLb is L level. Through these steps, writing of configuration data to the circuit 11a is completed (FIG. 6A).

Figure 6B:
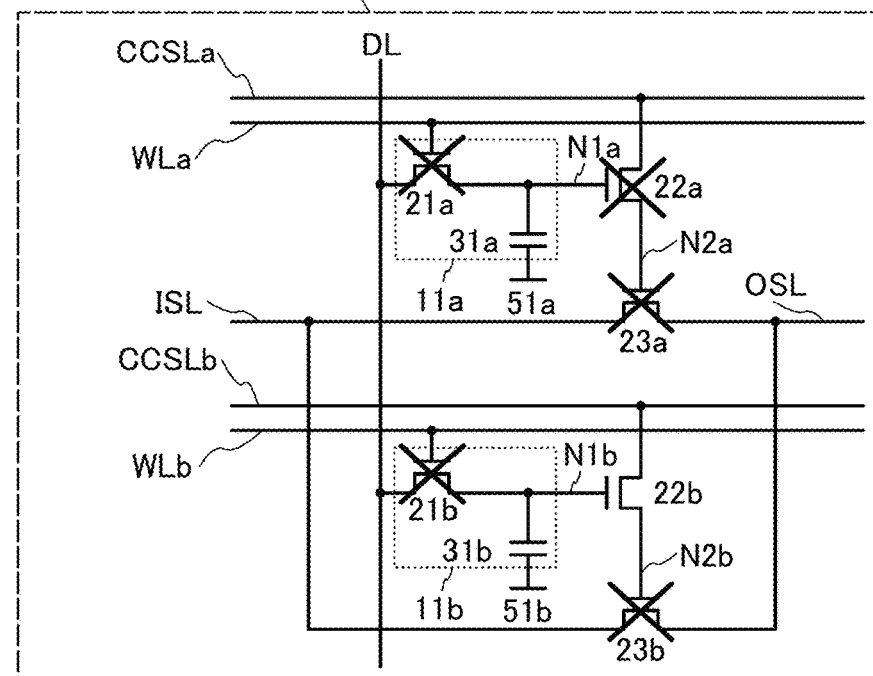

At the time T03, the transistor 21b is turned off by setting the potential of the wiring WLb to L level. Then, the potential of the wiring DL is set to L level. Thus, configuration operation is completed, and the node N1b retains the H-level potential and the node N1a, the node N2a, and the node N2b retain the L-level potential. As a result, writing of configuration data to the circuit 11b is completed (FIG. 6B).

Figure 7A:
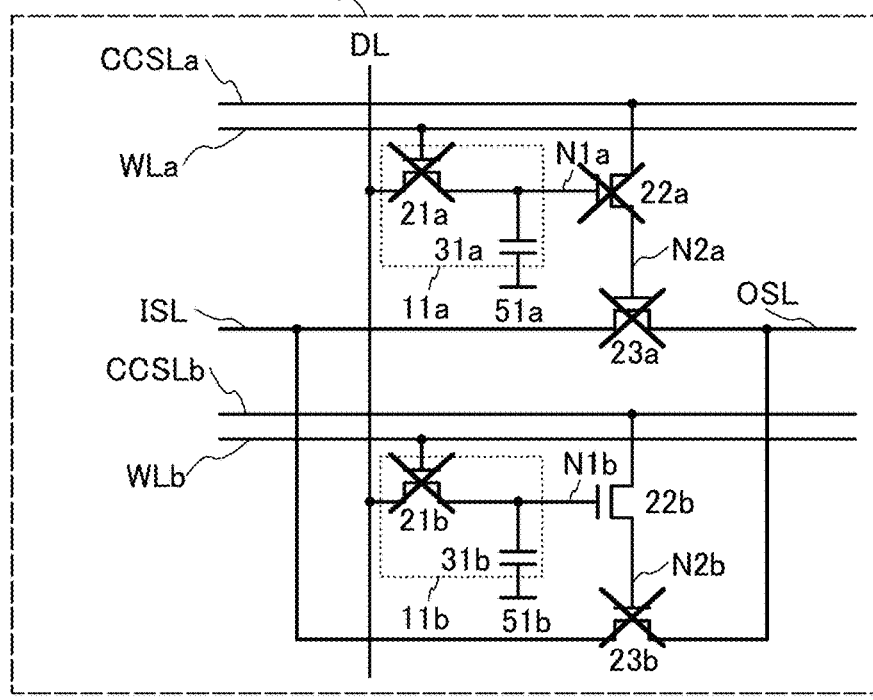
FIGS. 7A and 7B are circuit diagrams illustrating an operation example of a semiconductor device.

From time T04 to time T06, a signal based on configuration data retained in the circuit 11a is output. At the time T04, the potentials of the wiring CCSLa and the wiring ISL become H level. Meanwhile, the transistor 22a is off because the potential of the node N1a is L level; accordingly, the node N2a maintains the L-level potential. Thus, the transistor 23a remains off, and the potential of the wiring OSL remains at L level even though the potential of the wiring ISL is H level (FIG. 7A).

Figure 7B:
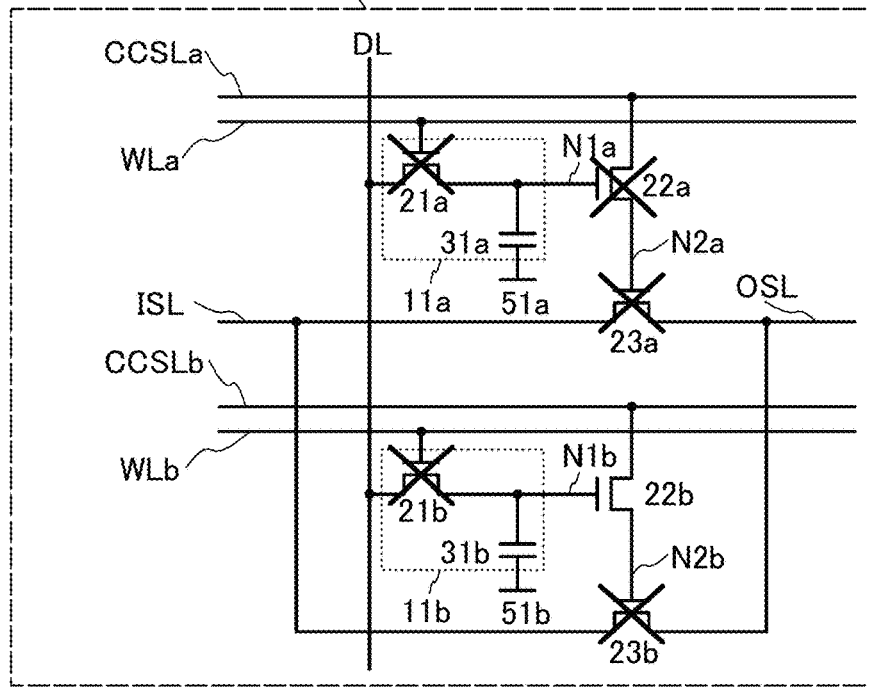

At the time T05, the potential of the wiring ISL becomes L level (FIG. 7B). At the time T06, the potential of the wiring CCSLa is set to L level. Through these steps, output of the signal based on configuration data retained in the circuit 11a is completed (FIG. 8A).

From time T07 to time T10, a signal based on configuration data retained in the circuit 11b is output. From the time T08 to the time T09, reconfiguration operation is performed on configuration data selected in accordance with a context data signal supplied from the wiring CCSLa. That is, the circuit 10 can execute dynamic reconfiguration. As a result, circuit operation can be continued during reconfiguration, leading to higher processing performance of the circuit 10.

From the time T08 to the time T09, a signal with the H-level potential is written to the circuit 11a as configuration data. That is, the configuration data retained in the circuit 11a is changed from the signal with the L-level potential to the signal with the H-level potential.

At the time T07, the potential of the wiring CCSLb becomes H level. Since the potential of the node N1b is H level, the transistor 22b is on and the potential of the node N2b becomes H level. Consequently, the transistor 23b is turned on. Note that the potential of the node N2b becomes a potential that is decreased from the potential of the wiring CCSLb by a threshold voltage Vthb of the transistor 22b. In other words, given that the potential of the wiring CCSLb at the time T07 is VDD, the potential of the node N2b becomes VDD−Vthb, which is lower than the potential of the node N1b. Note that the decrease in potential of the node N2b can be prevented by adjusting the potential of the wiring DL at the time T02 so that the potential of the node N1b is higher than the potential of the wiring CCSLb at the time T07 by at least Vthb (FIG. 8B).

Figure 9A:
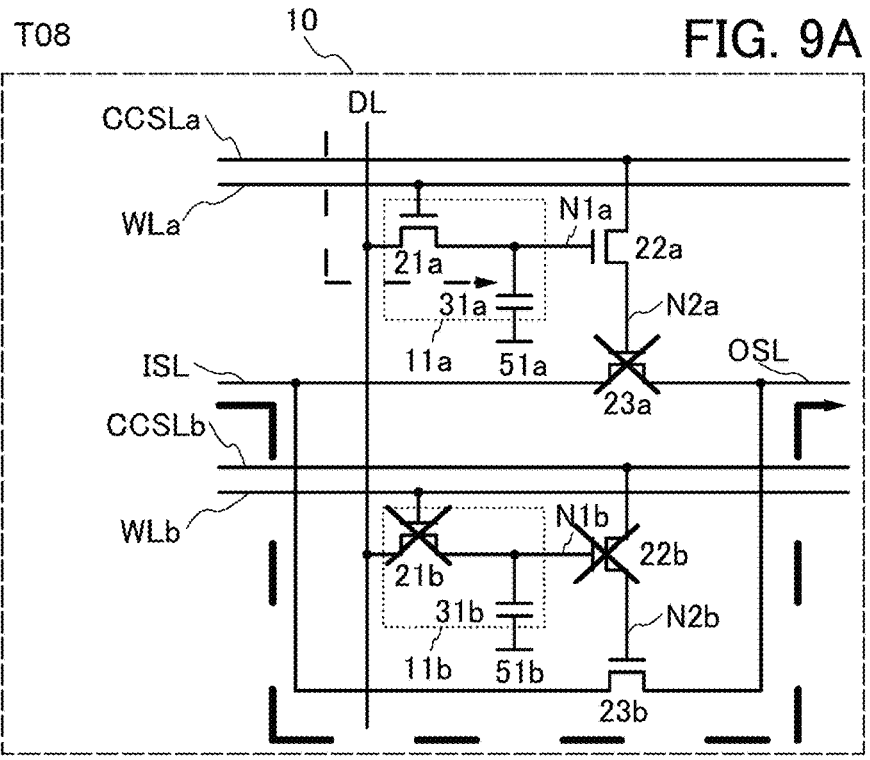
FIGS. 9A and 9B are circuit diagrams illustrating an operation example of a semiconductor device.

At the time T08, the potential of the wiring ISL becomes H level. The potential of the wiring OSL also becomes H level because the transistor 23b is on. When the potential of the wiring ISL and the potential of the wiring OSL become H level, the potential of the node N2b is increased by capacitive coupling through the capacitance of the gate electrode and the capacitance between the source electrode and the drain electrode of the transistor 23b (boosting effect). Thus, the amount of current flowing between the wiring ISL and the wiring OSL through the transistor 23b can be increased. As a result, the processing performance of the circuit 10 can be enhanced (FIG. 9A).

Since the potential of the node N2b becomes higher than that of the node N1b because of the boosting effect, the transistor 22b is turned off. Consequently, a state where the potential of the node N2b is higher than that of the node N1b is maintained.

Moreover, at the time T08, the transistor 21a is turned on by setting the potential of the wiring WLa to H level. By setting the potential of the wiring DL to H level in this situation, the potential of the node N1a is rewritten to the H-level potential. Thus, the transistor 22a is turned on.

Figure 9B:
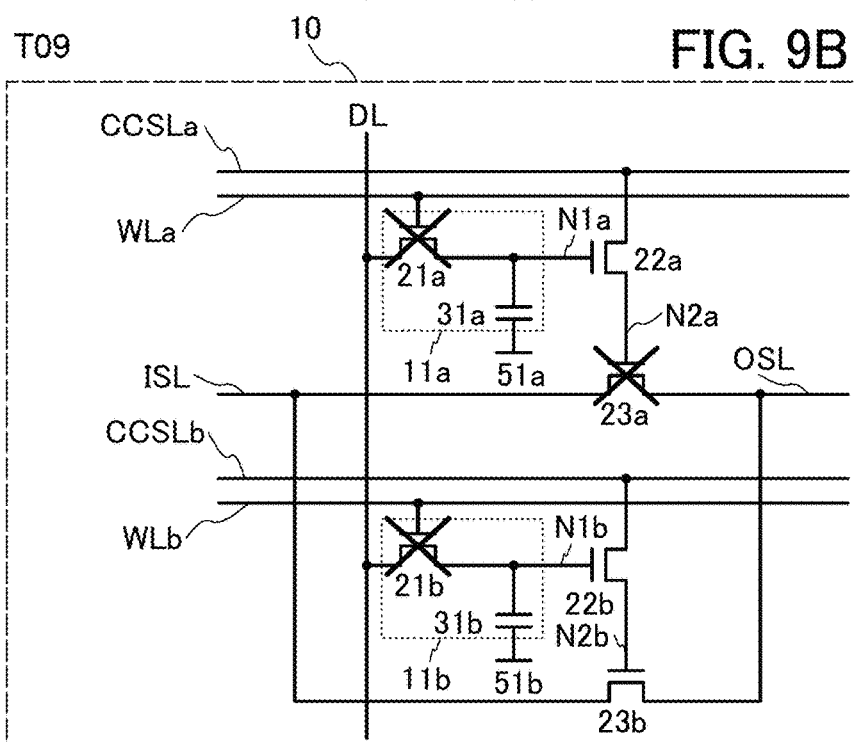

At the time T09, the potential of the wiring ISL becomes L level. The potential of the wiring OSL also becomes L level because the transistor 23b is on. When the potential of the wiring ISL and the potential of the wiring OSL become L level, the potential of the node N2b is decreased by capacitive coupling through the capacitance of the gate electrode and the capacitance between the source electrode and the drain electrode of the transistor 23b, and returns to VDD−Vthb, which is the potential from the time T07 to the time T08. Thus, the potential of the node N2b becomes lower than that of the node N1b, and the transistor 22b is turned on (FIG. 9B).

Moreover, at the time T09, the transistor 21a is turned off by setting the potential of the wiring WLa to L level. Then, the potential of the wiring DL is set to L level. Through these steps, the reconfiguration operation is completed.

Figure 10A:
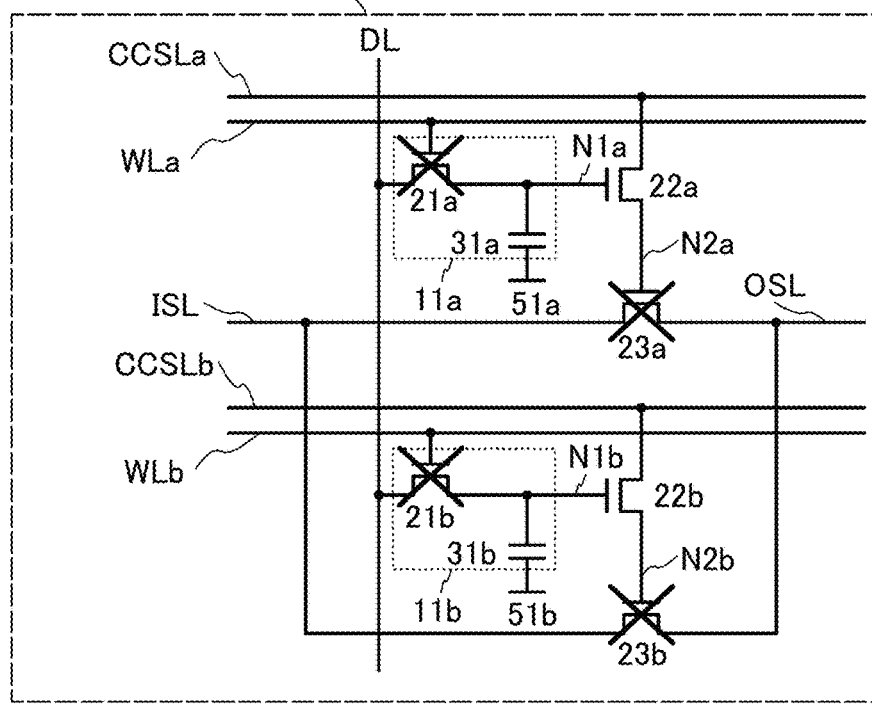
FIGS. 10A and 10B are circuit diagrams illustrating an operation example of a semiconductor device.

At the time T10, the potential of the wiring CCSLb is set to L level. Thus, the potential of the node N2b becomes L level, and the transistor 23b is turned off. As a result, output of the signal based on configuration data retained in the circuit 11b is completed (FIG. 10A).

From time T11 to time T14, the signal based on configuration data retained in the circuit 11a is output. From the time T12 to the time T13, reconfiguration operation is performed on configuration data selected in accordance with a context data signal supplied from the wiring CCSLb.

From the time T12 to the time T13, a signal with the L-level potential is written to the circuit 11b as configuration data. That is, the configuration data retained in the circuit 11b is changed from the signal with the H-level potential to the signal with the L-level potential.

Figure 10B:
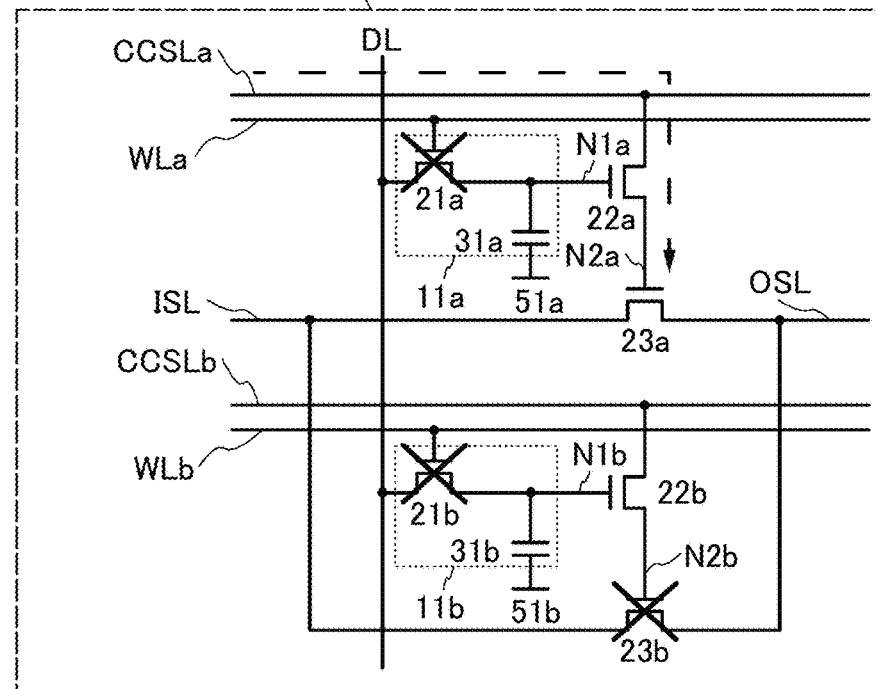
Figure 12:
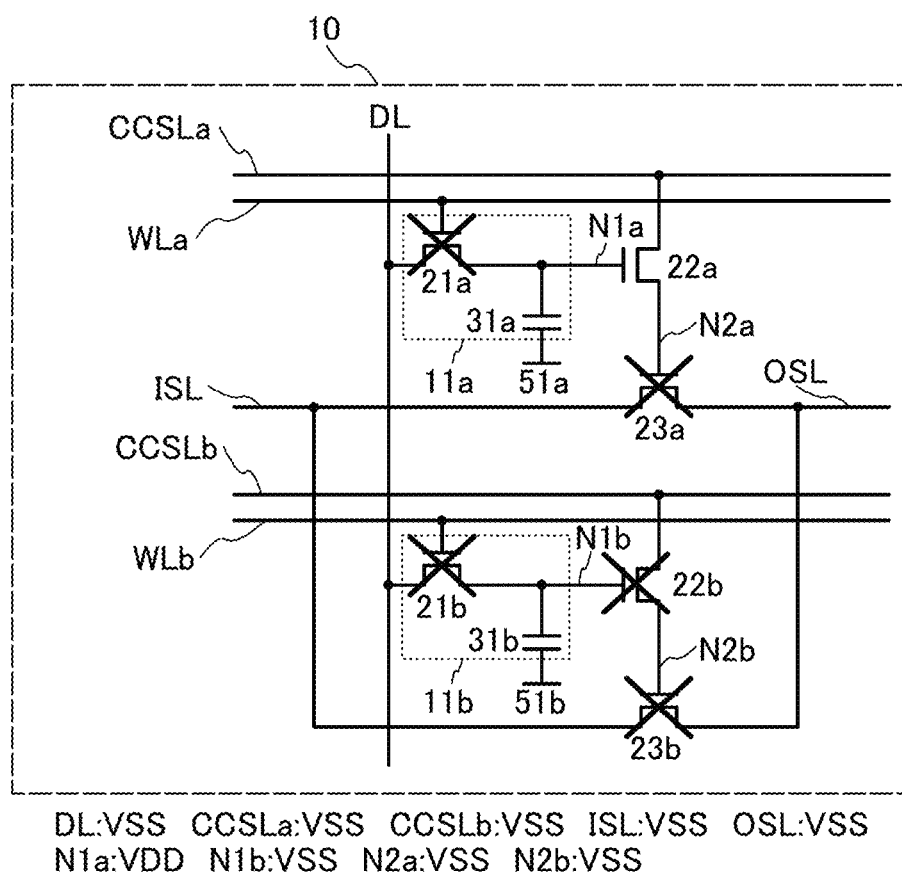
FIG. 12 is a circuit diagram illustrating an operation example of a semiconductor device.

At the time T11, the potential of the wiring CCSLa becomes H level. Since the potential of the node N1a is H level, the transistor 22a is on and the potential of the node N2a becomes H level. Consequently, the transistor 23a is turned on. Note that the potential of the node N2a becomes a potential that is decreased from the potential of the wiring CCSLa by a threshold voltage Vtha of the transistor 22a. In other words, given that the potential of the wiring CCSLa at the time T11 is VDD, the potential of the node N2a becomes VDD−Vtha, which is lower than the potential of the node N1a. Note that the decrease in potential of the node N2a can be prevented by adjusting the potential of the wiring DL at the time T08 so that the potential of the node N1a is higher than the potential of the wiring CCSLa at the time T11 by at least Vtha (FIG. 10B).

At the time T12, the potential of the wiring ISL becomes H level. The potential of the wiring OSL also becomes H level because the transistor 23a is on. When the potential of the wiring ISL and the potential of the wiring OSL become H level, the potential of the node N2a is increased by the boosting effect. Thus, the amount of current flowing between the wiring ISL and the wiring OSL through the transistor 23a can be increased. As a result, the processing performance of the circuit 10 can be enhanced (FIG. 11A).

Since the potential of the node N2a becomes higher than that of the node N1a because of the boosting effect, the transistor 22a is turned off. Consequently, a state where the potential of the node N2a is higher than that of the node N1a is maintained.

Moreover, at the time T12, the transistor 21b is turned on by setting the potential of the wiring WLb to H level. Since the potential of the wiring DL is L level, the potential of the node N1b is rewritten to the L-level potential. Thus, the transistor 22b is turned off.

At the time T13 (FIG. 11B), the potential of the wiring ISL becomes L level. The potential of the wiring OSL also becomes L level because the transistor 23a is on. When the potential of the wiring ISL and the potential of the wiring OSL become L level, the potential of the node N2a decreases and returns to VDD−Vtha, which is the potential from the time T10 to the time T11. Thus, the potential of the node N2a becomes lower than that of the node N1a, and the transistor 22a is turned on.

Moreover, at the time T13, the transistor 21b is turned off by setting the potential of the wiring WLb to L level. As a result, the reconfiguration operation is completed.

At the time T14 (FIG. 12), the potential of the wiring CCSLa is set to L level. Thus, the potential of the node N2a becomes L level, and the transistor 23a is turned off. As a result, output of the signal based on configuration data retained in the circuit 11a is completed.

The above is an operation example of the circuit 10 illustrated in FIG. 3.

As shown in FIG. 4, the potentials of configuration data retained in the circuit 11a and the circuit 11b do not depend on the potentials of the wiring ISL and the wiring OSL. That is, even if the potentials of the wiring ISL and the wiring OSL are changed during dynamic reconfiguration, the potentials of the node N1a and the node N1b are not varied by an interaction such as capacitive coupling. As a result, the operation stability of the circuit 10 can be enhanced.

The timing chart in FIG. 4 can also be referred to for the operation of the circuit 10 having a structure other than that illustrated in FIG. 3. Even for the operation of the circuit 10 in which some or all of the transistors 21a to 23a and 21b to 23b are p-ch transistors, the timing chart in FIG. 4 can be referred to, for example, when the levels of the potentials are inverted as appropriate.

In Embodiment 1, one embodiment of the present invention has been described. Other embodiments of the present invention will be described in Embodiments 2 to 8. Note that one embodiment of the present invention is not limited thereto. In other words, various embodiments of the present invention are disclosed in Embodiments 1 to 8, and one embodiment of the present invention is not limited to a particular embodiment. Although an example in which a channel formation region, source and drain regions, and the like of a transistor contain an oxide semiconductor is described as one embodiment of the present invention, one embodiment of the present invention is not limited to this example. Depending on circumstances or conditions, various transistors or a channel formation region, source and drain regions, or the like of a transistor in one embodiment of the present invention may contain various semiconductors. Depending on circumstances or conditions, various transistors or a channel formation region, source and drain regions, or the like of a transistor in one embodiment of the present invention may contain at least one of silicon, germanium, silicon germanium, silicon carbide, gallium arsenide, aluminum gallium arsenide, indium phosphide, gallium nitride, and an organic semiconductor, for example. Alternatively, for example, depending on circumstances or conditions, various transistors or a channel formation region, source and drain regions, or the like of a transistor in one embodiment of the present invention does not necessarily contain an oxide semiconductor.

This embodiment can be implemented in appropriate combination with any of the structures described in the other embodiments.

Embodiment 2

In this embodiment, variation examples of the circuit 10 shown in Embodiment 1 will be described with reference to drawings.

Figure 13A:
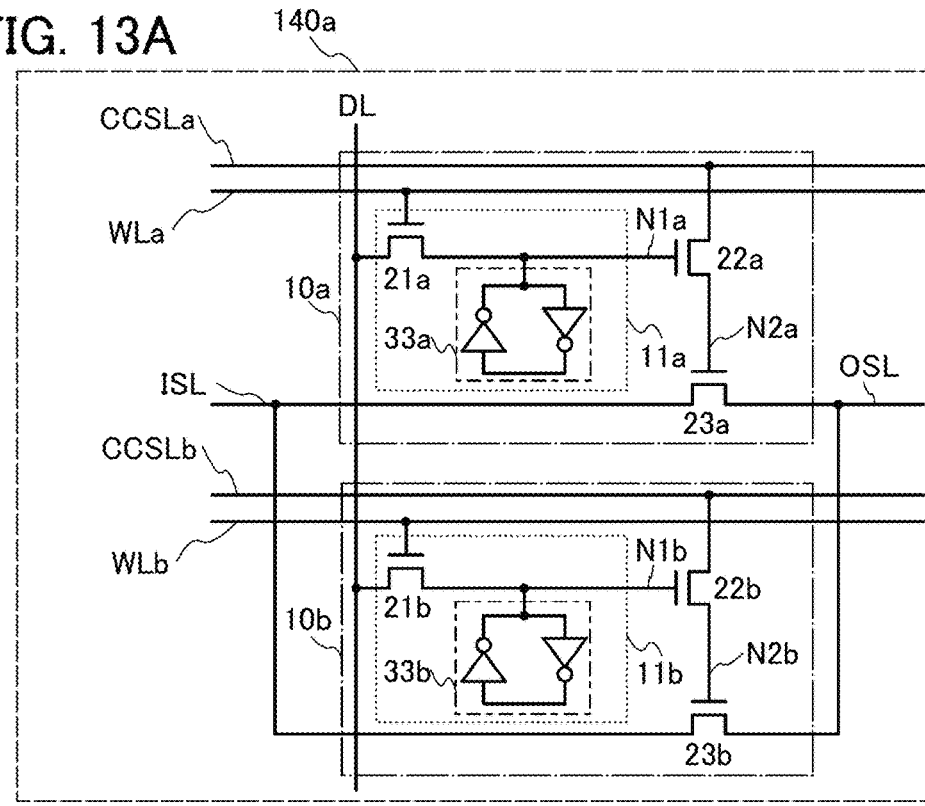
FIGS. 13A and 13B are circuit diagrams each illustrating a structure example of a semiconductor device.
Figure 13B:
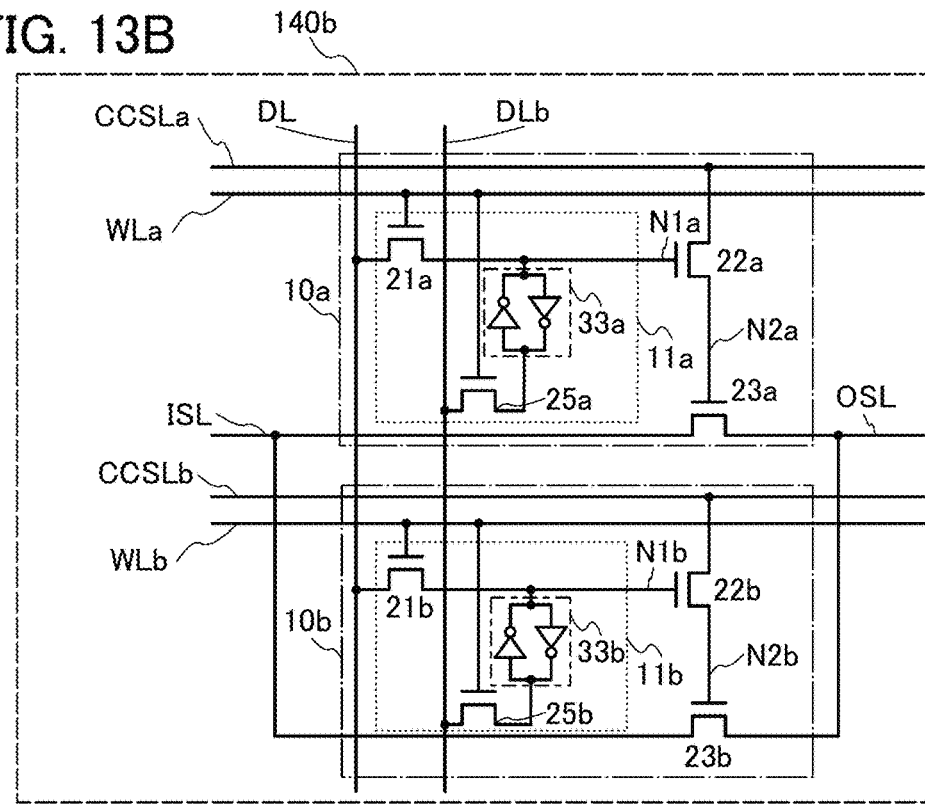

The circuit 11a and the circuit 11b included in the circuit 10 can have a variety of structures. For example, as in a circuit 140a illustrated in FIG. 13A, the circuit 11a can include the transistor 21a and a latch circuit 33a, and the circuit 11b can include the transistor 21b and a latch circuit 33b. As in a circuit 140b illustrated in FIG. 13B, a wiring DLb having a function of supplying data with inverted logic of the wiring DL (complementary data) may be provided. In this case, the latch circuit 33a and the wiring DLb are electrically connected through a transistor 25a, and the latch circuit 33b and the wiring DLb are electrically connected through a transistor 25b.

Figure 14A:
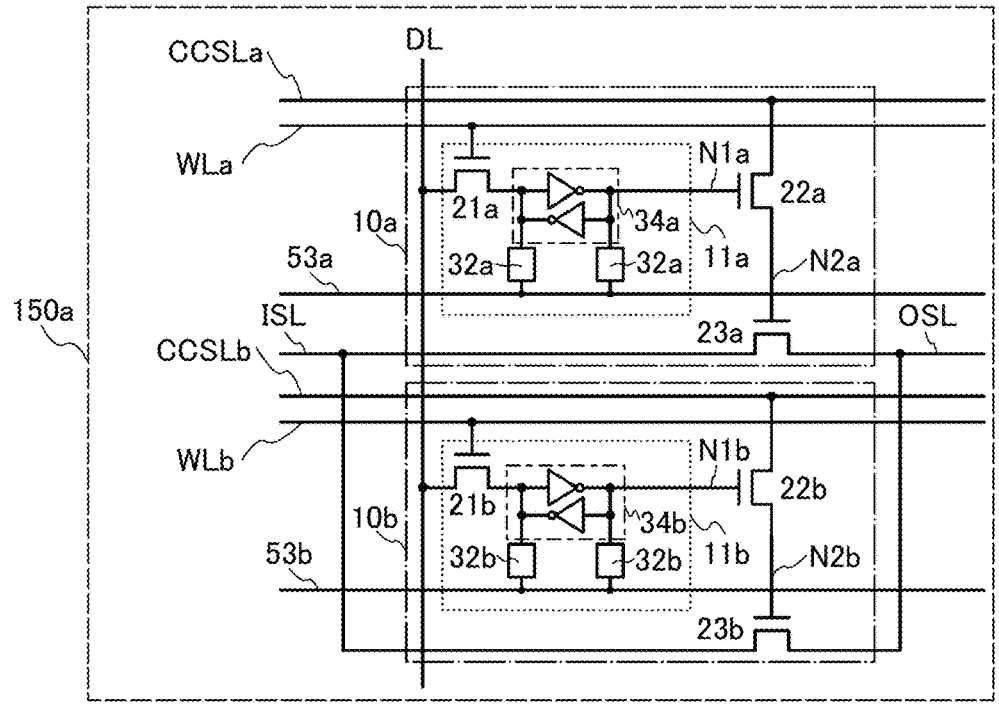
FIGS. 14A and 14B are circuit diagrams each illustrating a structure example of a semiconductor device.

Furthermore, as in a circuit 150a illustrated in FIG. 14A, the circuit 11a may include the transistor 21a, a latch circuit 34a, magnetoresistive random access memories (MRAMs) 32a, and a wiring 53a; and the circuit 11b may include the transistor 21b, a latch circuit 34b, MRAMs 32b, and a wiring 53b. As in a circuit 150b illustrated in FIG. 14B, the latch circuit 34a and the MRAM 32a may be electrically connected through a transistor 26a, and the latch circuit 34b and the MRAM 32b may be electrically connected through a transistor 26b.

Figure 14B:
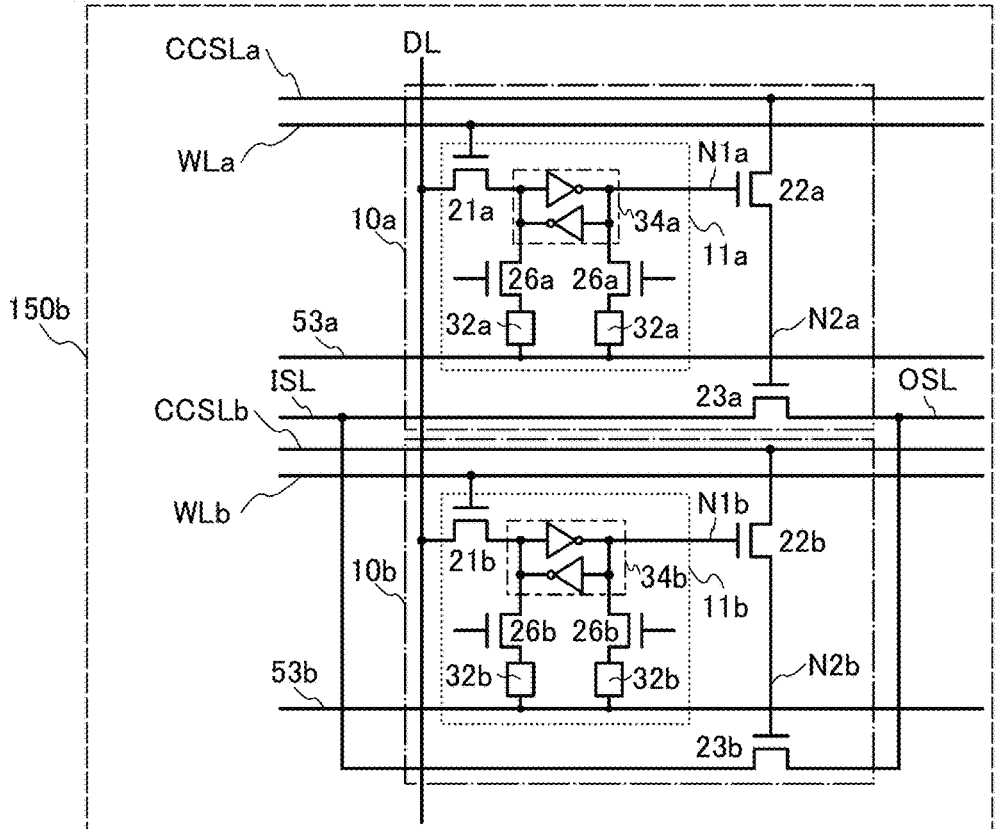

Note that the latch circuit is not necessarily provided in the circuit 11a and the circuit 11b illustrated in FIGS. 14A and 14B.

The circuit 11a and the circuit 11b may include, for example, a resistive random access memory (ReRAM) or flash memory.

Figure 15:
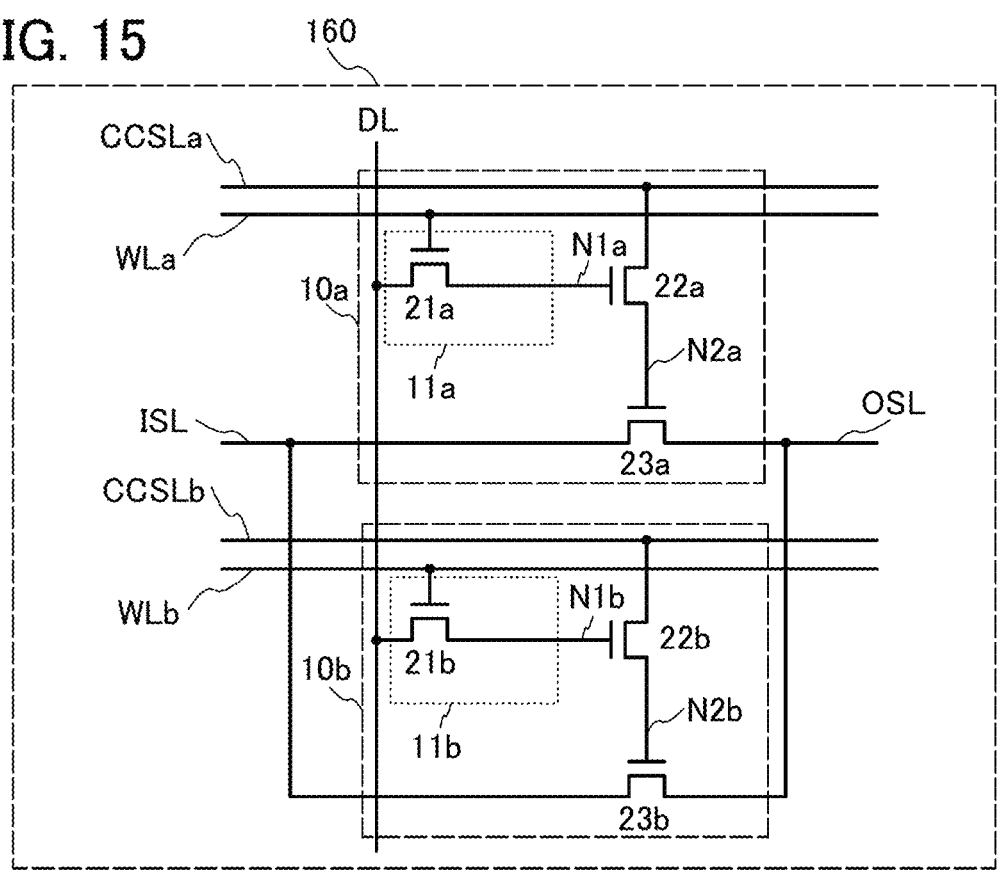
FIG. 15 is a circuit diagram illustrating a structure example of a semiconductor device.

A circuit 160 illustrated in FIG. 15 has a structure where the capacitor 31a and the capacitor 31b are omitted from the circuit 10 in FIG. 3. In this structure, configuration data is retained at the node N1a by parasitic capacitance of a wiring electrically connected to the node N1a, for example. Moreover, configuration data is retained at the node N1b by parasitic capacitance of a wiring electrically connected to the node N1b, for example. Such a structure can reduce the area of the circuit 10. Thus, the semiconductor device of one embodiment of the present invention can be downsized. Furthermore, the semiconductor device of one embodiment of the present invention can be more highly integrated.

Note that the structures of the circuit 11a and the circuit 11b shown above are examples, and the circuit 11a and the circuit 11b can have any structure as long as they have a function of retaining configuration data.

Figure 16A:
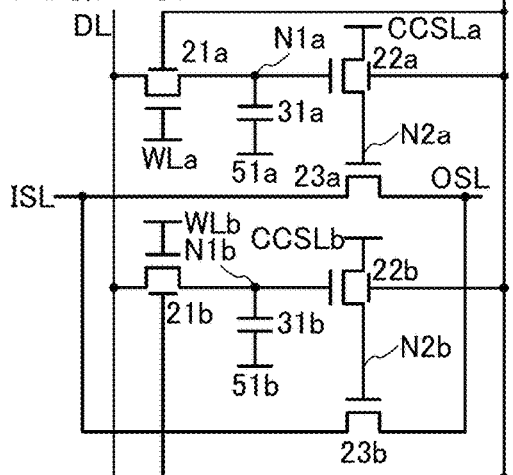
FIGS. 16A to 16E are circuit diagrams each illustrating a structure example of a semiconductor device.
Figure 16B:
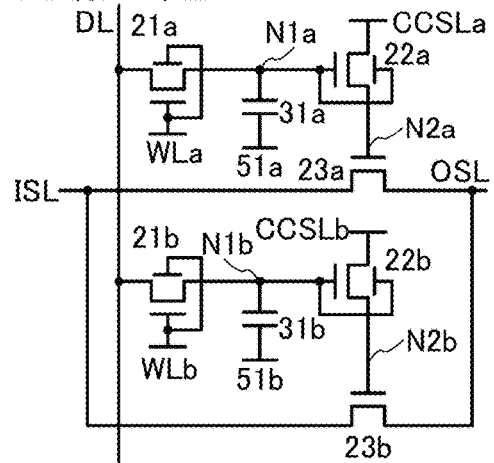
Figure 16C:
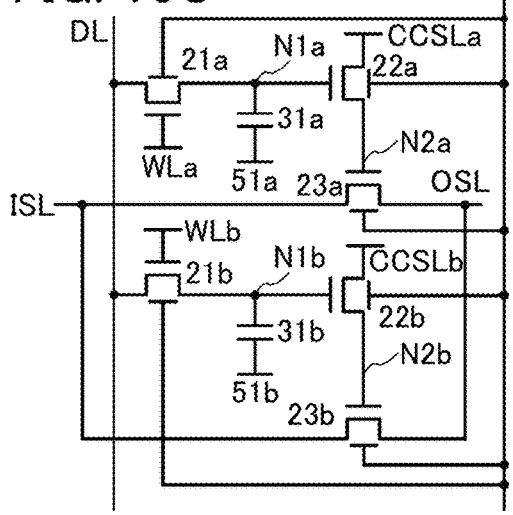
Figure 16D:
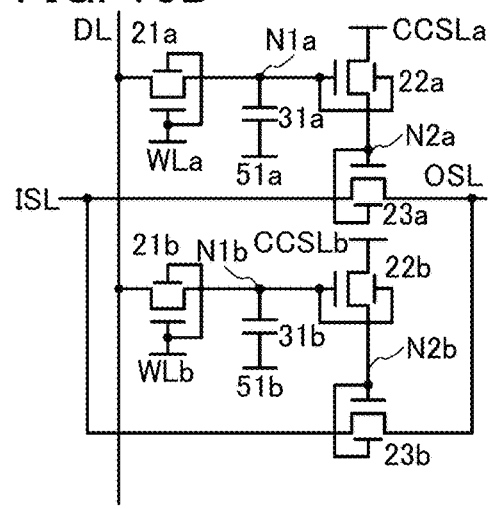
Figure 16E:
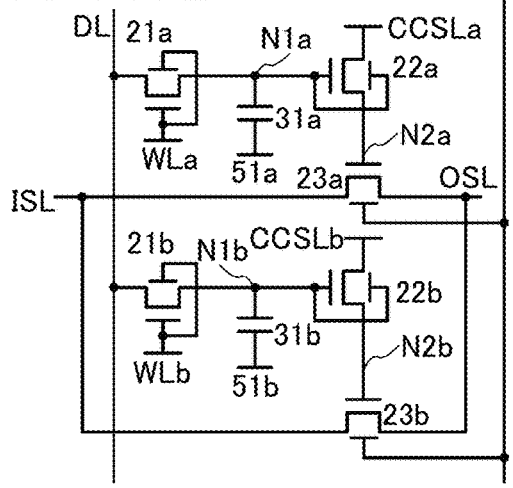

FIGS. 16A and 16B each illustrate a structure where the transistors 21a, 21b, 22a, and 22b included in the circuit 10 of FIG. 3 are provided with a backgate. FIG. 16A illustrates a structure where a constant potential is supplied to the backgates, which enables control of the threshold voltages. FIG. 16B illustrates a structure where the same potential is supplied to front gates and the corresponding backgates, which enables an increase in on-state current. The transistors 21a to 23a and 21b to 23b may be provided with a backgate as illustrated in FIGS. 16C and 16D. As illustrated in FIG. 16E, a transistor whose front gate and backgate are supplied with the same potential and a transistor whose backgate is supplied with a constant potential may be used in combination as appropriate.

Note that some wirings and reference numerals are not shown in FIGS. 16A to 16E.

Figure 17:
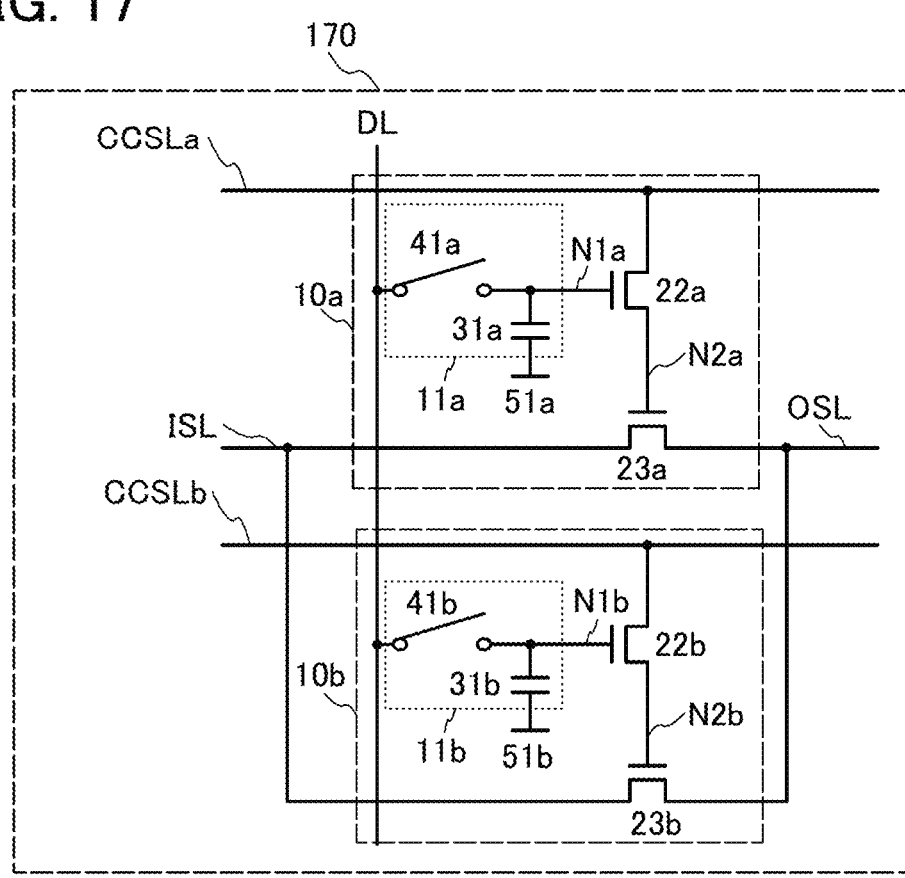
FIG. 17 is a circuit diagram illustrating a structure example of a semiconductor device.

In a circuit 170 illustrated in FIG. 17, the transistor 21a and the transistor 21b included in the circuit 10 of FIG. 3 are replaced with a switch 41a and a switch 41b. These transistors can be replaced with any element as long as it has a switching function. Note that it is possible that a transistor is used as one of the transistors 21a and 21b and another element with a switching function is used as the other.

Figure 18:
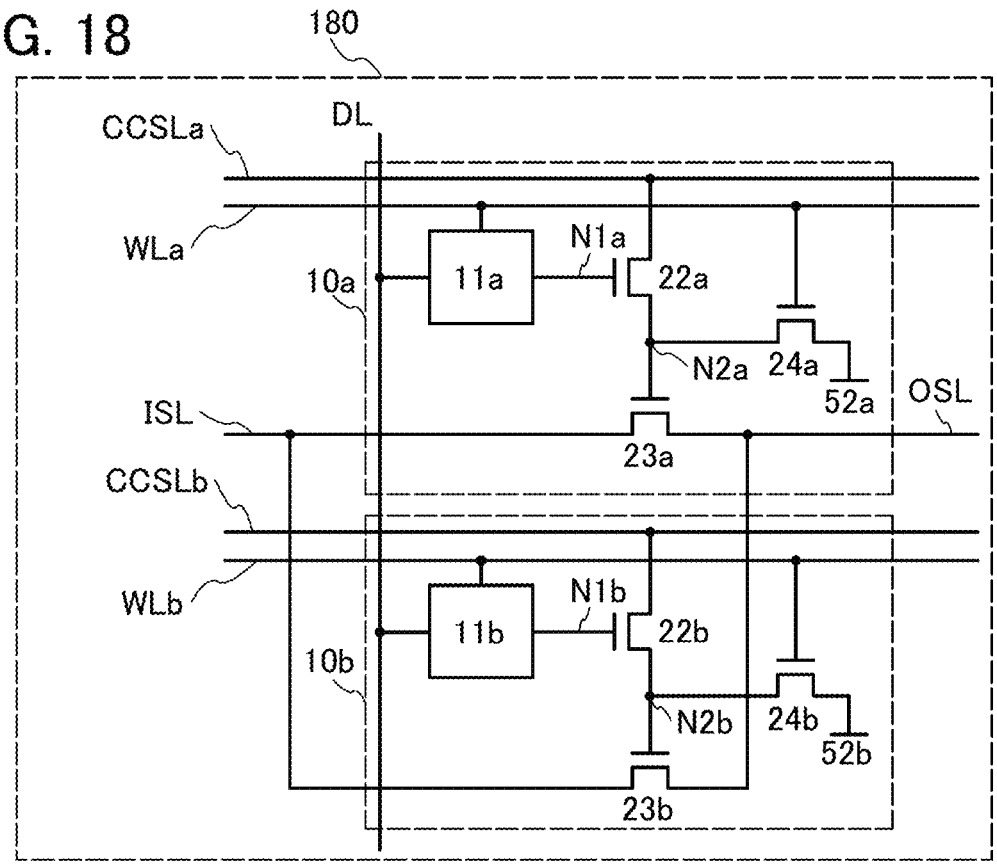
FIG. 18 is a circuit diagram illustrating a structure example of a semiconductor device.

A circuit 180 illustrated in FIG. 18 is configured such that a transistor 24a and a transistor 24b are added to the circuit 10 with the structure in FIG. 1. Although an example where both the transistors 24a and 24b are n-ch transistors is shown, one embodiment of the present invention is not limited to this, and one or both of these transistors may be p-ch transistors.

One of a source and a drain of the transistor 24a is electrically connected to the gate of the transistor 23a. One of a source and a drain of the transistor 24b is electrically connected to the gate of the transistor 23b. The other of the source and the drain of the transistor 24a is electrically connected to a wiring 52a. The other of the source and the drain of the transistor 24b is electrically connected to a wiring 52b. A gate of the transistor 24a is electrically connected to the wiring WLa. A gate of the transistor 24b is electrically connected to the wiring WLb.

Note that the potentials of the wiring 52a and the wiring 52b can be the L-level potential, for example.

The transistor 24a has a function of fixing the potential of the node N2a at a potential with which the transistor 23a is turned off, at the time of writing configuration data to the circuit 11a. The transistor 24b has a function of fixing the potential of the node N2b at a potential with which the transistor 23b is turned off, at the time of writing configuration data to the circuit 11b. These functions can prevent abnormal operation of the circuit 10 and simplify signal control during configuration operation.

Here, the transistor 24a and the transistor 24b may be OS transistors, in which case the off-state current of the transistors 24a and 24b can be reduced, resulting in a longer retention time for signals written to the node N2a and the node N2b.

The transistor 24a and the transistor 24b may be provided with a backgate. The backgate may be supplied with a constant potential or a potential supplied to a corresponding front gate. The transistor 24a and the transistor 24b can be replaced with any element as long as it has a switching function.

Note that any of the structures illustrated in FIGS. 1 to 3, FIGS. 13A and 13B, FIGS. 14A and 14B, FIG. 15, FIGS. 16A to 16E, and FIGS. 17 and 18 can be optionally combined with each other.

This embodiment can be implemented in appropriate combination with any of the structures described in the other embodiments.

Embodiment 3

In this embodiment, a PLD using the PSE of one embodiment of the present invention will be described with reference to a diagram.

Figure 19:
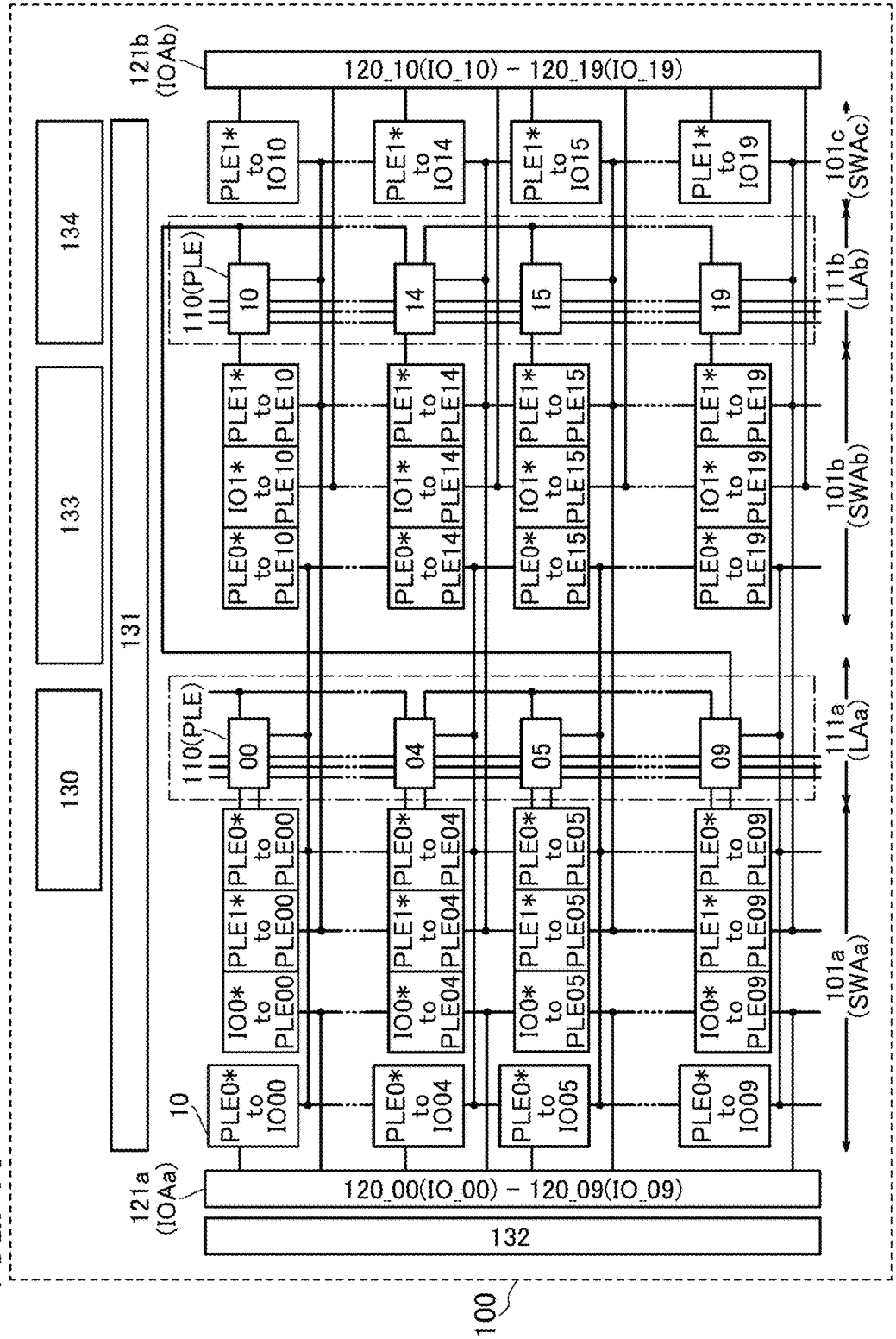
FIG. 19 is a block diagram illustrating a structure example of a semiconductor device.

FIG. 19 is a block diagram of a PLD 100 using the circuits 10. Note that the layout of circuit blocks in a block diagram specifies the positional relation for description. Even when a diagram shows that different functions are achieved by different circuit blocks, one circuit block may be actually configured to achieve the different functions. Functions of circuit blocks are specified for description, and even when a diagram shows one circuit block performing given processing, a plurality of circuit blocks may be actually provided to perform the processing.

The PLD 100 includes the circuits 10, circuits 110 (PLEs) with a function of a PLE, which is a programmable logic circuit, circuits 120 (IOs) with a function of an input/output circuit, a circuit 130, a circuit 131, a circuit 132, a circuit 133, and a circuit 134.

In the example of FIG. 19, the circuits 10 are arranged in a matrix and constitute a switch array 101a (SWAa), a switch array 101b (SWAb), and a switch array 101c (SWAc). Ten circuits 110 (PLEs) constitute a logic array 111a (LAa), and other 10 circuits 110 (PLEs) constitute a logic array 111b (LAb). Ten circuits 120 (IOs) constitute an input/output array 121a (IOAa), and other 10 circuits 120 (IOs) constitute an input/output array 121b (IOAb).

Note that the ten circuits 110 (PLEs) included in the logic array 111a (LAa) are denoted by circuits 110_00 (PLE_00) to 110_09 (PLE_09). The ten circuits 110 (PLEs) included in the logic array 111b (LAb) are denoted by circuits 110_00 (PLE_10) to 110_19 (PLE_19). The ten circuits 120 (IOs) included in the input/output array 121a (IOAa) are denoted by circuits 120_00 (IO_00) to 120_09 (IO_09). The ten circuits 120 (IOs) included in the input/output array 121b (IOAb) are denoted by circuits 120_10 (IO_10) to 120_19 (IO_19).

An expression written in a block representing the circuit 10 in FIG. 19 represents a function of the circuit 10. For example, the circuit 10 expressed as "PLE0* to IO00" is a PSE placed between output nodes of the circuits 110_00 (PLE_00) to 110_09 (PLE_09) and an input node of the circuit 120_00 (IO_00).

The circuits 120_00 (IO_00) to 120_19 (IO_19) are electrically connected to different external terminals. The input/output arrays 121a (IOAa) and 121b (IOAb) have a function of controlling input and output of signals between external terminals of the PLD 100 and the logic arrays 111a (LAa) and 111b (LAb).

The circuit 130 has a function of a clock generator that generates one or more clock signals used in the PLD 100 from a clock signal input from the outside. The circuit 131 has a function of a column driver circuit capable of generating configuration data and supplying it to the wiring DL. The circuit 132 has a function of a row driver circuit capable of generating a write control signal and supplying it to the wirings WLa and WLb and the like. The circuit 133 has a function of controlling the circuits 131 and 132. The circuit 134 has a function of a context controller capable of generating a context data signal and supplying it to the wirings CCSLa and CCSLb and the like.

Note that the wirings DL, WLa, WLb, CCSLa, and CCSLb are not illustrated in FIG. 19.

This embodiment can be implemented in appropriate combination with any of the structures described in the other embodiments.

Embodiment 4

In this embodiment, specific structure examples of the circuit 10 will be described with reference to drawings.

Figure 20A:
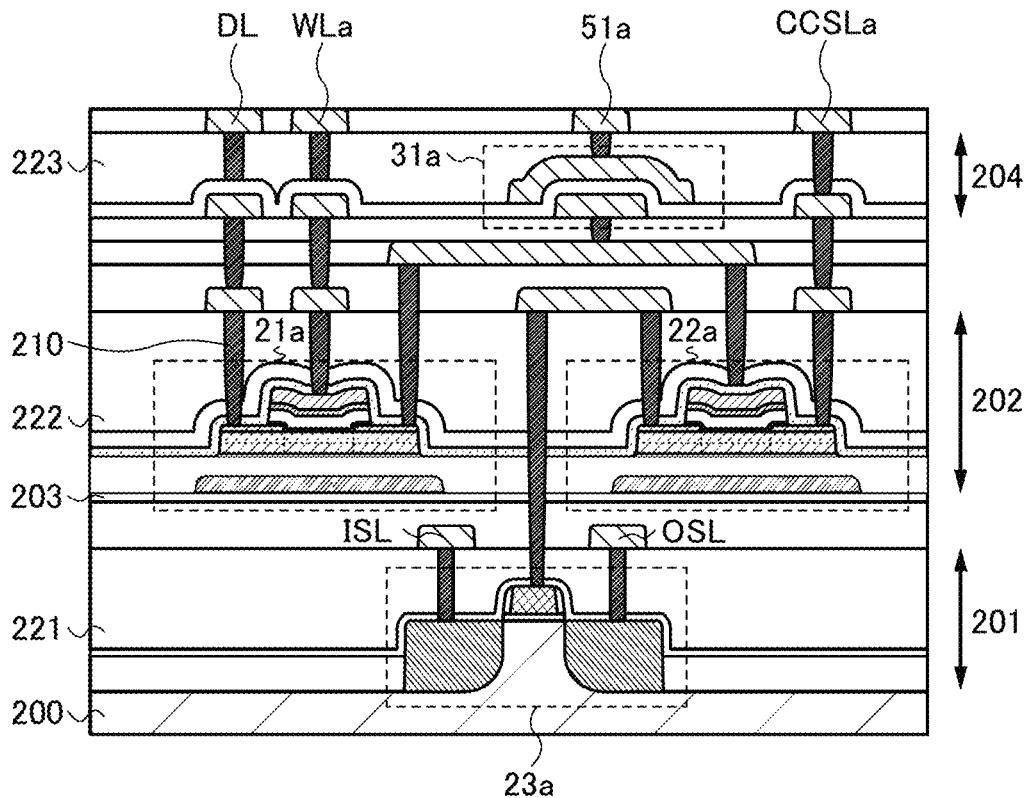
FIGS. 20A and 20B are cross-sectional views illustrating a structure example of a semiconductor device.
Figure 20B:
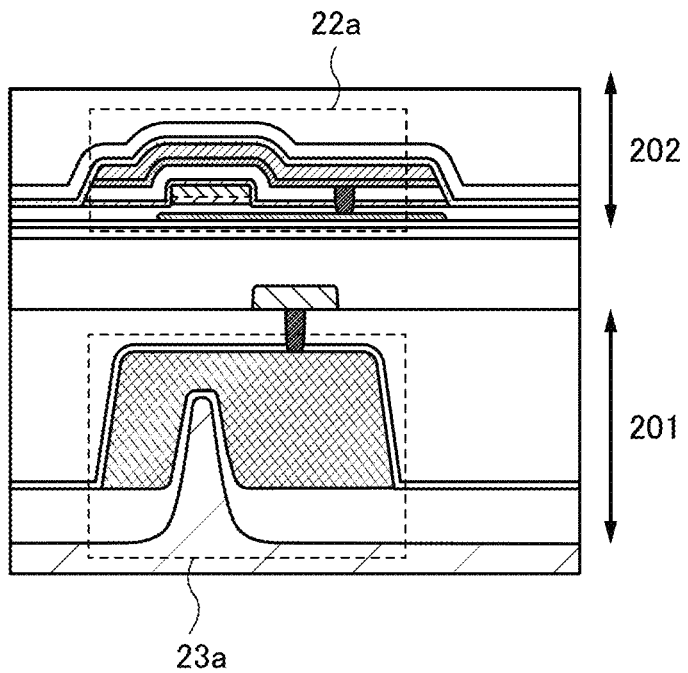

FIG. 20A illustrates an example of a cross section of the semiconductor device in one embodiment of the present invention, and shows a specific connection example of the transistor 21a, the transistor 22a, the transistor 23a, and the capacitor 31a in the circuit 10 with the structure illustrated in FIG. 3. FIG. 20B illustrates an example of a cross section in the channel width direction of the transistors illustrated in FIG. 20A.

Here, the transistors 21a and 22a are OS transistors, and the transistor 23a is a Si transistor.

The circuit 10 is formed on a silicon substrate 200. A layer 201, a layer 202, and a layer 204 are formed on the silicon substrate 200. A Si transistor is formed in the layer 201, an OS transistor in the layer 202, and a capacitor in the layer 204. That is, the transistor 23a is formed in the layer 201, the transistor 21a and the transistor 22a in the layer 202, and the capacitor 31a in the layer 204. With a structure where the OS transistor, the Si transistor, and the capacitor are stacked in this manner, the area of the circuit 10 can be reduced, whereby the semiconductor device of one embodiment of the present invention can be downsized. Moreover, the semiconductor device of one embodiment of the present invention can be more highly integrated.

The wirings and the elements illustrated in FIG. 20A are electrically connected through conductors 210. The elements are electrically connected to each other through the conductors 210.

Although the wiring and contact plugs (the conductors 210) are illustrated as independent components in cross-sectional views in this embodiment, some of them are provided as one component in some cases when they are electrically connected to each other.

In some cases, some of the wirings and the like illustrated in the diagram are not provided, or a wiring, a transistor, or the like that is not illustrated in the diagram is included in each layer. In some cases, a layer that is not illustrated in the diagram is included in the stacked-layer structure, or some of the layers illustrated in the diagram are not included in the stacked-layer structure.

An insulating film functioning as a protective film, an interlayer insulating film, or a planarization film is provided over the components. An insulating film 221 is provided in the layer 201, an insulating film 222 in the layer 202, and an insulating film 223 in the layer 204. As the insulating films 221, 222, and 223, an inorganic insulating film such as a silicon oxide film or a silicon oxynitride film can be used, for example. Alternatively, an organic insulating film such as an acrylic resin film or a polyimide resin film may be used. Top surfaces of the insulating films 221, 222, and 223 are preferably planarized by chemical mechanical polishing (CMP) or the like as necessary.

An insulating film 203 is formed between the layer 201 and the layer 202. The insulating film 203 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Dangling bonds of silicon are terminated with hydrogen in the insulating film provided in the vicinity of the active region of the transistor 23a. Therefore, the hydrogen has an effect of improving the reliability of the transistor 23a. Meanwhile, hydrogen in the insulating films provided in the vicinity of an oxide semiconductor film that is the active layer of the transistors 21a and 22a is one of the factors in generating carriers in the oxide semiconductor film. Thus, the hydrogen might cause reliability degradation of the transistors 21a and 22a. Trapping hydrogen in the layer 201 by the insulating film 203 improves the reliability of the transistor 23a. Moreover, decreasing diffusion of hydrogen from the layer 201 to the layer 202 improves the reliability of the transistors 21a and 22a, which are OS transistors.

Although each of the transistors has a backgate in FIGS. 20A and 20B, it is possible that the transistors do not have a backgate or that only some of the transistors have a backgate. The backgate of the transistor may be electrically connected to its front gate provided opposite to the backgate. Alternatively, different fixed potentials may be supplied to the backgate and the front gate.

Although the layer 204 is stacked over the layer 202 in FIG. 20A, one embodiment of the present invention is not limit to this. For example, the layer 204 may be formed between the layer 201 and the layer 202.

Figure 21A:
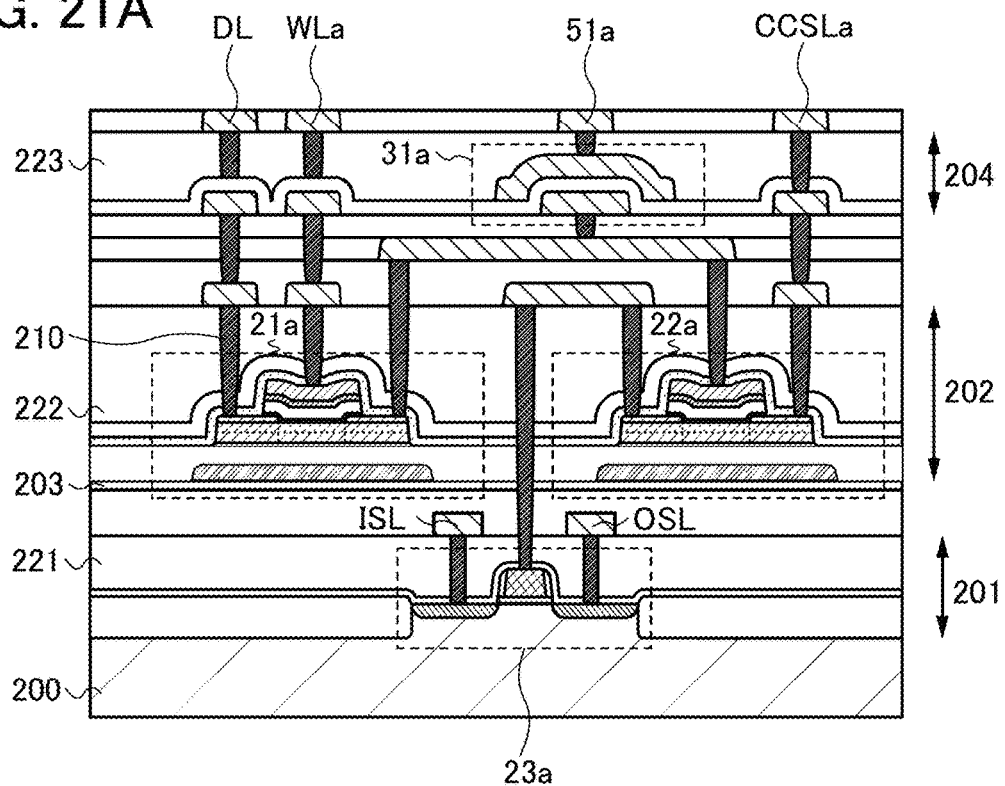
FIGS. 21A and 21B are cross-sectional views each illustrating a structure example of a semiconductor device.
Figure 21B:
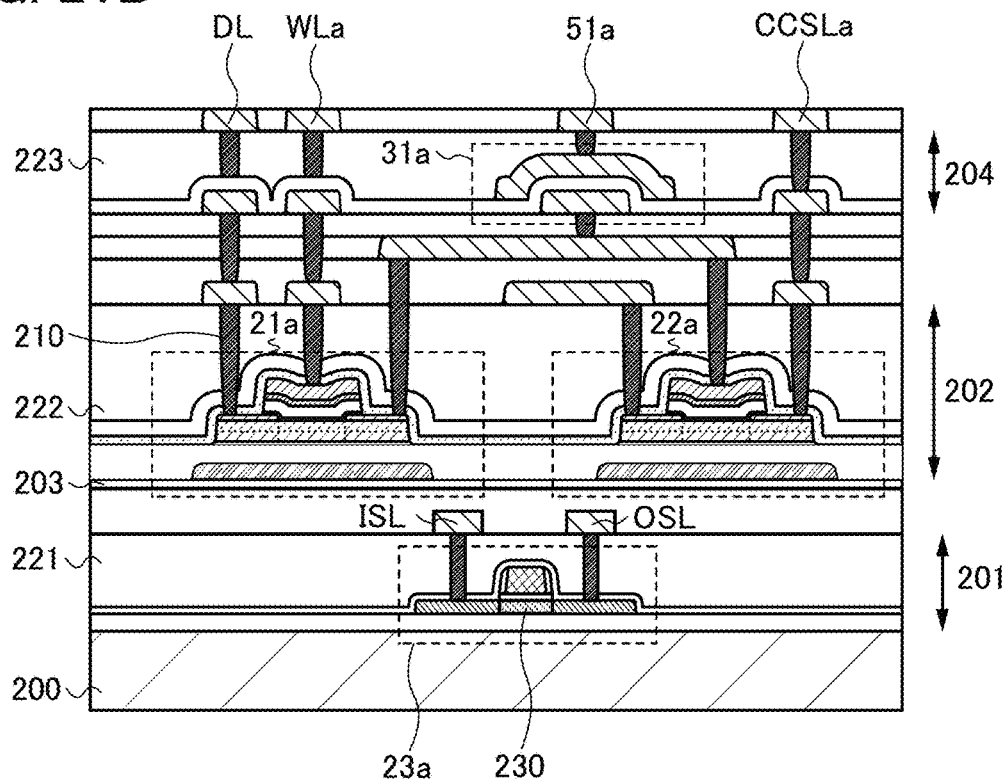

Although the transistor 23a, which is a Si transistor, has a FIN structure in FIGS. 20A and 20B, it may have a planar structure as illustrated in FIG. 21A. Alternatively, as illustrated in FIG. 21B, the transistor 23a may include an active layer 230 formed using a silicon thin film. The active layer 230 can also be formed using polycrystalline silicon or single crystal silicon of a silicon-on-insulator (SOI) structure.

This embodiment can be implemented in appropriate combinations with any of the structures described in the other embodiments.

Embodiment 5

In this embodiment, a transistor containing an oxide semiconductor that can be used in one embodiment of the present invention will be described with reference to drawings. In the drawings in this embodiment, some components are enlarged, reduced in size, or omitted for easy understanding.

Figure 22A:
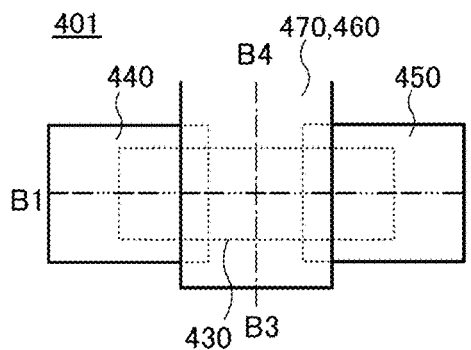
FIGS. 22A to 22F are top views and cross-sectional views of transistors.
Figure 22B:
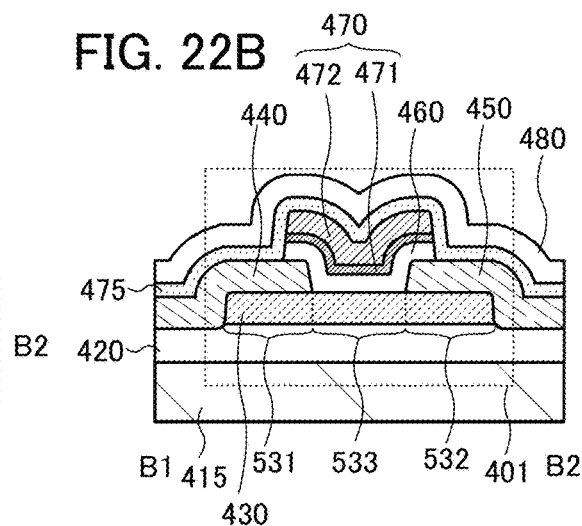
Figure 24A:
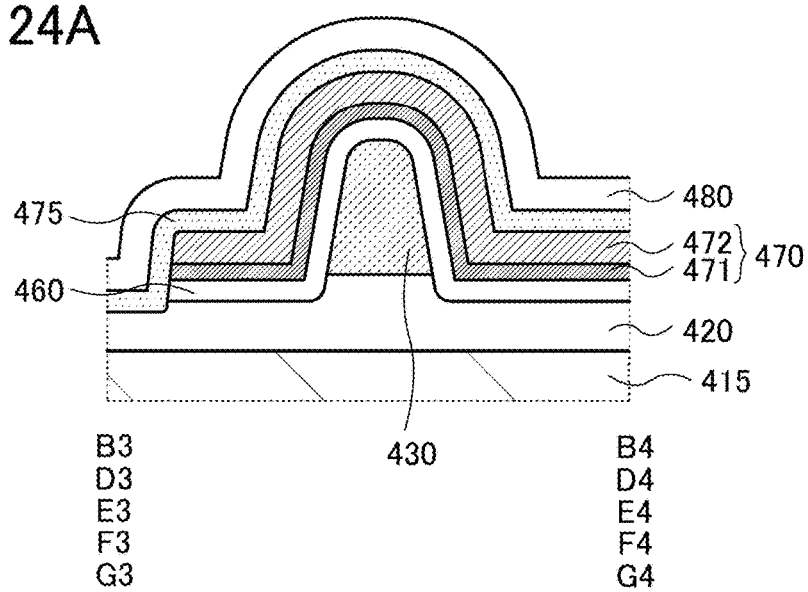
FIGS. 24A to 24D each illustrate a cross section of a transistor in the channel width direction.

FIG. 22A is a top view of a transistor 401 in one embodiment of the present invention. FIG. 22B illustrates a cross section along the dashed-dotted line B1-B2 in FIG. 22A. FIG. 24A illustrates a cross section along the dashed-dotted line B3-B4 in FIG. 22A Note that the direction of the dashed-dotted line B1-B2 is referred to as a channel length direction and the direction of the dashed-dotted line B3-B4 is referred to as a channel width direction in some cases.

The transistor 401 includes a substrate 415, an insulating film 420, an oxide semiconductor film 430, a conductive film 440, a conductive film 450, an insulating film 460, a conductive film 470, an insulating film 475, and an insulating film 480.

The insulating film 420 is in contact with the substrate 415. The oxide semiconductor film 430 is in contact with the insulating film 420. The conductive film 440 and the conductive film 450 are in contact with the insulating film 420 and the oxide semiconductor film 430. The insulating film 460 is in contact with the insulating film 420, the oxide semiconductor film 430, the conductive film 440, and the conductive film 450. The conductive film 470 is in contact with the insulating film 460. The insulating film 475 is in contact with the insulating film 420, the conductive film 440, the conductive film 450, and the conductive film 470. The insulating film 480 is in contact with the insulating film 475.

Here, in the oxide semiconductor film 430, a region in contact with the conductive film 440, a region in contact with the conductive film 450, and a region in contact with the insulating film 460 are referred to as a region 531, a region 532, and a region 533, respectively.

The conductive films 440 and 450 are electrically connected to the oxide semiconductor film 430.

The conductive film 440 can function as a source electrode. The conductive film 450 can function as a drain electrode. The insulating film 460 can function as a gate insulating film. The conductive film 470 can function as a gate electrode.

The region 531, the region 532, and the region 533 illustrated in FIG. 22B can function as a source region, a drain region, and a channel formation region, respectively.

Although each of the conductive films 440 and 450 is shown as a single layer, they may be a stack of two or more layers. Although the conductive film 470 includes two layers of a conductive film 471 and a conductive film 472 in this example, it may be a single layer or a stack of three or more layers. The same applies to other transistors described in this embodiment.

A function of a planarization film may be added to the insulating film 480 as necessary.

Figure 22C:
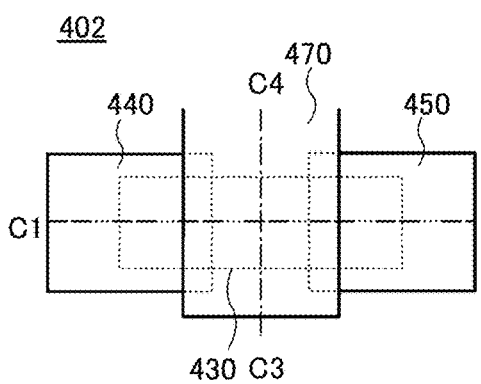
Figure 22D:
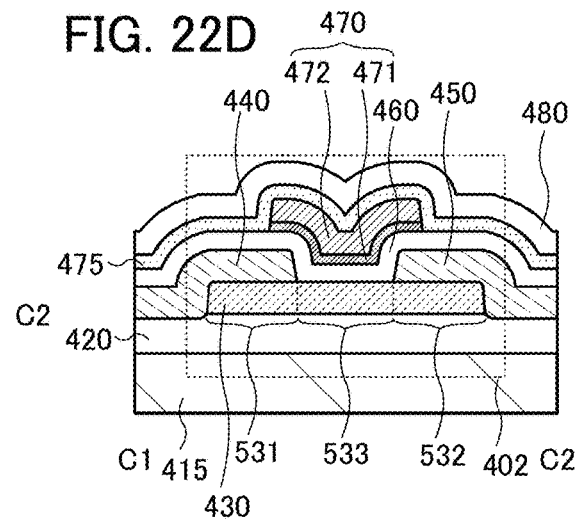
Figure 24B:
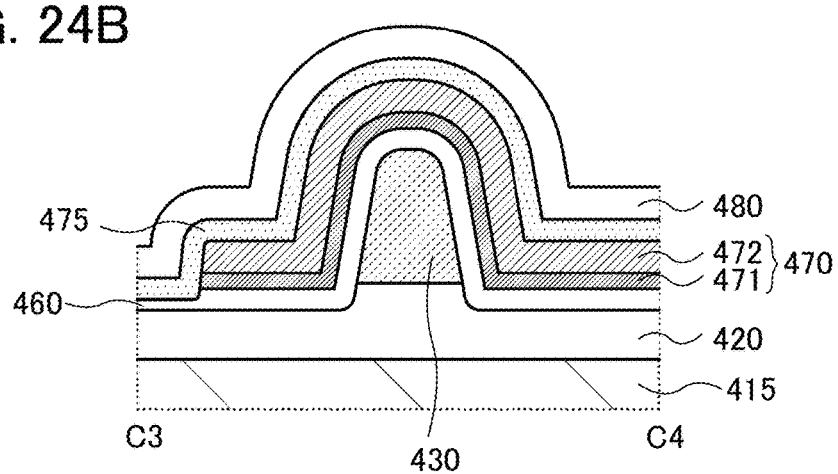

The transistor in one embodiment of the present invention may have a structure illustrated in FIGS. 22C and 22D. FIG. 22C is a top view of a transistor 402. FIG. 22D shows a cross section along the dashed-dotted line C1-C2 in FIG. 22C. FIG. 24B shows a cross section along the dashed-dotted line C3-C4 in FIG. 22C. The direction of the dashed-dotted line C1-C2 is referred to as a channel length direction and the direction of the dashed-dotted line C3-C4 is referred to as a channel width direction in some cases.

The transistor 402 is different from the transistor 401 in that an end portion of the insulating film 460 is not aligned with an end portion of the conductive film 470. In the transistor 402, wide areas of the conductive films 440 and 450 are covered with the insulating film 460 and thus the electric resistance between the conductive film 470 and the conductive films 440 and 450 is high; therefore, the transistor 402 has a feature of low gate leakage current.

The transistors 401 and 402 each have a top-gate structure including a region where the conductive film 470 overlaps the conductive films 440 and 450. To reduce parasitic capacitance, the width of the region in the channel length direction is preferably greater than or equal to 3 nm and less than 300 nm. Since an offset region is not formed in the oxide semiconductor film 430 in this structure, a transistor with a high on-state current can be easily fabricated.

Figure 22E:
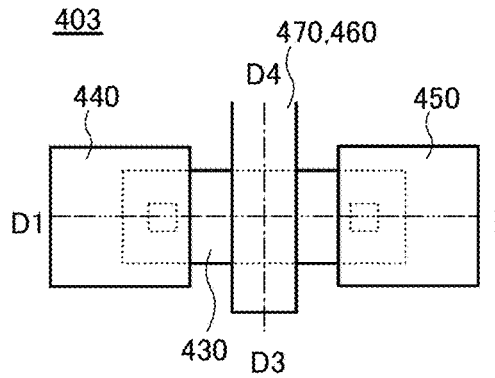
Figure 22F:
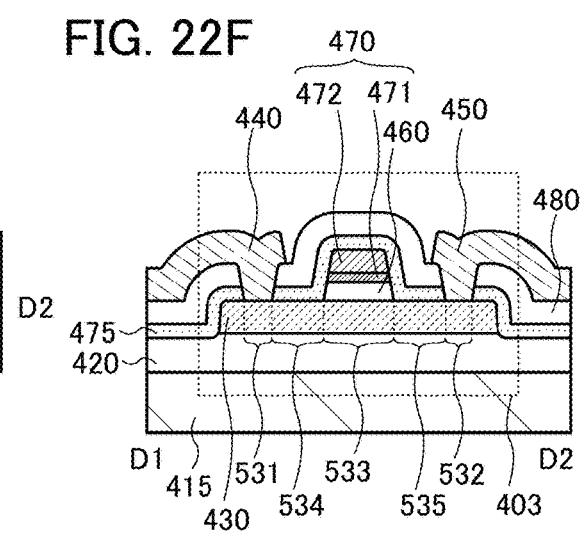

The transistor in one embodiment of the present invention may have a structure illustrated in FIGS. 22E and 22F. FIG. 22E is a top view of a transistor 403. FIG. 22F shows a cross section along the dashed-dotted line D1-D2 in FIG. 22E. FIG. 24A shows a cross section along the dashed-dotted line D3-D4 in FIG. 22E. The direction of the dashed-dotted line D1-D2 is referred to as a channel length direction and the direction of the dashed-dotted line D3-D4 is referred to as a channel width direction in some cases.

In the transistor 403, the insulating film 420 is in contact with the substrate 415; the oxide semiconductor film 430 is in contact with the insulating film 420; the insulating film 460 is in contact with the insulating film 420 and the oxide semiconductor film 430; the conductive film 470 is in contact with the insulating film 460; the insulating film 475 is in contact with the insulating film 420, the oxide semiconductor film 430, and the conductive film 470; the insulating film 480 is in contact with the insulating film 475; and the conductive film 440 and the conductive film 450 are in contact with the oxide semiconductor film 430 and the insulating film 480.

Openings are formed in the insulating films 475 and 480, and the conductive films 440 and 450 are electrically connected to the oxide semiconductor film 430 through the openings.

The transistor 403 may also include, for example, an insulating film (planarization film) in contact with the conductive films 440 and 450 and the insulating film 480 as necessary.

In the oxide semiconductor film 430, a region that is in contact with the insulating film 475 and is sandwiched between the region 531 and the region 533 is referred to as a region 534, and a region that is in contact with the insulating film 475 and is sandwiched between the region 532 and the region 533 is referred to as a region 535.

Figure 23A:
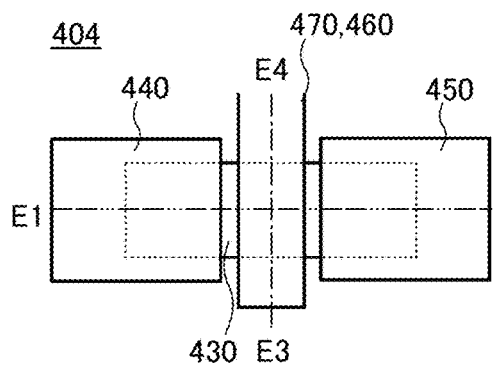
FIGS. 23A to 23F are top views and cross-sectional views of transistors.
Figure 23B:
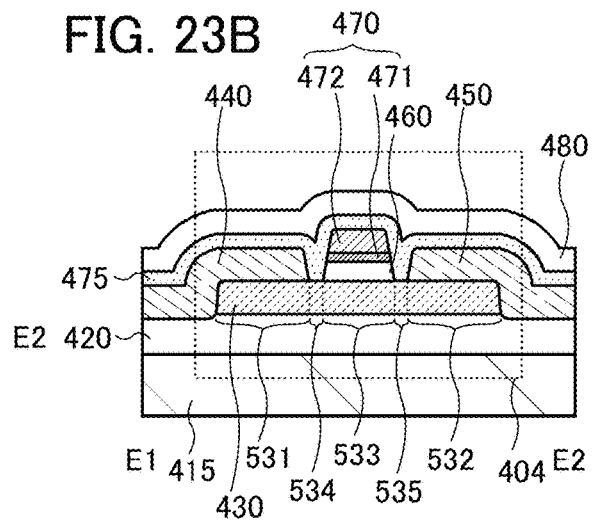

The transistor in one embodiment of the present invention may have a structure illustrated in FIGS. 23A and 23B. FIG. 23A is a top view of a transistor 404. FIG. 23B shows a cross section along the dashed-dotted line E1-E2 in FIG. 23A. FIG. 24A shows a cross section along the dashed-dotted line E3-E4 in FIG. 23A. The direction of the dashed-dotted line E1-E2 is referred to as a channel length direction and the direction of the dashed-dotted line E3-E4 is referred to as a channel width direction in some cases.

In the transistor 404, the insulating film 420 is in contact with the substrate 415; the oxide semiconductor film 430 is in contact with the insulating film 420; the conductive film 440 and the conductive film 450 are in contact with the insulating film 420 and the oxide semiconductor film 430; the insulating film 460 is in contact with the insulating film 420 and the oxide semiconductor film 430; the conductive film 470 is in contact with the insulating film 460; the insulating film 475 is in contact with the insulating film 420, the oxide semiconductor film 430, the conductive film 440, the conductive film 450, and the conductive film 470; and the insulating film 480 is in contact with the insulating film 475.

The transistor 404 is different from the transistor 403 in that the conductive films 440 and 450 are in contact with the oxide semiconductor film 430 so as to cover its end portions.

The transistors 403 and 404 each have a self-aligned structure that does not include a region where the conductive film 470 overlaps the conductive films 440 and 450. Since the parasitic capacitance between a gate and a source/drain is extremely low in a transistor with a self-aligned structure, the transistor is suitable for applications that require high-speed operation.

Figure 23C:
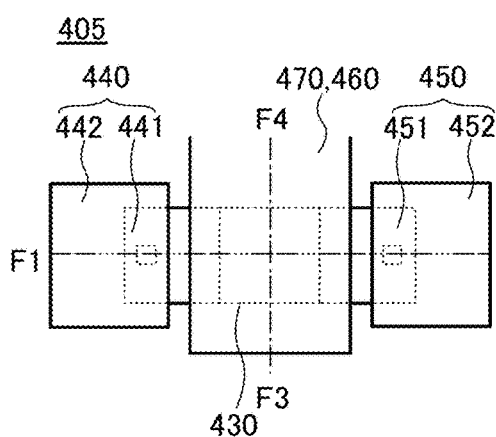
Figure 23D:
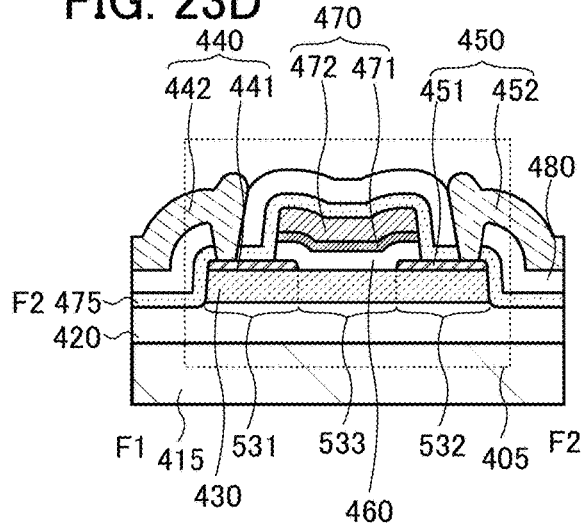

The transistor in one embodiment of the present invention may have a structure illustrated in FIGS. 23C and 23D. FIG. 23C is a top view of a transistor 405. FIG. 23D shows a cross section along the dashed-dotted line F1-F2 in FIG. 23C. FIG. 24A shows a cross section along the dashed-dotted line F3-F4 in FIG. 23C. The direction of the dashed-dotted line F1-F2 is referred to as a channel length direction and the direction of the dashed-dotted line F3-F4 is referred to as a channel width direction in some cases.

In the transistor 405, the conductive film 440 includes two layers of a conductive film 441 and a conductive film 442, and the conductive film 450 includes two layers of a conductive film 451 and a conductive film 452. The insulating film 420 is in contact with the substrate 415. The oxide semiconductor film 430 is in contact with the insulating film 420. The conductive film 441 and the conductive film 451 are in contact with the oxide semiconductor film 430. The insulating film 460 is in contact with the insulating film 420, the oxide semiconductor film 430, the conductive film 441, and the conductive film 451. The conductive film 470 is in contact with the insulating film 460. The insulating film 475 is in contact with the insulating film 420, the conductive film 441, the conductive film 451, and the conductive film 470. The insulating film 480 is in contact with the insulating film 475. The conductive film 442 is in contact with the conductive film 441 and the insulating film 480. The conductive film 452 is in contact with the conductive film 451 and the insulating film 480.

Here, the conductive films 441 and 451 are in contact with a top surface of the oxide semiconductor film 430 and are not in contact with a side surface of the oxide semiconductor film 430.

The transistor 405 may also include, for example, an insulating film in contact with the conductive films 442 and 452 and the insulating film 480 as necessary.

The conductive film 441 and the conductive film 451 are electrically connected to the oxide semiconductor film 430. The conductive film 442 is electrically connected to the conductive film 441, and the conductive film 452 is electrically connected to the conductive film 451.

In the oxide semiconductor film 430, a region overlapped by the conductive film 441 is the region 531, which can function as a source region, and a region overlapped by the conductive film 451 is the region 532, which can function as a drain region.

Figure 23E:
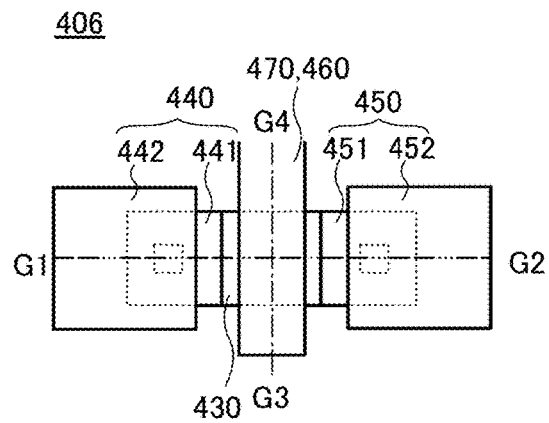
Figure 23F:
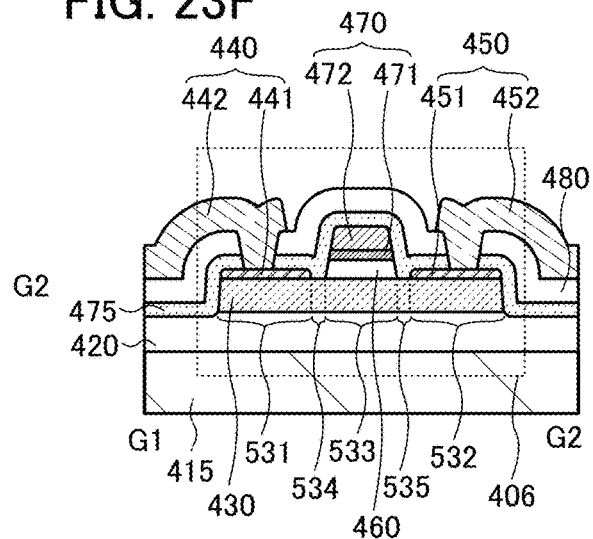

The transistor in one embodiment of the present invention may have a structure illustrated in FIGS. 23E and 23F. FIG. 23E is a top view of a transistor 406. FIG. 23F shows a cross section along the dashed-dotted line G1-G2 in FIG. 23E. FIG. 24A shows a cross section along the dashed-dotted line G3-G4 in FIG. 23E. The direction of the dashed-dotted line G1-G2 is referred to as a channel length direction and the direction of the dashed-dotted line G3-G4 is referred to as a channel width direction in some cases.

The transistor 406 is different from the transistor 403 in that the conductive film 440 includes two layers of the conductive films 441 and 442, and the conductive film 450 includes two layers of the conductive films 451 and 452.

In the structures of the transistors 405 and 406, the conductive films 440 and 450 are not in contact with the insulating film 420. These structures make the insulating film 420 less likely to be deprived of oxygen by the conductive films 440 and 450, and facilitate oxygen supply from the insulating film 420 to the oxide semiconductor film 430.

An impurity for forming oxygen vacancies to increase conductivity may be added to the regions 534 and 535 in the transistor 403, the transistor 404, and the transistor 406. As an impurity for forming oxygen vacancies in an oxide semiconductor film, one or more of the following can be used, for example: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor film, a bond between a metal element and oxygen in the oxide semiconductor film is cut, whereby an oxygen vacancy is formed. Interaction between an oxygen vacancy in the oxide semiconductor film and hydrogen that remains in the oxide semiconductor film or is added to the oxide semiconductor film later can increase the conductivity of the oxide semiconductor film.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor that has become a conductor. Note that an oxide conductor has a light-transmitting property like an oxide semiconductor.

An oxide conductor is a degenerated semiconductor and it is suggested that the conduction band edge equals or substantially equals the Fermi level. For that reason, an ohmic contact is made between an oxide conductor film and conductive films that can function as a source and a drain; thus, the contact resistance between the oxide conductor film and the conductive films can be reduced.

Figure 25A:
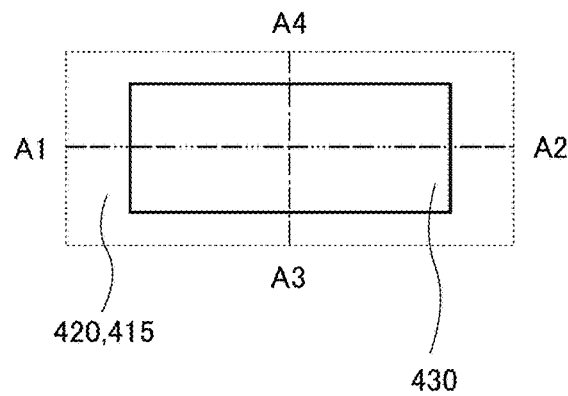
FIGS. 25A to 25E are a top view and cross-sectional views each illustrating a semiconductor layer.
Figure 25B:
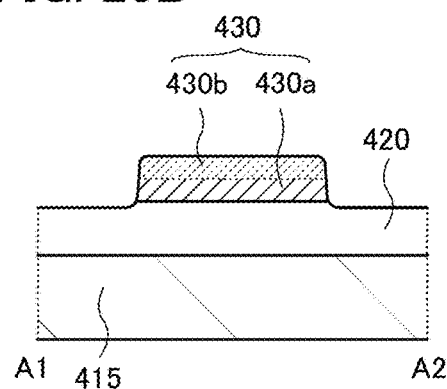
Figure 25D:
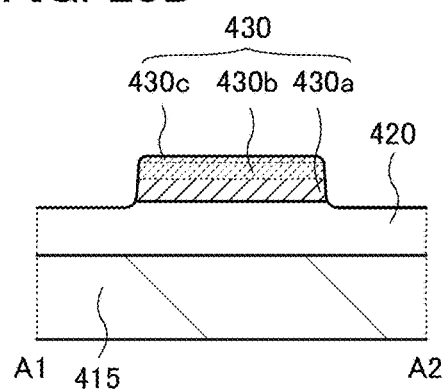
Figure 25C:
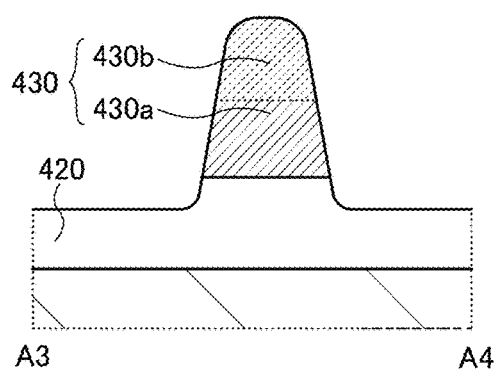
Figure 25E:
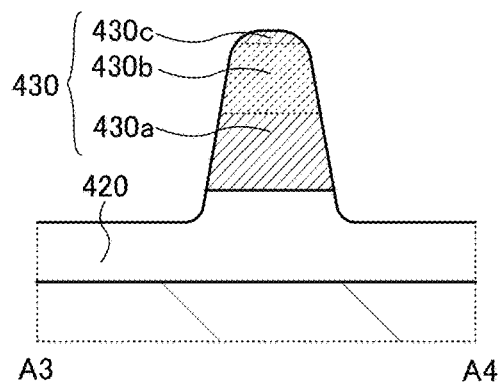

Although the transistors 401 to 406 illustrated in FIGS. 22A to 22F, FIGS. 23A to 23F, and FIGS. 24A and 24B are examples in which the oxide semiconductor film 430 is a single layer, the oxide semiconductor film 430 may be a stacked layer. FIG. 25A is a top view of the oxide semiconductor film 430, and FIGS. 25B and 25C are cross-sectional views of the oxide semiconductor film 430 having a two-layer structure of an oxide semiconductor film 430a and an oxide semiconductor film 430b. FIGS. 25D and 25E are cross-sectional views of the oxide semiconductor film 430 having a three-layer structure of the oxide semiconductor film 430a, the oxide semiconductor film 430b, and an oxide semiconductor film 430c.

The oxide semiconductor films 430a and 430c can also be referred to as insulating films because no channel region is formed therein.

Oxide semiconductor films with different compositions, for example, can be used as the oxide semiconductor films 430a, 430b, and 430c.

The oxide semiconductor film 430 in the transistors 401 to 406 can be replaced with the oxide semiconductor film 430 illustrated in FIGS. 25B and 25C or FIGS. 25D and 25E.

Figure 26A:
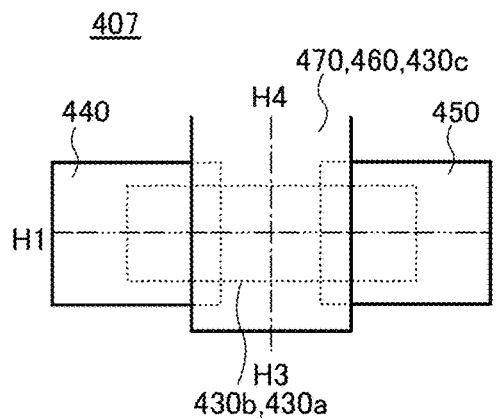
FIGS. 26A to 26F are top views of transistors and cross-sectional views thereof in the channel length direction.
Figure 26B:
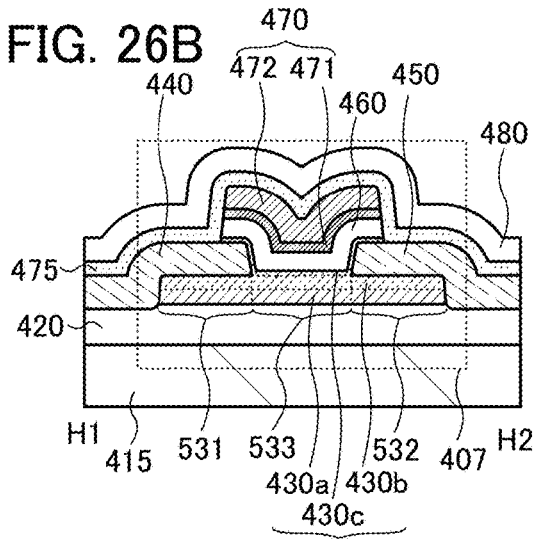
Figure 26C:
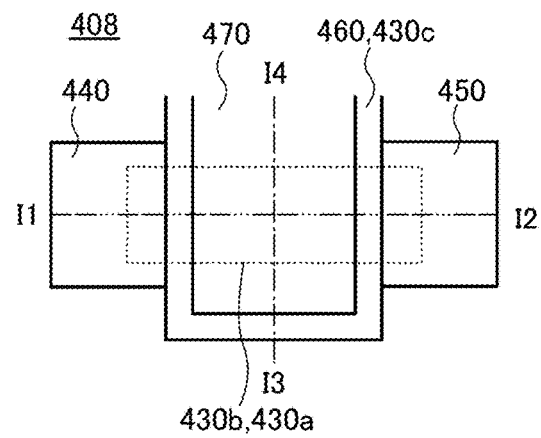
Figure 26D:
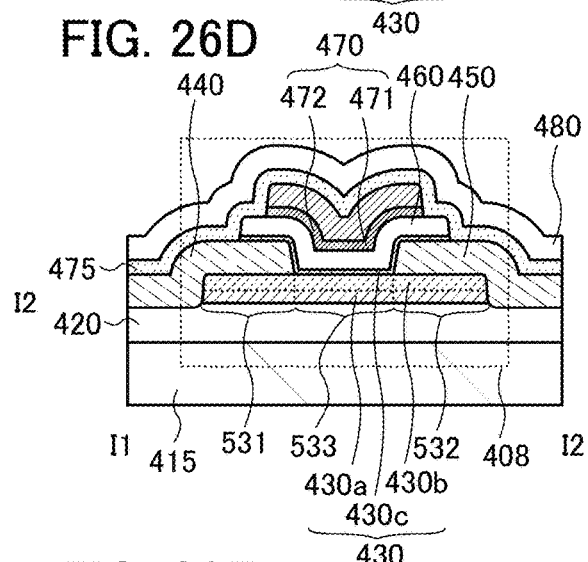
Figure 26E:
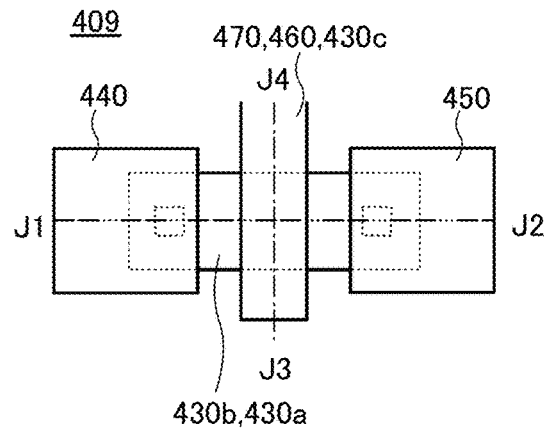
Figure 26F:
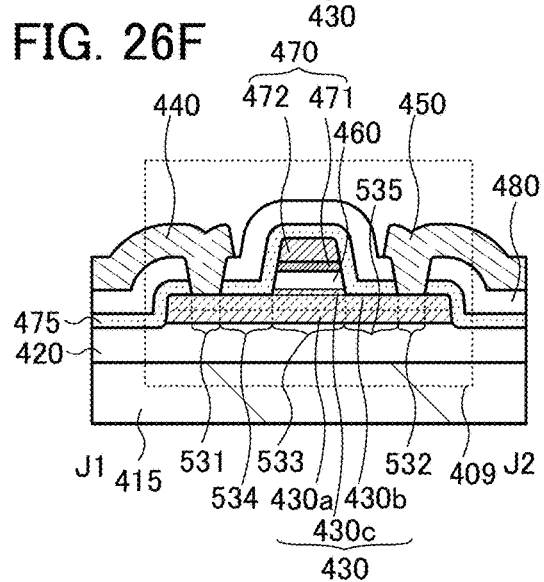
Figure 27A:
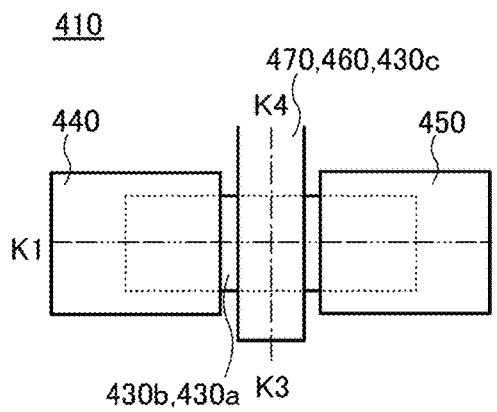
FIGS. 27A to 27F are top views of transistors and cross-sectional views thereof in the channel length direction.
Figure 27B:
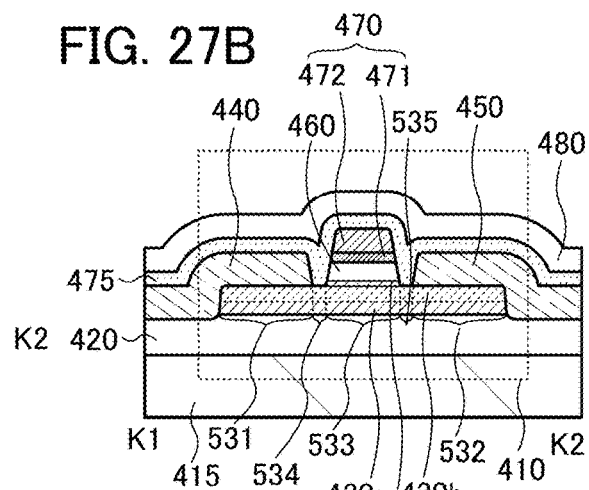
Figure 27C:
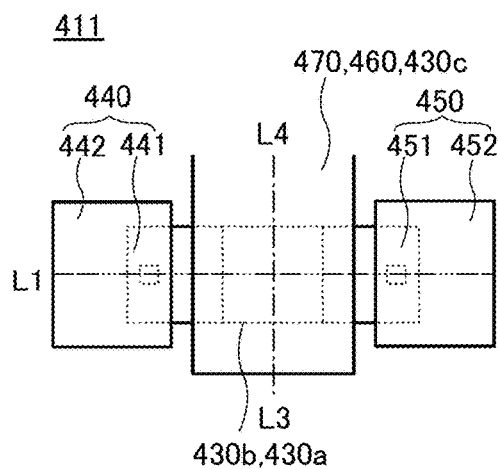
Figure 27D:
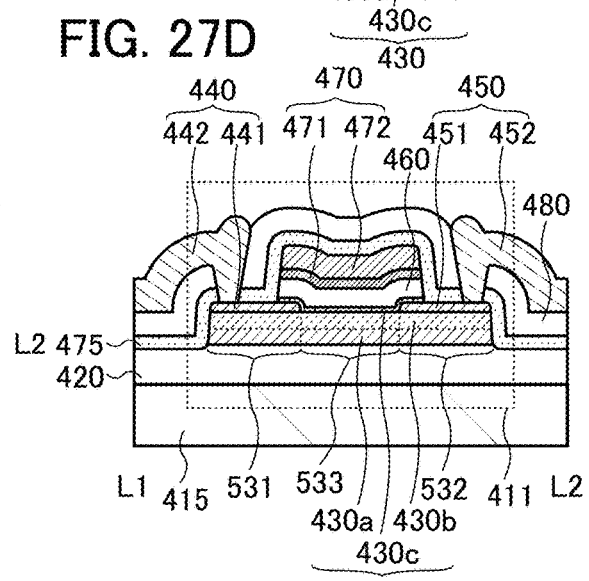
Figure 27E:
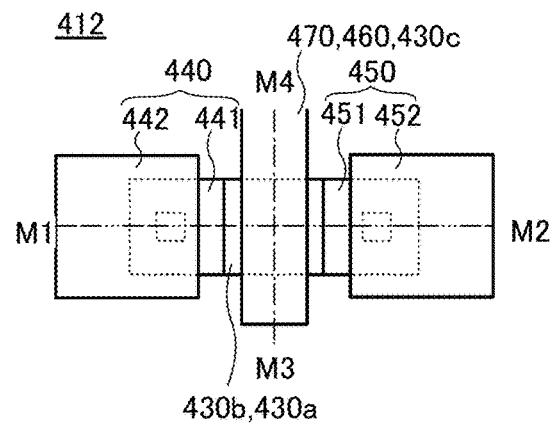
Figure 27F:
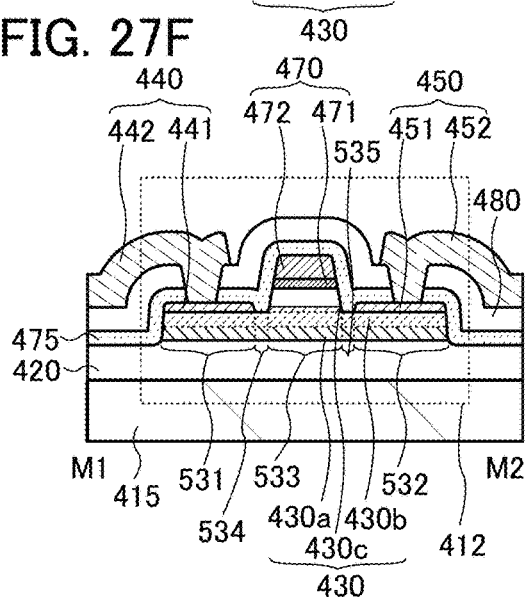
Figure 28A:
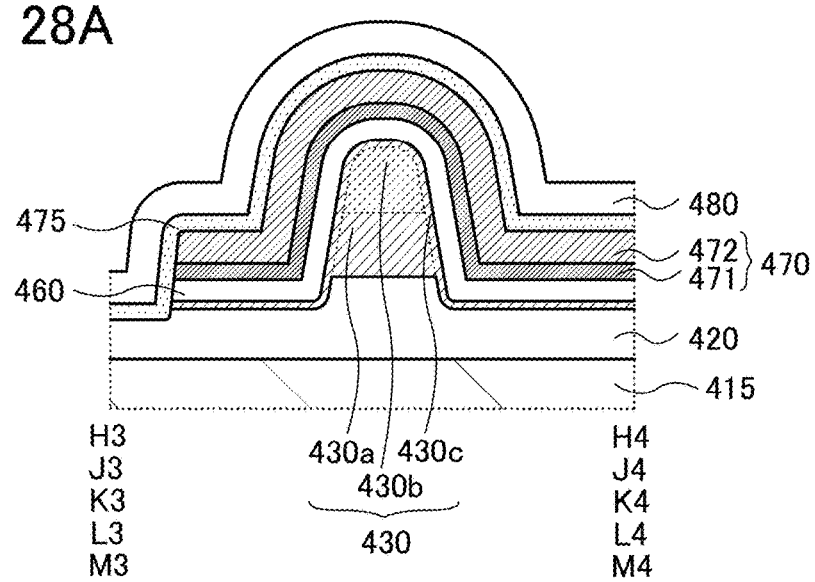
FIGS. 28A to 28D each illustrate a cross section of a transistor in the channel width direction.
Figure 28B:
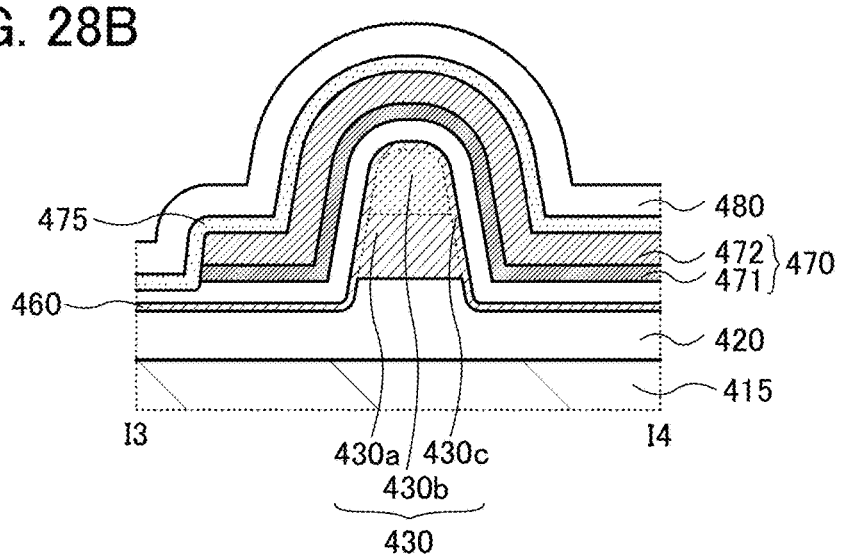

The transistor in one embodiment of the present invention may have any of structures illustrated in FIGS. 26A to 26F, FIGS. 27A to 27F, and FIGS. 28A to 28D. FIGS. 26A, 26C, and 26E and FIGS. 27A, 27C, and 27E are top views of transistors 407, 408, 409, 410, 411, and 412, respectively. FIG. 26B shows a cross section along the dashed-dotted line H1-H2 in FIG. 26A. FIG. 26D shows a cross section along the dashed-dotted line I1-I2 in FIG. 26C. FIG. 26F shows a cross section along the dashed-dotted line J1-J2 in FIG. 26E. FIG. 27B shows a cross section along the dashed-dotted line K1-K2 in FIG. 27A. FIG. 27D shows a cross section along the dashed-dotted line L1-L2 in FIG. 27C. FIG. 27F shows a cross section along the dashed-dotted line M1-M2 in FIG. 26E. FIG. 28A shows a cross section along the dashed-dotted line H3-H4 in FIG. 26A, the dashed-dotted line J3-J4 in FIG. 26E, the dashed-dotted line K3-K4 in FIG. 27A, the dashed-dotted line L3-L4 in FIG. 27C, and the dashed-dotted line M3-M4 in FIG. 27E. FIG. 28B shows a cross section along the dashed-dotted line I3-I4 in FIG. 26C. The direction of the dashed-dotted lines H1-H2 to M1-M2 may be referred to as a channel length direction, and the direction of the dashed-dotted lines H3-H4 to M3-M4 may be referred to as a channel width direction.

The transistors 407 and 408 each have the same structure as the transistors 401 and 402 except that the oxide semiconductor film 430 includes two layers (the oxide semiconductor films 430a and 430b) in the regions 531 and 532, that the oxide semiconductor film 430 includes three layers (the oxide semiconductor films 430a to 430c) in the region 533, and that part of the oxide semiconductor film (the oxide semiconductor film 430c) exists between the insulating film 460 and the conductive films 440 and 450.

The transistors 409, 410, and 412 each have the same structure as the transistors 403, 404, and 406 except that the oxide semiconductor film 430 includes two layers (the oxide semiconductor films 430a and 430b) in the regions 531, 532, 534, and 535 and that the oxide semiconductor film 430 includes three layers (the oxide semiconductor films 430a to 430c) in the region 533.

The transistor 411 has the same structure as the transistor 405 except that the oxide semiconductor film 430 includes two layers (the oxide semiconductor films 430a and 430b) in the regions 531 and 532, that the oxide semiconductor film 430 includes three layers (the oxide semiconductor films 430a to 430c) in the region 533, and that part of the oxide semiconductor film (the oxide semiconductor film 430c) exists between the insulating film 460 and the conductive films 441 and 451.

Figure 24C:
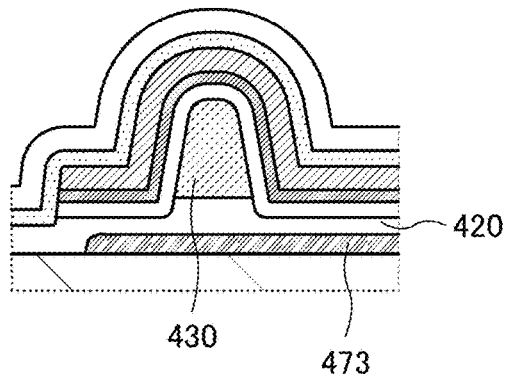
Figure 28C:
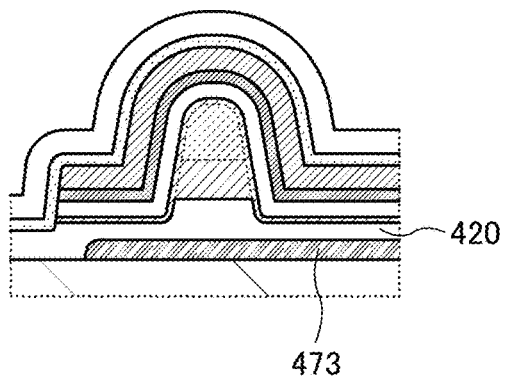

The transistor in one embodiment of the present invention may include a conductive film 473 between the oxide semiconductor film 430 and the substrate 415 as shown in cross-sectional views in the channel length directions of the transistors 401 to 412 in FIGS. 29A to 29F and FIGS. 30A to 30F, the cross-sectional view in the channel width direction of the transistors 401 to 406 in FIG. 24C, and the cross-sectional view in the channel width direction of the transistors 407 to 412 in FIG. 28C. The conductive film 473 is used as a second gate electrode (also referred to as backgate), whereby the channel formation region in the oxide semiconductor film 430 is electrically surrounded by the conductive films 470 and 473. Such a transistor structure is referred to as a surrounded channel (s-channel) structure. This structure can increase the on-state current and can control the threshold voltage. In the cross-sectional views in FIGS. 29A to 29F and FIGS. 30A to 30F, the width of the conductive film 473 may be smaller than that of the oxide semiconductor film 430. Moreover, the width of the conductive film 473 may be smaller than that of the conductive film 470.

Figure 24D:
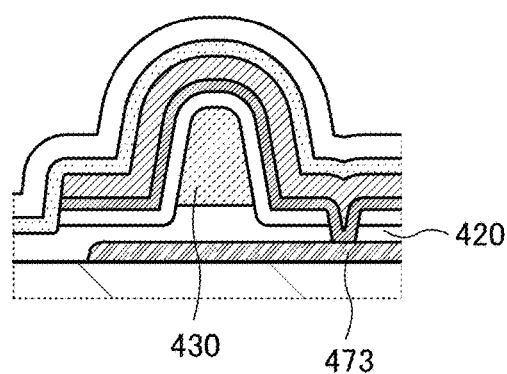
Figure 28D:
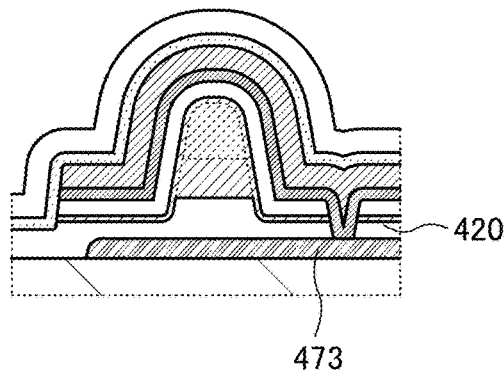
Figure 30A:
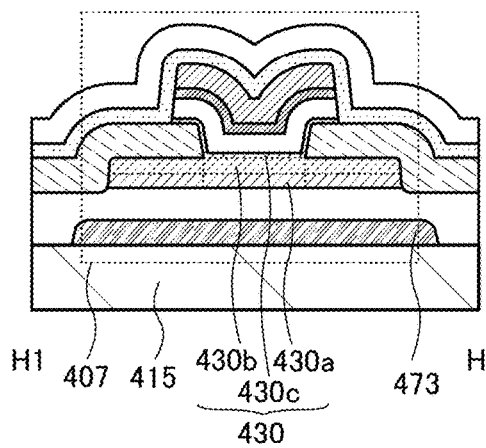
FIGS. 30A to 30F each illustrate a cross section of a transistor in the channel length direction.
Figure 30B:
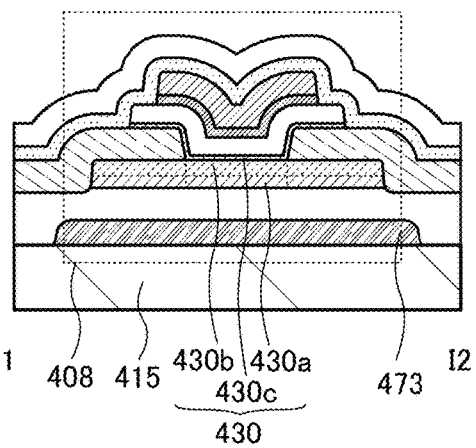
Figure 30C:
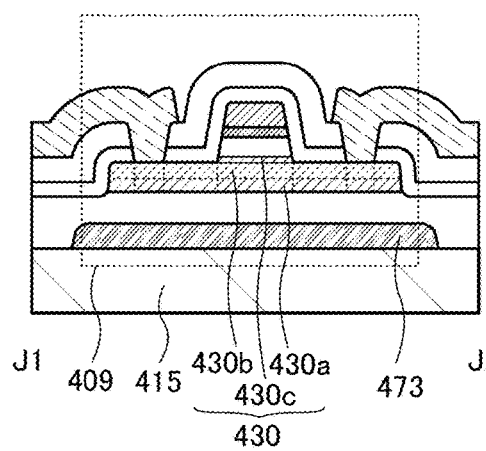
Figure 30D:
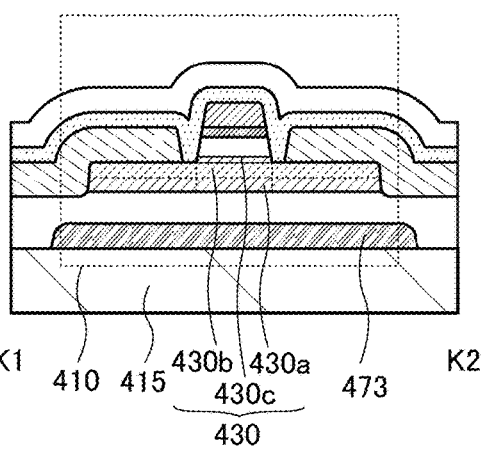
Figure 30E:
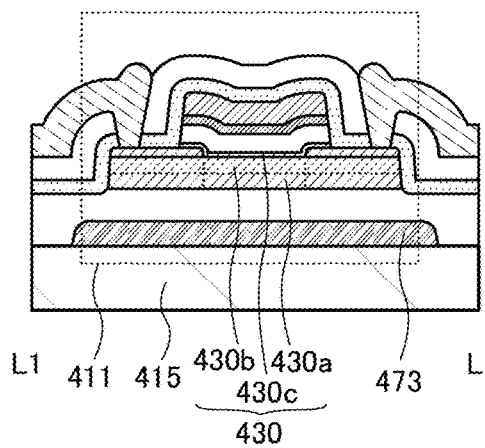
Figure 30F:
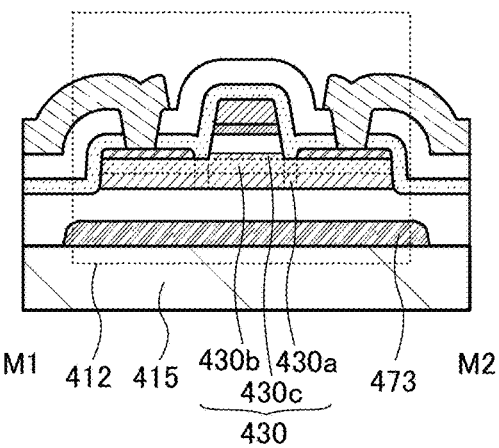

In order to increase the on-state current, for example, the conductive films 470 and 473 are made to have the same potential, and the transistor is driven as a double-gate transistor. In order to control the threshold voltage, the conductive film 473 is supplied with a constant potential that is different from a potential supplied to the conductive film 470. To set the conductive films 470 and 473 at the same potential, for example, the conductive films 470 and 473 may be electrically connected to each other through a contact hole as illustrated in FIG. 24D and FIG. 28D.

Figure 31A:
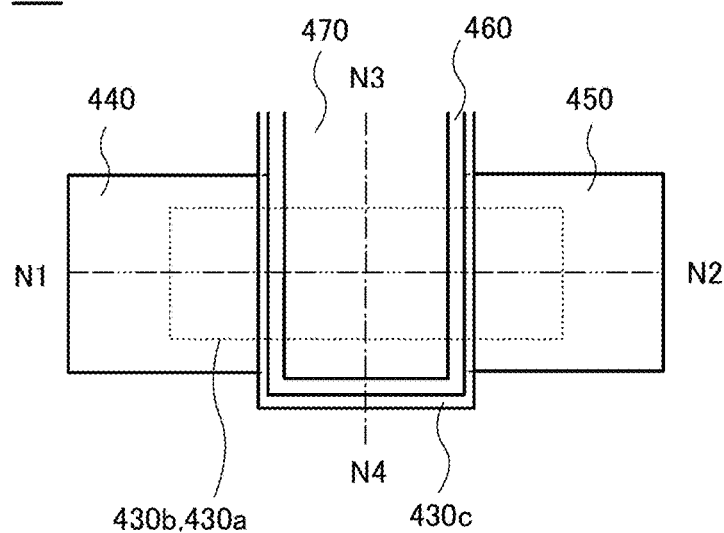
FIGS. 31A to 31C are a top view and cross-sectional views of a transistor.
Figure 31B:
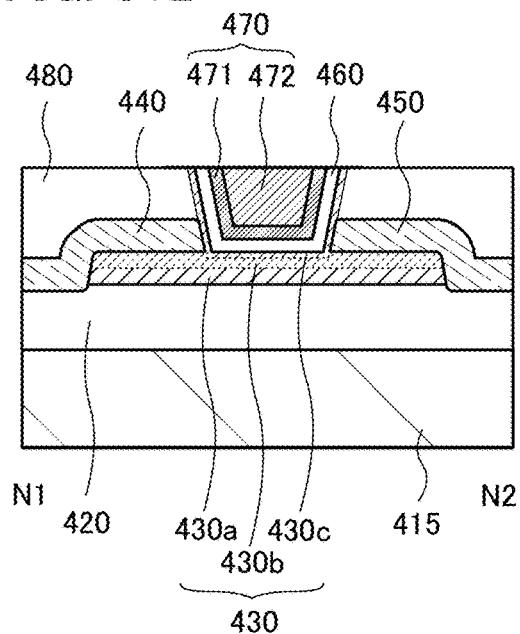
Figure 31C:
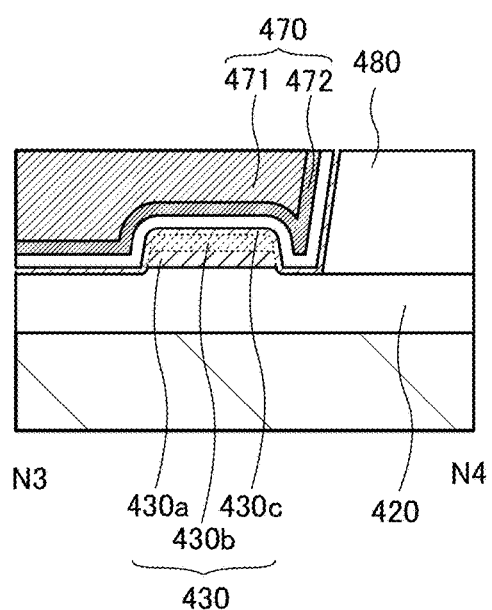

The transistor in one embodiment of the present invention can have a structure illustrated in FIGS. 31A to 31C. FIG. 31A is a top view of a transistor 413. FIG. 31B is a cross-sectional view along the dashed-dotted line N1-N2 in FIG. 31A. FIG. 31C is a cross-sectional view along the dashed-dotted line N3-N4 in FIG. 31A. Note that some components are not illustrated in the top view of FIG. 31A for simplification.

In the transistor 413, the insulating film 420 is in contact with the substrate 415; the oxide semiconductor film 430 (the oxide semiconductor films 430a to 430c) is in contact with the insulating film 420; the conductive film 440 and the conductive film 450 are in contact with the oxide semiconductor film 430b; the insulating film 460 is in contact with the oxide semiconductor film 430c; the conductive film 470 is in contact with the insulating film 460; and the insulating film 480 is in contact with the insulating film 420, the conductive film 440, and the conductive film 450. Note that the oxide semiconductor film 430c, the insulating film 460, and the conductive film 470 are provided in an opening that is provided in the insulating film 480 and reaches the oxide semiconductor film 430b.

In the transistor 413, a region where the conductive film 470 overlaps the conductive film 440 or the conductive film 450 is smaller than that in any other transistors described above; thus, the parasitic capacitance can be reduced in the transistor 413. Consequently, the transistor 413 is suitable for a component of a circuit that requires high-speed operation. Although not always necessary, the transistor 413 is preferably subjected to a chemical mechanical polishing (CMP) method or the like to have a flat top surface as illustrated in FIGS. 31B and 31C.

Figure 32A:
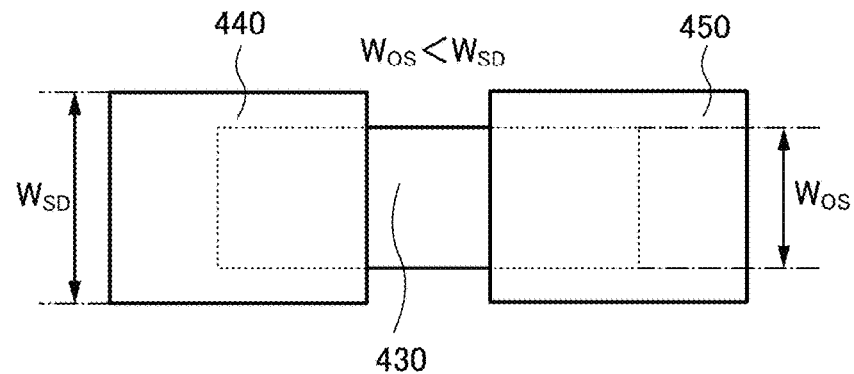
FIGS. 32A to 32C are top views each illustrating a transistor.
Figure 32B:
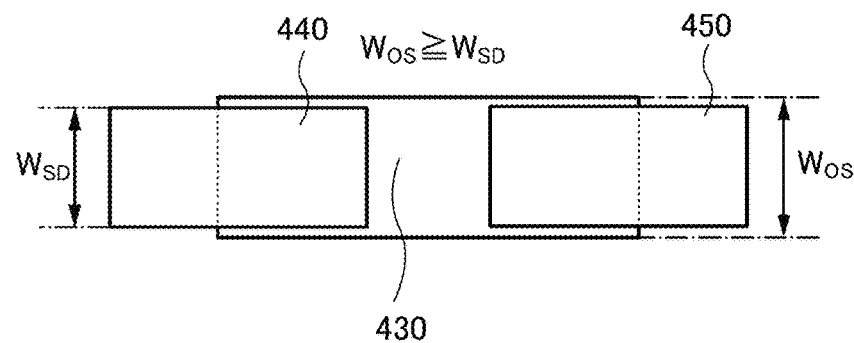
Figure 32C:
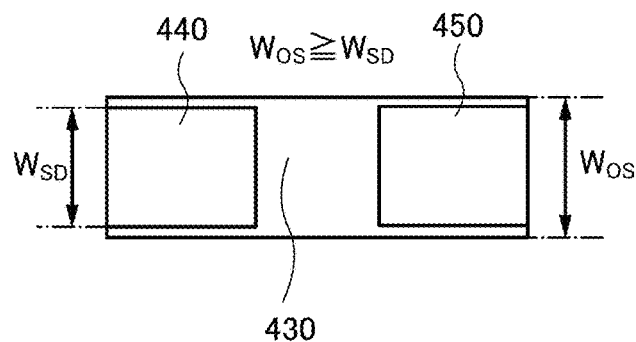

In the transistor in one embodiment of the present invention, the width ($W_{SD}$) of each of the conductive films 440 and 450 may be larger than the width ($W_{OS}$) of the oxide semiconductor film 430 as illustrated in a top view in FIG. 32A or smaller than $W_{OS}$ as illustrated in a top view in FIG. 32B. When $W_{OS} \geq W_{SD}$ is satisfied ($W_{SD}$ is smaller than or equal to $W_{OS}$), a gate electric field is easily applied to the entire oxide semiconductor film 430, resulting in improved electrical characteristics of the transistor. As illustrated in FIG. 32C, the conductive films 440 and 450 may be formed only in regions overlapping the oxide semiconductor film 430.

Note that FIGS. 32A to 32C only illustrate the oxide semiconductor film 430, the conductive film 440, and the conductive film 450.

In the transistor including the oxide semiconductor films 430a and 430b and the transistor including the oxide semiconductor films 430a to 430c, selecting appropriate materials for the two or three layers included in the oxide semiconductor film 430 makes current flow through the oxide semiconductor film 430b. The current flowing through the oxide semiconductor film 430b is hardly influenced by interface scattering, leading to a high on-state current. Thus, increasing the thickness of the oxide semiconductor film 430b improves the on-state current in some cases.

A semiconductor device including a transistor with any of the above structures can have favorable electrical characteristics.

The structure described in this embodiment can be used in appropriate combination with the structure described in any of the other embodiments.

Embodiment 6

In this embodiment, the components of the transistors shown in Embodiment 5 will be described in detail.
<Substrate>

Examples of the substrate 415 include a silicon substrate, a germanium substrate, a silicon germanium substrate, a silicon carbide substrate, a gallium arsenide substrate, an aluminum gallium arsenide substrate, an indium phosphide substrate, a gallium nitride substrate, a glass substrate, a quartz substrate, a semiconductor substrate, an organic semiconductor substrate, a ceramic substrate, and a metal substrate with an insulated surface. Other examples are a silicon substrate provided with a transistor and/or a photodiode; and a silicon substrate over which an insulating film, a wiring, a conductor functioning as a contact plug, and the like are provided together with a transistor and/or a photodiode. For example, when a p-ch transistor is formed on a silicon substrate, a silicon substrate with n$^-$-type conductivity is preferably used. Alternatively, an SOI substrate including an n$^-$-type or i-type silicon layer may be used, for instance. Moreover, when a p-ch transistor is formed on a silicon substrate, a surface of the silicon substrate where the transistor is formed preferably has a (110) plane orientation, in which case the mobility can be increased.
<Base Insulating Film>

The insulating film 420 functioning as a base insulating film can serve to prevent diffusion of impurities from a component of the substrate 415 and supply oxygen to the oxide semiconductor film 430. For this reason, the insulating film 420 preferably contains oxygen and more preferably has an oxygen content higher than that in the stoichiometric composition. For example, the insulating film 420 is a film in which the amount of released oxygen when converted into oxygen atoms is preferably greater than or equal to $1.0 \times 10^{19}$ atoms/cm$^3$ in TDS analysis. In the TDS analysis, heat treatment is performed such that the film surface temperature ranges from 100° C. to 700° C., preferably from 100° C. to 500° C. When the substrate 415 is provided with another device, the insulating film 420 also functions as an interlayer insulating film. In that case, the insulating film 420 is preferably subjected to planarization treatment such as CMP treatment so as to have a flat surface.

For example, the insulating film 420 can be formed using an oxide insulator such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride insulator such as silicon nitride, silicon nitride oxide, aluminum nitride, or aluminum nitride oxide; or a mixed material of any of these. The insulating film 420 may be a stack containing any of the above materials.

<Oxide Semiconductor Film>

The oxide semiconductor film 430 can have a three-layer structure in which the oxide semiconductor films 430a, 430b, and 430c are stacked in this order from the insulating film 420 side.

Note that when the oxide semiconductor film 430 is a single layer, a layer corresponding to the oxide semiconductor film 430b described in this embodiment is used.

In the case of employing a two-layer structure, the oxide semiconductor film 430 can be a stack in which a layer corresponding to the oxide semiconductor film 430a and a layer corresponding to the oxide semiconductor film 430b are stacked in this order from the insulating film 420 side. In this structure, the positions of the oxide semiconductor films 430a and 430b can be interchanged.

For the oxide semiconductor film 430b, an oxide semiconductor whose electron affinity (energy difference between the vacuum level and the conduction band minimum) is higher than those of the oxide semiconductor films 430a and 430c is used, for example.

In such a structure, when an electric field is applied to the conductive film 470, a channel is formed in the oxide semiconductor film 430b whose conduction band minimum is the lowest in the oxide semiconductor film 430. Therefore, the oxide semiconductor film 430b can be regarded as having a region serving as a semiconductor, while the oxide semiconductor film 430a and the oxide semiconductor film 430c can be regarded as having a region serving as an insulator or a semi-insulator.

An oxide semiconductor that can be used for each of the oxide semiconductor films 430a, 430b, and 430c preferably contains at least one of In and Zn, or both In and Zn. In order to reduce variations in electrical characteristics of the transistor including the oxide semiconductor, the oxide semiconductor preferably contains a stabilizer in addition to In and/or Zn.

Examples of the stabilizer include Ga, Sn, Hf, Al, and Zr. Another example of the stabilizer includes lanthanoid such as La, Ce, Pr, Nd, Sm, Eu, Gd, Tb, Dy, Ho, Er, Tm, Yb, and Lu.

The oxide semiconductor films 430a, 430b, and 430c preferably include crystal parts. In particular, when crystals with c-axis alignment are used, the transistor can have stable electrical characteristics. Moreover, crystals with c-axis alignment are resistant to bending; thus, using such crystals can improve the reliability of a semiconductor device using a flexible substrate.

<Source Electrode and Drain Electrode>

As the conductive film 440 functioning as a source electrode and the conductive film 450 functioning as a drain electrode, a single layer or a stacked layer of a material selected from Al, Cr, Cu, Ta, Ti, Mo, W, Ni, Mn, Nd, and Sc and an alloy of any of these metal materials can be used, for example. Typically, it is preferable to use Ti, which is particularly easily bonded to oxygen, or W, which has a high melting point and thus allows subsequent process temperatures to be relatively high. It is also possible to use a stack of any of the above materials and Cu or an alloy such as Cu—Mn, which has low resistance. In the transistors 405, 406, 411, and 412, it is possible to use W for the conductive films 441 and 451 and use a stack of Ti and Al for the conductive films 442 and 452, for example.

The above materials are capable of extracting oxygen from an oxide semiconductor film. Thus, in a region of the oxide semiconductor film that is in contact with any of the above materials, oxygen is released from the oxide semiconductor film and an oxygen vacancy is formed. Hydrogen slightly contained in the film and the oxygen vacancy are bonded to each other, whereby the region is markedly changed to an n-type region. Accordingly, the n-type region can serve as a source or a drain of the transistor.

When W is used for the conductive films 440 and 450, the conductive films 440 and 450 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive films 440 and 450 and putting the n-type semiconductor layer in contact with the oxide semiconductor film. For the n-type semiconductor layer, In—Ga—Zn oxide, zinc oxide, indium oxide, tin oxide, indium tin oxide, or the like to which nitrogen is added can be used.

<Gate Insulating Film>

The insulating film 460 functioning as a gate insulating film can be an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 460 may be a stack containing any of the above materials. Note that the insulating film 460 may contain La, N, Zr, or the like as an impurity.

An example of a stacked structure of the insulating film 460 is described. The insulating film 460 contains oxygen, nitrogen, silicon, and/or hafnium, for example. Specifically, the insulating film 460 preferably contains hafnium oxide, and silicon oxide or silicon oxynitride.

Hafnium oxide and aluminum oxide have a higher dielectric constant than silicon oxide and silicon oxynitride. Therefore, the insulating film 460 using hafnium oxide or aluminum oxide can have a larger thickness than an insulating film using silicon oxide, so that leakage current due to tunneling current can be reduced. That is, a transistor with a low off-state current can be provided. Moreover, hafnium oxide with a crystal structure has a higher dielectric constant than hafnium oxide with an amorphous structure. Therefore, it is preferable to use hafnium oxide with a crystal structure in order to achieve a transistor with a low off-state current. Examples of the crystal structure include a monoclinic crystal structure and a cubic crystal structure. Note that one embodiment of the present invention is not limited to the above examples.

As the insulating films 420 and 460 in contact with the oxide semiconductor film 430, a film that releases less nitrogen oxide is preferably used. When the oxide semiconductor is in contact with an insulating film that releases a large amount of nitrogen oxide, the density of states caused by nitrogen oxide becomes high in some cases. As the insulating films 420 and 460, an oxide insulating film such as a silicon oxynitride film or an aluminum oxynitride film that releases less nitrogen oxide can be used, for example.

A silicon oxynitride film that releases less nitrogen oxide is a film where the amount of released ammonia is larger than the amount of released nitrogen oxide in TDS; the amount of released ammonia is typically greater than or equal to $1\times10^{18}/cm^3$ and less than or equal to $5\times10^{19}/cm^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating film as the insulating films 420 and 460, a shift in the threshold voltage of the transistor can be reduced, which leads to reduced fluctuations in the electrical characteristics of the transistor.

<Gate Electrode>

As the conductive film 470 functioning as a gate electrode, a conductive film formed using Al, Ti, Cr, Co, Ni, Cu, Y, Zr, Mo, Ru, Ag, Mn, Nd, Sc, Ta, or W can be used, for example. An alloy or a conductive nitride of any of these materials can also be used. A stack containing a plurality of materials selected from the above materials, alloys of these materials, and conductive nitrides of these materials can also be used. As a typical example, tungsten, a stack of tungsten and titanium nitride, or a stack of tungsten and tantalum nitride can be used. Alternatively, Cu or an alloy such as Cu—Mn, which has low resistance, or a stack of any of the above materials and Cu or an alloy such as Cu—Mn may be used. In this embodiment, tantalum nitride is used for the conductive film 471 and tungsten is used for the conductive film 472 to form the conductive film 470.

<Protective Insulating Film>

As the insulating film 475 functioning as a protective insulating film, a silicon nitride film, an aluminum nitride film, or the like that contains hydrogen can be used. In the transistors 403, 404, 406, 409, 410, and 412 shown in Embodiment 5, the use of an insulating film containing hydrogen as the insulating film 475 allows part of the oxide semiconductor film to have n-type conductivity. In addition, a nitride insulating film functions as a blocking film against moisture and the like and can improve the reliability of the transistor.

An aluminum oxide film can also be used as the insulating film 475. It is particularly preferable to use an aluminum oxide film as the insulating film 475 in the transistors 401, 402, 405, 407, 408, and 411 shown in Embodiment 5. An aluminum oxide film is highly effective in preventing transmission of both oxygen and impurities such as hydrogen and moisture. Accordingly, during and after the process of manufacturing the transistor, the aluminum oxide film can suitably function as a protective film that has effects of preventing entry of impurities such as hydrogen and moisture into the oxide semiconductor film 430, preventing release of oxygen from the oxide semiconductor film, and preventing unnecessary release of oxygen from the insulating film 420. Furthermore, oxygen contained in the aluminum oxide film can be diffused into the oxide semiconductor film.

The insulating film 480 is preferably formed over the insulating film 475. The insulating film 480 can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 480 may be a stack containing any of the above materials.

Here, like the insulating film 420, the insulating film 480 preferably contains oxygen more than that in the stoichiometric composition. Oxygen released from the insulating film 480 can be diffused into the channel formation region in the oxide semiconductor film 430 through the insulating film 460, so that oxygen vacancies formed in the channel formation region can be filled with oxygen. In this manner, stable electrical characteristics of the transistor can be achieved.

High integration of a semiconductor device requires transistor miniaturization. However, it is known that miniaturization of a transistor causes deterioration of electrical characteristics of the transistor. In particular, a decrease in channel width causes a reduction in on-state current.

In the transistors 407 to 412 in one embodiment of the present invention, the oxide semiconductor film 430c is formed to cover the oxide semiconductor film 430b where a channel is formed; thus, the channel formation layer is not in contact with the gate insulating film. Accordingly, scattering of carriers at the interface between the channel formation layer and the gate insulating film can be reduced, and the on-state current of the transistor can be increased.

In the transistor in one embodiment of the present invention, as described above, the gate electrode (the conductive film 470) is formed to electrically surround the oxide semiconductor film 430 in the channel width direction. Accordingly, a gate electric field is applied to the oxide semiconductor film 430 in the direction perpendicular to its side surface in addition to the direction perpendicular to its top surface. In other words, a gate electric field is applied to the entire channel formation layer and the effective channel width is increased, leading to a further increase in the on-state current.

<Film Formation Method>

Although the variety of films such as the metal films, the semiconductor films, and the inorganic insulating films described in this embodiment can be formed typically by a sputtering method or a plasma-enhanced CVD method, such films may be formed by another method such as a thermal CVD method. Examples of a thermal CVD method include a metal organic chemical vapor deposition (MOCVD) method and an atomic layer deposition (ALD) method.

Since plasma is not used for deposition, a thermal CVD method has an advantage that no defect due to plasma damage is generated.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of the substrate or over the substrate.

Deposition by an ALD method is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas together with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of an inert gas, and then the second source gas may be introduced. The first source gas is adsorbed on the surface of the substrate and reacted to form a first layer, and then, the second source gas introduced is adsorbed on the first layer and reacted. That is, a second layer is stacked over the first layer, so that a thin film is formed. The sequence of the gas introduction is controlled and repeated more than once until a desired thickness is obtained, whereby a thin film with excellent step coverage can be formed. The thickness of the thin film can be adjusted by the number of repetitions of the sequence of gas introduction; therefore, ALD makes it possible to accurately adjust a film thickness and thus is suitable for manufacturing a minute FET.

The variety of films such as the metal film, the semiconductor film, and the inorganic insulating film that have been disclosed in the above embodiments can be formed by a thermal CVD method such as MOCVD or ALD. For example, trimethylindium ($In(CH_3)_3$), trimethylgallium ($Ga(CH_3)_3$), and dimethylzinc ($Zn(CH_3)_2$) can be used to form an In—Ga—Zn—O film. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, when a hafnium oxide film is formed with a deposition apparatus using ALD, two kinds of gases, i.e., ozone ($O_3$) as an oxidizer and a source gas that is obtained by vaporizing liquid containing a solvent and a hafnium precursor are used. Examples of such liquid include hafnium alkoxide and a hafnium amide such as tetrakis(dimethylamide)hafnium (TDMAH, $Hf[N(CH_3)_2]_4$) and tetrakis(ethylmethylamide)hafnium).

For example, when an aluminum oxide film is formed with a deposition apparatus using ALD, two kinds of gases, i.e., $H_2O$ as an oxidizer and a source gas that is obtained by vaporizing liquid containing a solvent and an aluminum precursor (e.g., trimethylaluminum (TMA, $Al(CH_3)_3$)) are used. Other examples of the applicable material include tris(dimethylamide)aluminum, triisobutylaluminum, and aluminum tris(2,2,6,6-tetramethyl-3,5-heptanedionate).

For example, when a silicon oxide film is formed with a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, when a tungsten film is formed with a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that a $SiH_4$ gas may be used instead of a $B_2H_6$ gas.

For example, when an oxide semiconductor film, e.g., an In—Ga—Zn—O film is formed with a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed using these gases. Although an $H_2O$ gas that is obtained by bubbling with an inert gas such as Ar may be used instead of an $O_3$ gas, it is preferable to use an $O_3$ gas, which does not contain H.

A facing-target-type sputtering apparatus can be used to form an oxide semiconductor film. Deposition using a facing-target-type sputtering apparatus can be referred to as vapor deposition sputtering (VDSP).

When an oxide semiconductor film is deposited using a facing-target-type sputtering apparatus, plasma damage to the oxide semiconductor film at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (such as argon), and water) in a deposited oxide semiconductor film can be lowered.

The structure described in this embodiment can be used in appropriate combination with the structure described in any of the other embodiments.

Embodiment 7

In this embodiment, an oxide semiconductor that can be used for one embodiment of the present invention will be described.

<Oxide Semiconductor>

An oxide semiconductor of the present invention will be described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor according to the present invention are described with reference to FIGS. 33A to 33C. Note that the proportion of oxygen atoms is not shown in FIGS. 33A to 33C. The terms of the atomic ratio of indium, the element M, and zinc contained in the oxide semiconductor are denoted by [In], [M], and [Zn], respectively.

Figure 33A:
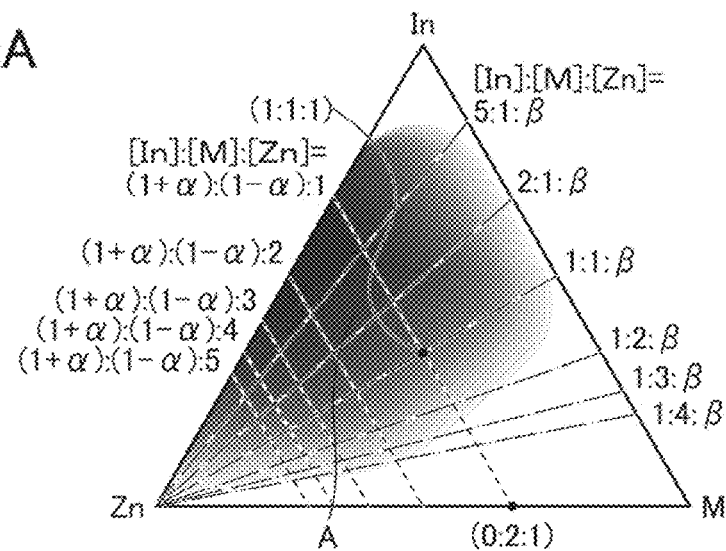
FIGS. 33A to 33C each illustrate the range of an atomic ratio of an oxide semiconductor.
Figure 33B:
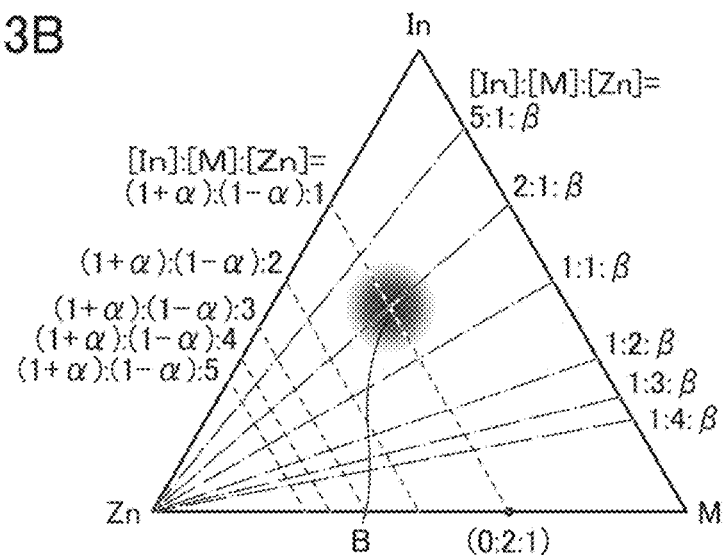
Figure 33C:
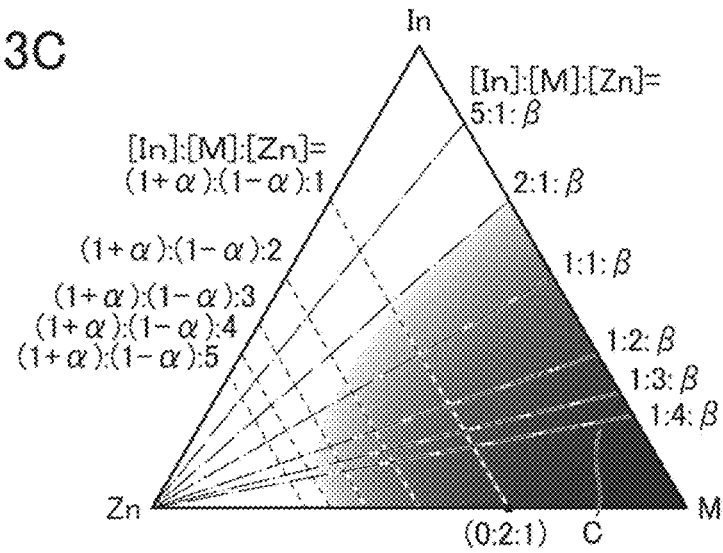

In FIGS. 33A to 33C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \geq 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

FIGS. 33A and 33B illustrate examples of the preferred ranges of the atomic ratio of indium, the element M, and zinc contained in an oxide semiconductor in one embodiment of the present invention.

Figure 34:
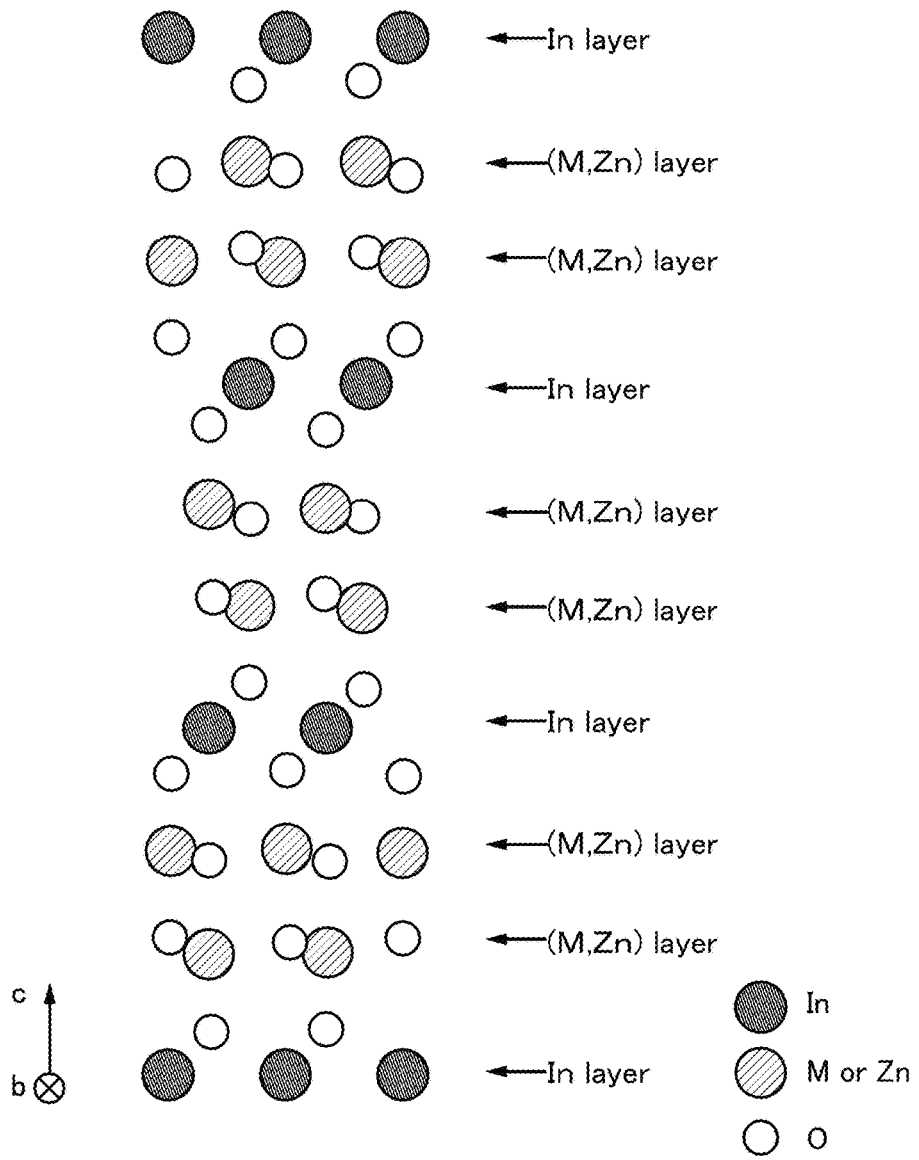
FIG. 34 illustrates a crystal structure of $InMZnO_4$.

FIG. 34 illustrates an example of the crystal structure of $InMZnO_4$ with an atomic ratio [In]:[M]:[Zn] of 1:1:1. The crystal structure illustrated in FIG. 34 is $InMZnO_4$ observed from a direction parallel to the b-axis. Note that a metal element in a layer that contains M, Zn, and oxygen (hereinafter this layer is referred to as "(M,Zn) layer") in FIG. 34 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as layered structure) and includes two (M,Zn) layers that contain the element M, zinc, and oxygen with respect to one layer that contains indium and oxygen (hereinafter referred to as In layer), as illustrated in FIG. 34.

Indium and the element M can be replaced with each other. Accordingly, when the element M in the (M,Zn) layer is replaced by indium, the layer can also be referred to as an (In,M,Zn) layer. In that case, a layered structure that includes two (In,M,Zn) layers with respect to one In layer is obtained.

An oxide semiconductor with an atomic ratio [In]:[M]:[Zn] of 1:1:2 has a layered structure that includes three (M,Zn) layers with respect to one In layer. In other words, if [Zn] is larger than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor may have a mix of a layered structure including one In layer for every two (M,Zn) layers and a layered structure including one In layer for every three (M,Zn) layers.

For example, when the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] close to 0:2:1, two phases of a spinel crystal structure and a layered crystal structure are likely to exist. In addition, with an atomic ratio [In]:[M]:[Zn] close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor with a higher content of indium can have high carrier mobility (electron mobility). This is because in an oxide semiconductor containing indium, the element M, and zinc, the s orbital of heavy metal mainly contributes to carrier transfer, and a higher indium content in the oxide semiconductor enlarges a region where the sorbitals of indium atoms overlap; therefore, an oxide semiconductor with a high indium content has higher carrier mobility than an oxide semiconductor with a low indium content.

In contrast, when the indium content and the zinc content in an oxide semiconductor become lower, the carrier mobility becomes lower. Thus, with an atomic ratio [In]:[M]:[Zn] of 0:1:0 or around 0:1:0 (e.g., a region C in FIG. 33C), insulation performance becomes better.

Accordingly, an oxide semiconductor in one embodiment of the present invention preferably has an atomic ratio represented by a region A in FIG. 33A. With this atomic ratio, a layered structure with high carrier mobility and a few grain boundaries is easily obtained.

A region B in FIG. 33B represents an atomic ratio [In]:[M]:[Zn] of 4:2:3 to 4:2:4.1 and the vicinity thereof. The vicinity includes an atomic ratio [In]:[M]:[Zn] of 5:3:4. An oxide semiconductor with an atomic ratio represented by the region B is an excellent oxide semiconductor that has particularly high crystallinity and high carrier mobility.

Note that a condition where an oxide semiconductor has a layered structure is not uniquely determined by an atomic ratio. The atomic ratio affects difficulty in forming a layered structure. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor will be described.

When the oxide semiconductor is used for a transistor, carrier scattering or the like at a grain boundary can be reduced; thus, the transistor can have high field-effect mobility. Moreover, the transistor can have high reliability.

An oxide semiconductor with a low carrier density is preferably used for a transistor. For example, an oxide semiconductor whose carrier density is lower than $8\times10^{11}$/cm$^3$, preferably lower than $1\times10^{11}$/cm$^3$, further preferably lower than $1\times10^{10}$/cm$^3$, and greater than or equal to $1\times10^{9}$/cm$^3$ is used.

A highly purified intrinsic or substantially highly purified intrinsic oxide semiconductor has few carrier generation sources and thus can have a low carrier density. A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor with a high density of trap states has unstable electrical characteristics in some cases.

In view of the above, to obtain stable electrical characteristics of a transistor, it is effective to reduce the concentration of impurities in the oxide semiconductor. To reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon, which is a Group 14 element, is contained in the oxide semiconductor, defect states are formed. Thus, the concentration of silicon or carbon in the oxide semiconductor and around an interface with the oxide semiconductor (the concentration measured by secondary ion mass spectrometry (SIMS)) is set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Thus, a transistor using an oxide semiconductor that contains alkali metal or alkaline earth metal is likely to have normally-on characteristics. Accordingly, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor in which an oxide semiconductor containing nitrogen is used as a semiconductor is likely to have normally-on characteristics. For this reason, nitrogen in the oxide semiconductor is preferably reduced as much as possible. For example, the nitrogen concentration measured by SIMS is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide semiconductor reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide semiconductor that contains hydrogen is likely to have normally-on characteristics. Accordingly, it is preferred that hydrogen in the oxide semiconductor be reduced as much as possible. Specifically, the hydrogen concentration in the oxide semiconductor measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurity concentration is used for a channel formation region in a transistor, the transistor can have stable electrical characteristics.

Next, the case where the oxide semiconductor has a two-layer structure or a three-layer structure will be described. A band diagram of insulators that are in contact with a layered structure of an oxide semiconductor S1, an oxide semiconductor S2, and an oxide semiconductor S3 and a band diagram of insulators that are in contact with a layered structure of the oxide semiconductor S2 and the oxide semiconductor S3 are described with reference to FIGS. 35A and 35B.

Figure 35A:
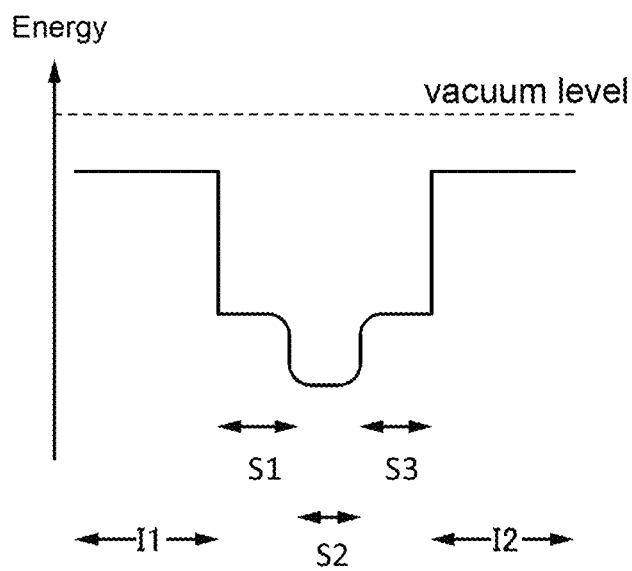
FIGS. 35A and 35B are each a band diagrams of a layered structure of oxide semiconductors.
Figure 35B:
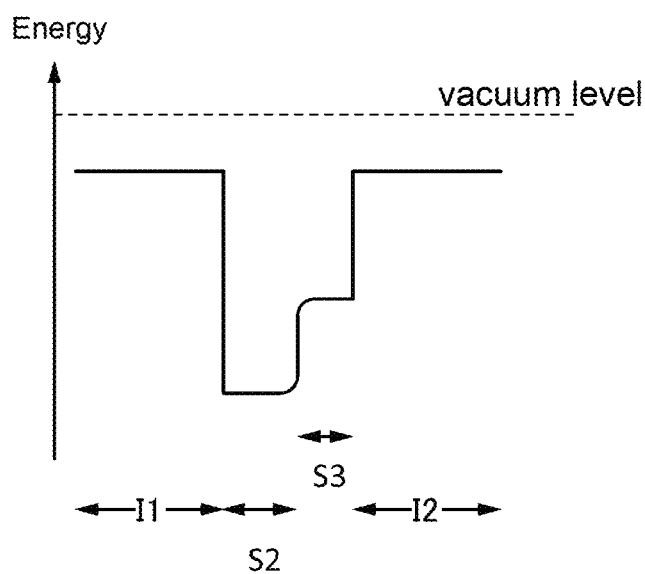

FIG. 35A is an example of a band diagram of a layered structure including an insulator I1, the oxide semiconductor S1, the oxide semiconductor S2, the oxide semiconductor S3, and an insulator I2 in the thickness direction. FIG. 35B is an example of a band diagram of a layered structure including the insulator I1, the oxide semiconductor S2, the oxide semiconductor S3, and the insulator I2 in the thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference in the conduction band minimum between the oxide semiconductor S2 and each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference in the electron affinity between the oxide semiconductor S2 and each of the oxide semiconductors S1 and S3 is greater than or equal to 0.15 eV or greater than or equal to 0.5 eV, and less than or equal to 2 eV or less than or equal to 1 eV.

As illustrated in FIGS. 35A and 35B, the conduction band minimum of each of the oxide semiconductors S1 to S3 is gradually varied. In other words, the conduction band minimum is continuously varied or continuous junction is formed. To obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, when the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and a high on-state current can be obtained.

When an electron is trapped in a trap state, the trapped electron behaves like fixed charge; thus, the threshold voltage of a transistor is shifted in the positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. Accordingly, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 33C can be used as the oxide semiconductors S1 and S3. Note that the region C in FIG. 33C represents the atomic ratio [In]:[M]:[Zn] of 0:1:0 or around 0:1:0.

When an oxide semiconductor with the atomic ratio represented by the region A is used as the oxide semiconductor S2, each of the oxide semiconductors S1 and S3 is preferably an oxide semiconductor with [M]/[In] of greater than or equal to 1, preferably greater than or equal to 2. Moreover, the oxide semiconductor S3 is preferably an oxide semiconductor having [M]/([Zn]+[In]) of greater than or equal to 1 to obtain sufficiently high insulation performance.

<Structure of Oxide Semiconductor>

The structure of an oxide semiconductor will be described below.

In this specification, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis-aligned crystal parts (also referred to as pellets).

Figure 36A:
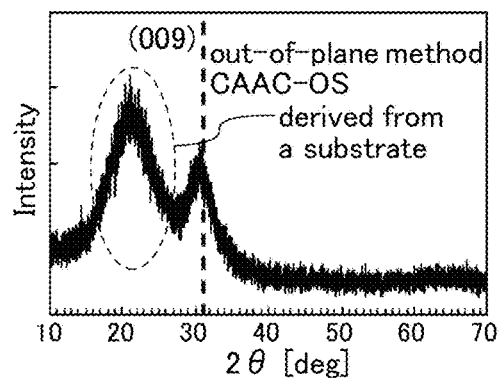
FIGS. 36A to 36E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 36A. This peak is derived from the (009) plane of the InGaZnO$_4$ crystal, which indicates that crystals in the CAAC-OS have c-axis alignment, and that the c-axes are aligned in a direction substantially perpendicular to a surface where the CAAC-OS film is formed (also referred to as formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 36B:
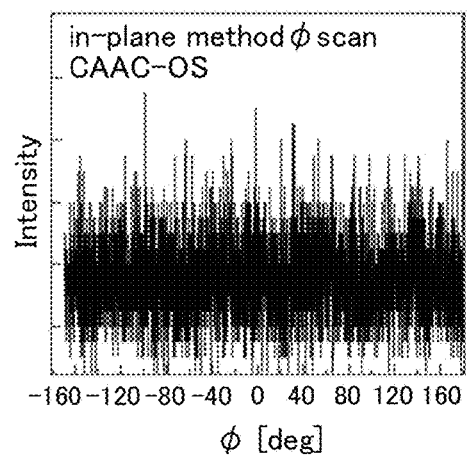
Figure 36C:
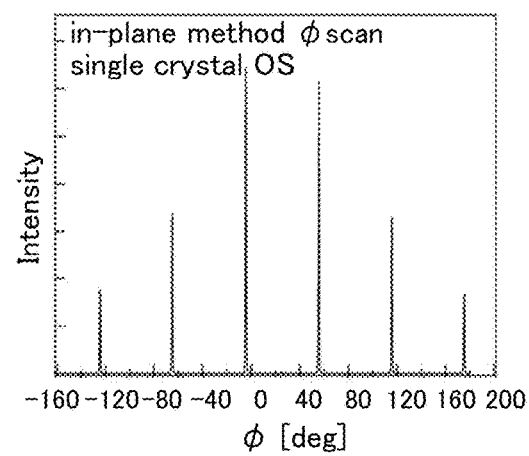

Furthermore, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector of the sample surface as an axis (φ axis), no clear peak appears as shown in FIG. 36B. Meanwhile, when single crystal InGaZnO$_4$ is subjected to φ scan with 2θ fixed at around 56°, six peaks that are derived from crystal planes equivalent to the (110) plane are observed as shown in FIG. 36C. Accordingly, the structural analysis using XRD shows that the directions of a-axes and b-axes are irregularly oriented in the CAAC-OS.

Figure 36D:
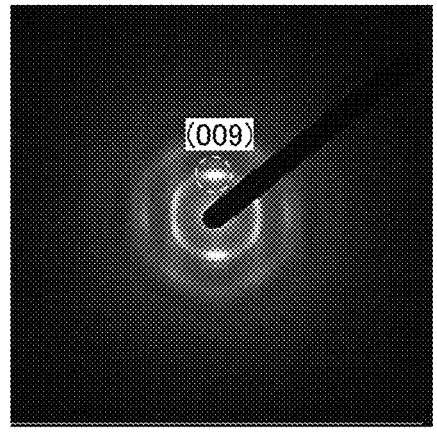
Figure 36E:
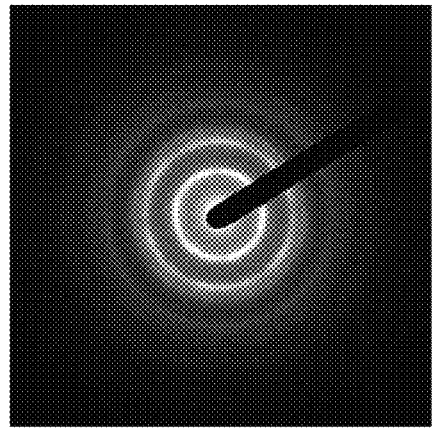

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as selected-area electron diffraction pattern) shown in FIG. 36D appears sometimes. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 36E shows a diffraction pattern obtained when an electron beam with a probe diameter of 300 nm is incident on the same sample in a direction perpendicular to the sample surface. As shown in FIG. 36E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 36E is considered to be derived from the (010) plane, the (100) plane, and the like of the InGaZnO$_4$ crystal. The second ring in FIG. 36E is considered to be derived from the (110) plane and the like.

In a combined analysis image (also referred to as transmission electron microscope (TEM) image) of a bright-field image and a diffraction pattern of the CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 37A:
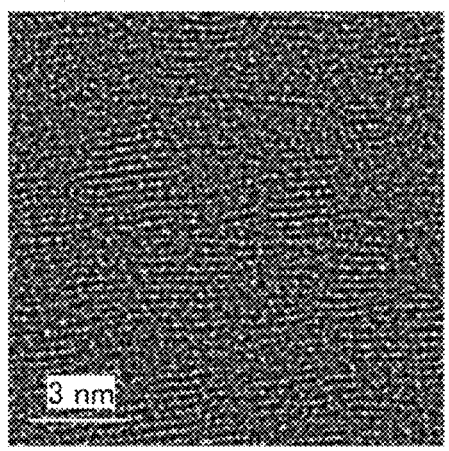
FIGS. 37A to 37E show a cross-sectional TEM image and plan-view TEM images of a CAAC-OS, and images obtained through analysis of the plan-view TEM images.

FIG. 37A shows a high-resolution cross-sectional TEM image of the CAAC-OS observed from a direction substantially parallel to the sample surface. The high-resolution TEM image is obtained with a spherical aberration corrector function. A high-resolution TEM image obtained with a spherical aberration corrector function is particularly referred to as a Cs-corrected high-resolution TEM image. A Cs-corrected high-resolution TEM image can be obtained with, for example, an atomic resolution analytical electron microscope JEM-ARM200F, manufactured by JEOL Ltd.

FIG. 37A shows pellets in which metal atoms are arranged in a layered manner. FIG. 37A proves that the size of a pellet is greater than or equal to 1 nm or greater than or equal to 3 nm. Therefore, the pellet can be referred to as a nanocrystal (nc). Furthermore, the CAAC-OS can also be referred to as an oxide semiconductor including c-axis-aligned nanocrystals (CANC). A pellet reflects unevenness of a formation surface or a top surface of the CAAC-OS and is parallel to the formation surface or the top surface of the CAAC-OS.

Figure 37B:
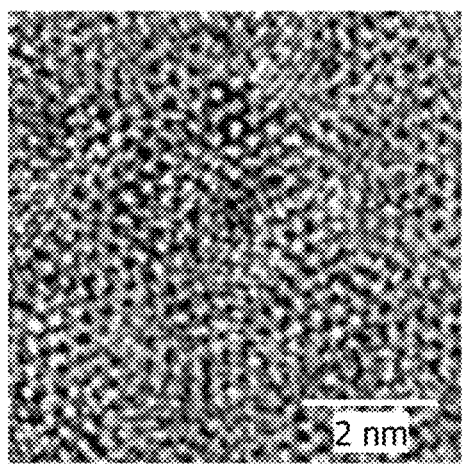
Figure 37C:
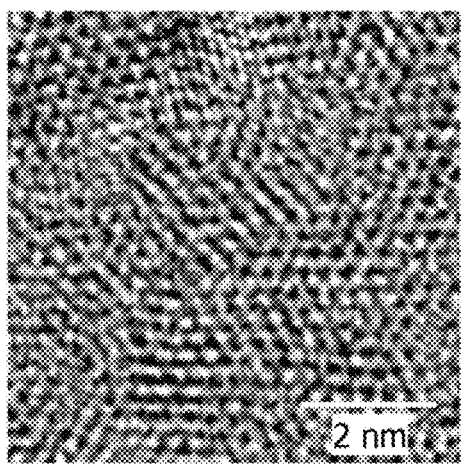
Figure 37D:
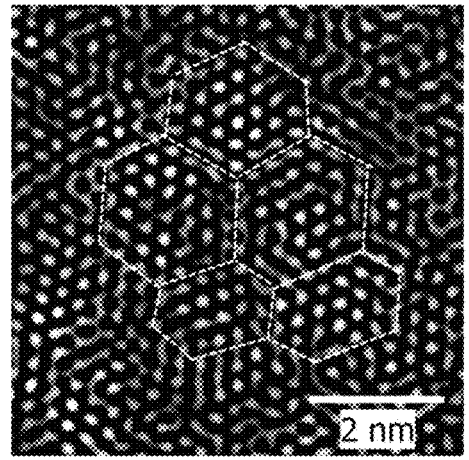
Figure 37E:
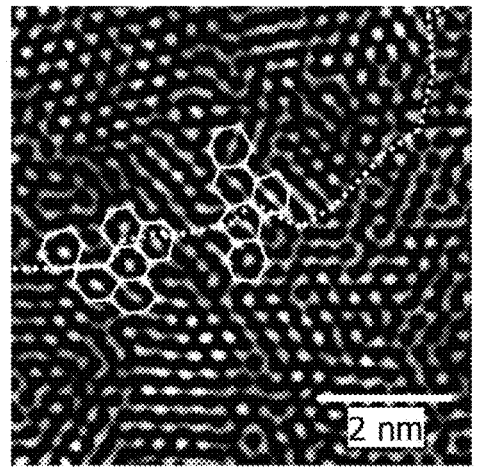

FIGS. 37B and 37C show Cs-corrected high-resolution plan-view TEM images of the CAAC-OS observed from a direction substantially perpendicular to the sample surface. FIGS. 37D and 37E are images obtained through image processing of FIGS. 37B and 37C. The method of image processing is as follows. First, the image in FIG. 37B is subjected to fast Fourier transform (FFT), so that an FFT image is obtained. Then, mask processing is performed such that a range of 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. An FFT filtering image is a Cs-corrected high-resolution TEM image from which a periodic component is extracted, and shows a lattice arrangement.

In FIG. 37D, a portion in which the lattice arrangement is broken is shown by dashed lines. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 37E, a dotted line denotes a boundary between a region with a regular lattice arrangement and another region with a regular lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, formation of a crystal grain boundary is inhibited by distortion of a lattice arrangement. This is probably because the CAAC-OS can tolerate distortion owing to a low density of the atomic arrangement in the a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. Accordingly, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that impurities mean an element other than the main components of the oxide semiconductor, such as hydrogen, carbon, silicon, and a transition metal element. For example, an element (specifically, silicon or the like) having higher strength of bonding to oxygen than a metal element contained in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

<nc-OS>

Next, an nc-OS will be described.

Analysis of an nc-OS by XRD is described. When the structure of an nc-OS is analyzed by an out-of-plane method, for example, a peak indicating orientation does not appear. That is, a crystal of the nc-OS does not have orientation.

Figure 38A:
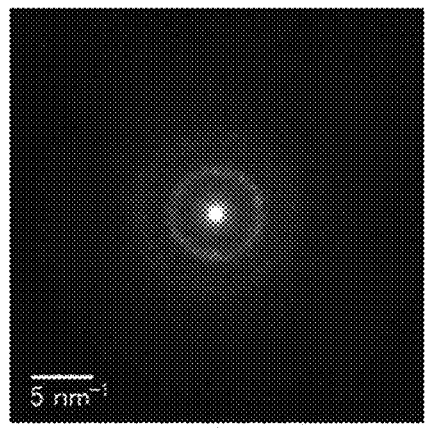
FIGS. 38A to 38D show electron diffraction patterns and a cross-sectional TEM image of an nc-OS.
Figure 38B:
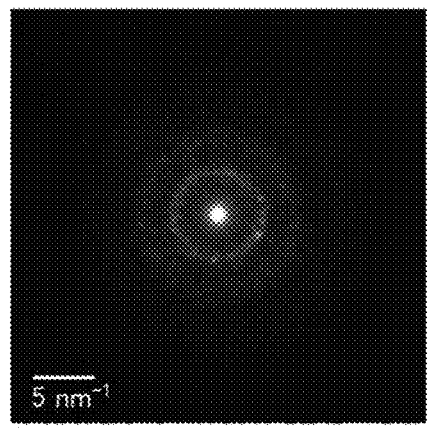

For example, when an electron beam with a probe diameter of 50 nm is incident on a 34-nm-thick region of a thinned nc-OS including an InGaZnO$_4$ crystal in the direction parallel to the formation surface, a ring-shaped diffraction pattern (nanobeam electron diffraction pattern) shown in FIG. 38A is observed. FIG. 38B shows a diffraction pattern (nanobeam electron diffraction pattern) obtained when an electron beam with a probe diameter of 1 nm is incident on the same sample. As shown in FIG. 38B, a plurality of spots are observed in a ring-like region. In other words, ordering in an nc-OS is not observed with an electron beam having a probe diameter of 50 nm but is observed with an electron beam having a probe diameter of 1 nm.

Figure 38C:
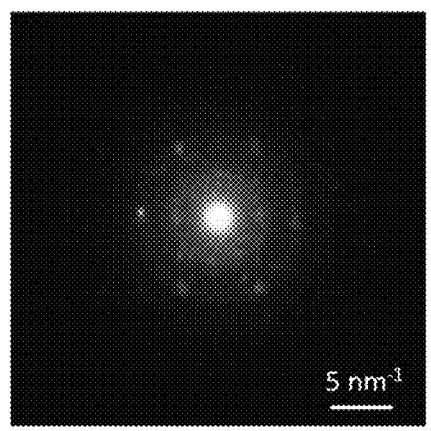

When an electron beam with a probe diameter of 1 nm is incident on a region with a thickness less than 10 nm, an electron diffraction pattern in which spots are arranged in an approximately regular hexagonal shape as shown in FIG. 38C is observed in some cases. This means that an nc-OS has a well-ordered region, i.e., a crystal, in the thickness range of less than 10 nm. Note that an electron diffraction pattern having regularity is not observed in some regions because crystals are aligned in various directions.

Figure 38D:
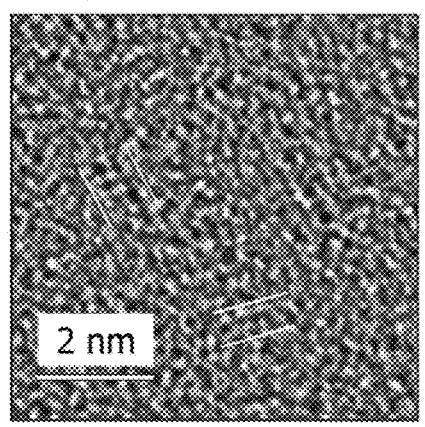

FIG. 38D shows a Cs-corrected high-resolution cross-sectional TEM image of the nc-OS observed from the direction substantially parallel to the formation surface. In the high-resolution TEM image, the nc-OS has a region in which a crystal part is observed, such as the part indicated by additional lines in FIG. 38D, and a region in which a clear crystal part is not observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor by some analysis methods.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS is likely to have a lower density of defect states than an a-like OS and an amorphous oxide semiconductor. Since there is no regularity of crystal orientation between different pellets in the nc-OS, the nc-OS has a higher density of defect states than the CAAC-OS.

<a-like OS>

An a-like OS has a structure between those of the nc-OS and an amorphous oxide semiconductor.

Figure 39A:
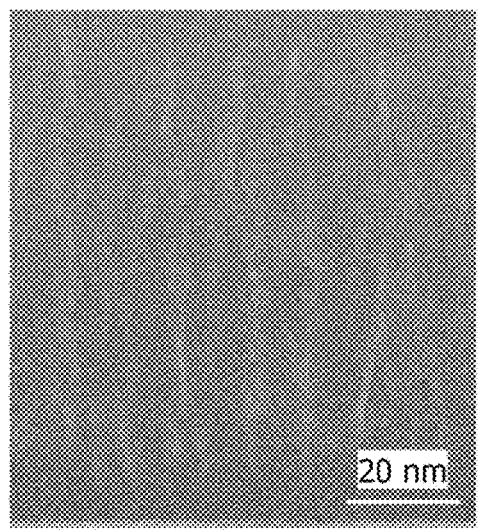
FIGS. 39A and 39B show cross-sectional TEM images of an a-like OS.
Figure 39B:
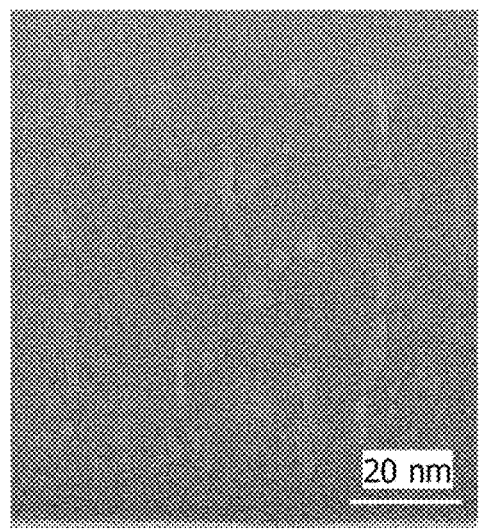

FIGS. 39A and 39B show high-resolution cross-sectional TEM images of the a-like OS. FIG. 39A is the high-resolution cross-sectional TEM image of the a-like OS at the start of electron irradiation. FIG. 39B is the high-resolution cross-sectional TEM image of the a-like OS after the electron (e$^-$) irradiation at $3.3 \times 10^8$ e$^-$/nm$^2$. FIGS. 39A and 39B show that stripe-like bright regions that extend vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that the a-like OS has an unstable structure compared to the CAAC-OS and nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The spacing between the adjacent layers is equivalent to the lattice spacing (also referred to as d value) on the (009)

plane, and is 0.29 nm according to crystal structure analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 40:
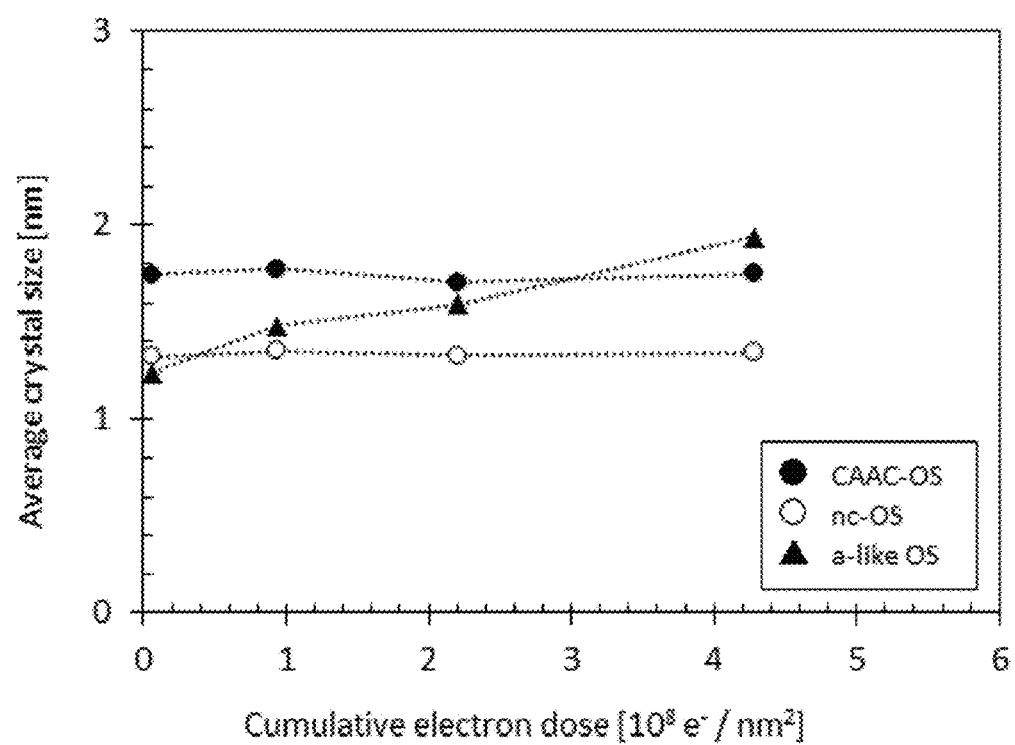
FIG. 40 shows a change in crystal part of an In—Ga—Zn oxide induced by electron irradiation.

FIG. 40 shows a change in the average size of crystal parts (at 22 to 30 points) in each sample. Note that the crystal part size corresponds to the length of the lattice fringe. FIG. 40 indicates that the crystal part size in the a-like OS increases with an increase in the cumulative electron dose in obtaining TEM images, for example. As shown in FIG. 40, a crystal part of approximately 1.2 nm (also referred to as initial nucleus) at the start of TEM observation grows to a size of approximately 1.9 nm at a cumulative electron (e) dose of $4.2 \times 10^8$ e$^-$/nm$^2$. In contrast, the crystal part sizes in the nc-OS and the CAAC-OS show little change from the start of electron irradiation to a cumulative electron dose of $4.2 \times 10^8$ e$^-$/nm$^2$. As shown in FIG. 40, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ e$^-$/(nm$^2$·s); and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. These results demonstrate that the a-like OS has an unstable structure compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of a single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in an oxide semiconductor having an atomic ratio of In:Ga:Zn=1:1:1, the density of single crystal InGaZnO$_4$ with a rhombohedral crystal structure is 6.357 g/cm$^3$. Accordingly, for the oxide semiconductor having an atomic ratio of In:Ga:Zn=1:1:1, for example, the density of the a-like OS is higher than or equal to 5.0 g/cm$^3$ and lower than 5.9 g/cm$^3$, and the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate a density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

<Carrier Density of Oxide Semiconductor>

Next, the carrier density of an oxide semiconductor will be described below.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurities in the oxide semiconductor. Hence, the carrier density of the oxide semiconductor can be controlled by controlling the density of defect states in the oxide semiconductor.

A transistor using the oxide semiconductor in a channel region will be described.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ cm$^{-3}$, preferably lower than $1 \times 10^{11}$ cm$^{-3}$, further preferably lower than $1 \times 10^{10}$ cm$^{-3}$ and is higher than or equal to $1 \times 10^9$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased, or the bandgap of the oxide semiconductor is narrowed. For example, an oxide semiconductor that has a slightly high impurity concentration or a slightly high density of defect states in the range where a favorable on/off ratio is obtained in the Id-Vg characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

The structure described in this embodiment can be used in appropriate combination with the structure described in any of the other embodiments.

Embodiment 8

In this embodiment, an electronic component and electronic devices and the like including the electronic component will be described as examples of semiconductor devices.

Figure 41A:
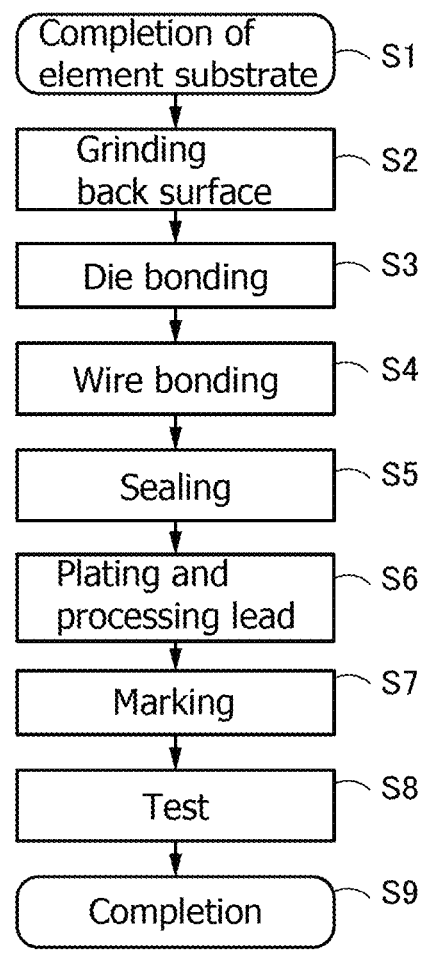
FIG. 41A is a flowchart showing an example of a method for manufacturing an electronic component.

FIG. 41A is a flow chart showing an example of a method for manufacturing an electronic component. An electronic component is also referred to as a semiconductor package, an IC package, or a package. For the electronic component, there are various standards and names corresponding to the direction or the shape of terminals; hence, one example of the electronic component will be described in this embodiment.

A semiconductor device including a transistor is completed by integrating detachable components on a printed circuit board through the assembly process (post-process). The post-process can be completed through steps shown in FIG. 41A. Specifically, after an element substrate is completed in a wafer process (S1), a dicing step for dividing the substrate into a plurality of chips is performed (S2). Before the substrate is divided into a plurality of pieces, the substrate is thinned to reduce warpage or the like of the substrate caused in the wafer process and to reduce the size of the component.

The chip is picked up to be mounted on and bonded to a lead frame in a die bonding step (S3). In the die bonding step, the chip may be bonded to the lead frame with a resin or a tape. As the bonding method, a method suitable for the product can be selected. In the die bonding step, the chip may be mounted on an interposer to be bonded. In a wire bonding step (S4), a lead of the lead frame is electrically connected to an electrode on the chip with a metal fine line (wire). A silver line or a gold line can be used as the metal fine line. Either ball bonding or wedge bonding can be used as wire bonding.

A wire-bonded chip is subjected to a molding step of sealing the chip with an epoxy resin or the like (S5). The lead of the lead frame is plated. Then, the lead is cut and processed into a predetermined shape (S6). This plate processing prevents rust of the lead and facilitates soldering at the time of mounting the chip on a printed circuit board in a later step. Printing process (marking) is performed on a surface of the package (S7). Through an inspection step (S8), the electronic component is completed (S9). Integrating the foregoing semiconductor device achieves a small electronic component with low power consumption.

Figure 41B:
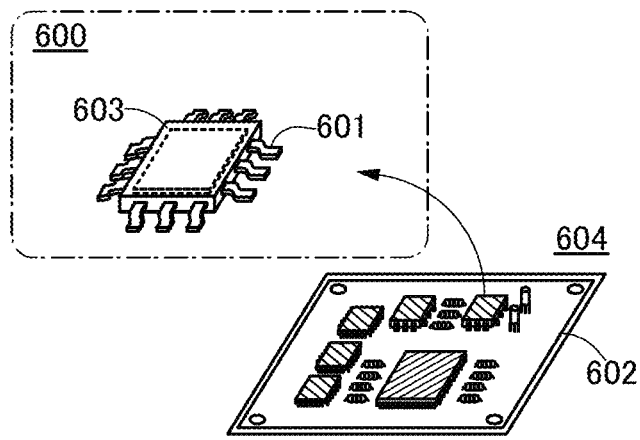
FIG. 41B is a schematic perspective view showing a structure example of an electronic component.

FIG. 41B is a schematic perspective view of an electronic component. As an example, FIG. 41B illustrates a quad flat package (QFP). An electronic component 600 illustrated in FIG. 41B includes a lead 601 and a circuit portion 603. In the circuit portion 603, the semiconductor device of one embodiment of the present invention is fabricated. The electronic component 600 is mounted on a printed circuit board 602, for example. A combination of electronic components 600 electrically connected to each other over the printed circuit board 602 can be equipped in an electronic device. A completed circuit board 604 is provided in a variety of electronic devices or the like.

The PLD of one embodiment of the present invention itself, or a central processing unit (CPU), a microcontroller unit (MCU), a sensor device, or the like provided with the PLD can be used as a processor for executing various kinds of processing. An electronic component can be formed as a system-on-a-chip (SOC or SoC) in which the PLD and another circuit are mounted on one semiconductor chip (IC chip). When the PLD is included in a sensor device, the sensor device is configured so that one PLD processes data sensed by a plurality of sensors, whereby the electronic component can be reduced in size and can have multiple functions.

The electronic component of this embodiment can be used for electronic devices in a wide variety of fields, such as digital signal processing, software-defined radio systems, avionic systems (electronic devices used in aircraft, e.g., communication systems, navigation systems, autopilot systems, and flight management systems), application specific integrated circuit (ASIC) prototyping, medical image processing, voice recognition, encryption, bioinformatics, emulators for mechanical systems, and radio telescopes in radio astronomy. According to this embodiment, it is possible to reduce the size and power consumption of an electronic device.

Examples of electronic devices include display devices, personal computers, and image reproducing devices provided with recording media (devices that read image data of recording media such as digital versatile discs (DVDs) and have displays for displaying images). Other examples are portable phones, game machines including portable game machines, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 42A to 42F illustrate specific examples of these electronic devices.

Figure 42A:
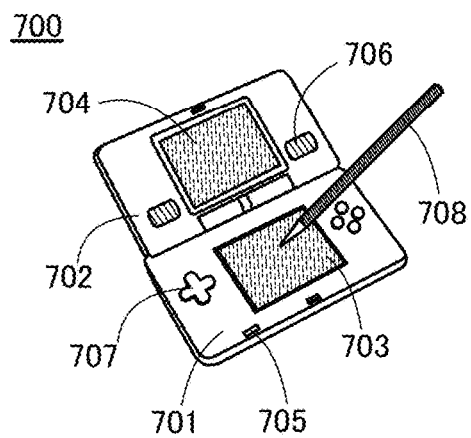
FIGS. 42A to 42F illustrate electronic devices.

A portable game machine 700 illustrated in FIG. 42A includes a housing 701, a housing 702, a display portion 703, a display portion 704, a microphone 705, a speaker 706, an operation key 707, a stylus 708, and the like.

Figure 42B:
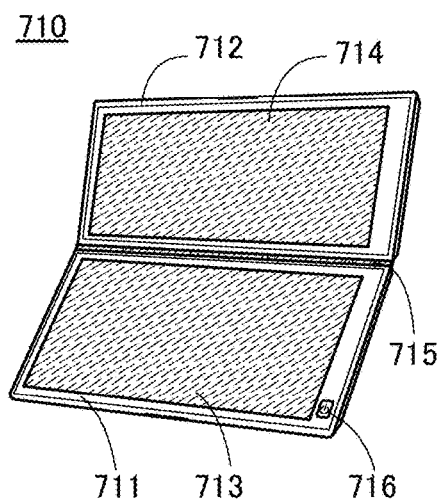

A portable information appliance 710 illustrated in FIG. 42B includes a housing 711, a housing 712, a display portion 713, a display portion 714, a joint 715, an operation key 716, and the like. The display portion 713 is provided in the housing 711, and the display portion 714 is provided in the housing 712. The housings 711 and 712 are connected to each other with the joint 715, and an angle between the housing 711 and the housing 712 can be changed with the joint 715. Accordingly, the change in the direction of an image displayed on the display portion 713 or switching between display and non-display of an image may be performed by changing the angle between the housings 711 and 712 connected with the joint 715. A display device with a touch panel may be used as the display portion 713 and/or the display portion 714.

Figure 42C:
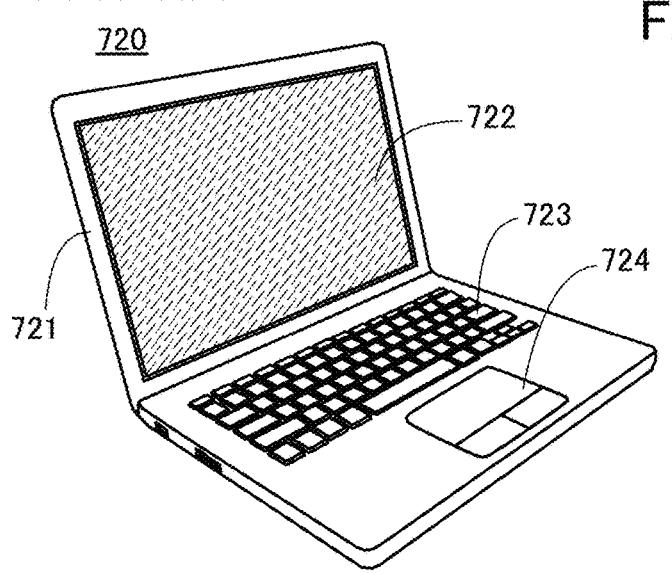

A personal computer 720 illustrated in FIG. 42C includes a housing 721, a display portion 722, a keyboard 723, a pointing device 724, and the like.

Figure 42D:
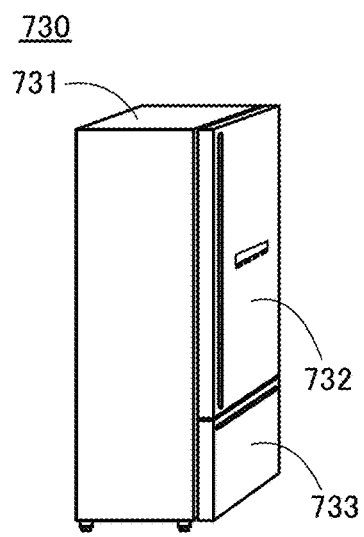

FIG. 42D illustrates an electric refrigerator-freezer as an example of a household appliance. An electric refrigerator-freezer 730 includes a housing 731, a refrigerator door 732, a freezer door 733, and the like.

Figure 42E:
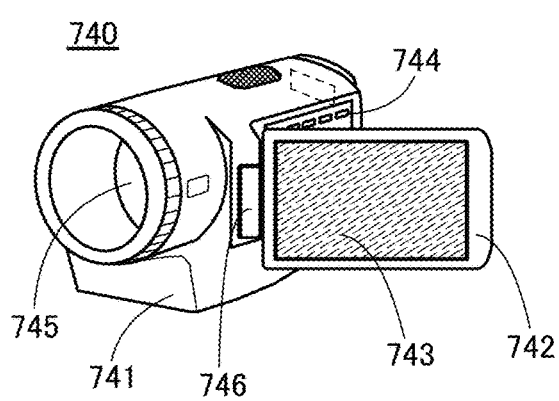

A video camera 740 in FIG. 42E includes a housing 741, a housing 742, a display portion 743, an operation key 744, a lens 745, a joint 746, and the like. The operation key 744 and the lens 745 are provided in the housing 741, and the display portion 743 is provided in the housing 742. The housing 741 and the housing 742 are connected to each other with the joint 746, and an angle between the housing 741 and the housing 742 can be changed with the joint 746. The change in the direction of an image displayed on the display portion 743 or switching between display and non-display of an image may be performed by changing the angle between the housings 741 and 742.

Figure 42F:
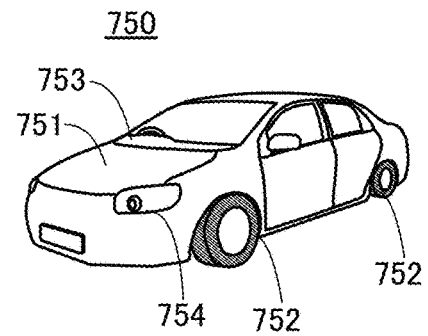

A motor vehicle 750 illustrated in FIG. 42F includes a car body 751, wheels 752, a dashboard 753, lights 754, and the like. The motor vehicle 750 may be engine-powered, or may be an electric vehicle or a hybrid vehicle.

Note that one embodiment of the present invention is not limited to the above electronic devices as long as the semiconductor device of one embodiment of the present invention is included.

This embodiment can be combined with any of the other embodiments described in this specification as appropriate.

This application is based on Japanese Patent Application serial no. 2015-214977 filed with Japan Patent Office on Oct. 30, 2015, the entire contents of which are hereby incorporated by reference.

What is claimed is:

1. A semiconductor device comprising:
   a first circuit and a second circuit;
   a first wiring, a second wiring, and a third wiring; and
   a first transistor, a second transistor, a third transistor, and a fourth transistor,
   wherein:
      the first circuit is electrically connected to the first wiring,
      the first circuit is electrically connected to a gate of the first transistor,
      one of a source and a drain of the first transistor is electrically connected to the second wiring,
      the other of the source and the drain of the first transistor is electrically connected to a gate of the second transistor,
      the second circuit is electrically connected to the first wiring,
      the second circuit is electrically connected to a gate of the third transistor,
      one of a source and a drain of the third transistor is electrically connected to the third wiring,
      the other of the source and the drain of the third transistor is electrically connected to a gate of the fourth transistor,
      one of a source and a drain of the fourth transistor is electrically connected to one of a source and a drain of the second transistor, and
      the other of the source and the drain of the fourth transistor is electrically connected to the other of the source and the drain of the second transistor.

2. The semiconductor device according to claim 1, wherein the first transistor and the third transistor each comprise an active layer containing an oxide semiconductor.

3. The semiconductor device according to claim 1, wherein:
   the first circuit comprises a fifth transistor and a first capacitor,
   the second circuit comprises a sixth transistor and a second capacitor,
   the fifth transistor and the sixth transistor each comprise an active layer containing an oxide semiconductor,
   one of a source and a drain of the fifth transistor is electrically connected to the first wiring,
   the other of the source and the drain of the fifth transistor is electrically connected to the gate of the first transistor,
   the gate of the first transistor is electrically connected to one terminal of the first capacitor,
   one of a source and a drain of the sixth transistor is electrically connected to the first wiring,
   the other of the source and the drain of the sixth transistor is electrically connected to the gate of the third transistor, and
   the gate of the third transistor is electrically connected to one terminal of the second capacitor.

4. The semiconductor device according to claim 3, further comprising a seventh transistor and an eighth transistor,
   wherein one of a source and a drain of the seventh transistor is electrically connected to the gate of the second transistor, and
   wherein one of a source and a drain of the eighth transistor is electrically connected to the gate of the fourth transistor.

5. The semiconductor device according to claim 4, wherein the seventh transistor and the eighth transistor each comprise an active layer containing an oxide semiconductor.

6. The semiconductor device according to claim 2, wherein the oxide semiconductor comprises In, Zn, and M, where M is at least one of Al, Ti, Ga, Sn, Y, Zr, La, Ce, Nd, and Hf.

7. An electronic component comprising:
   the semiconductor device according to claim 1; and
   a lead electrically connected to the semiconductor device.

8. An electronic device comprising:
   the electronic component according to claim 7; and
   at least one of a display device, a touch panel, a microphone, a speaker, an operation key, and a housing.

* * * * *